(12) United States Patent
Sukekawa

(10) Patent No.: US 12,495,535 B2
(45) Date of Patent: Dec. 9, 2025

(54) COMPACT MICROELECTRONIC 6T SRAM MEMORY DEVICES, AND RELATED SYSTEMS AND METHODS

(71) Applicant: Micron Technology, Inc., Boise, ID (US)

(72) Inventor: Mitsunari Sukekawa, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 547 days.

(21) Appl. No.: 17/898,060

(22) Filed: Aug. 29, 2022

(65) Prior Publication Data
US 2024/0074133 A1 Feb. 29, 2024

(51) Int. Cl.
*H10B 10/00* (2023.01)

(52) U.S. Cl.
CPC .................................. *H10B 10/12* (2023.02)

(58) Field of Classification Search
None
See application file for complete search history.

(56) References Cited

U.S. PATENT DOCUMENTS

| | | | |
|---|---|---|---|
| 10,103,053 B1 | 10/2018 | Sukekawa | |
| 10,410,912 B2 | 9/2019 | Sukekawa | |
| 10,651,181 B2 | 5/2020 | Masuoka et al. | |
| 10,867,837 B2 | 12/2020 | Sukekawa | |
| 11,127,747 B2* | 9/2021 | Karda | H10D 30/6757 |
| 11,171,140 B2 | 11/2021 | Sukekawa | |
| 2006/0006444 A1 | 1/2006 | Leslie | |
| 2010/0219483 A1* | 9/2010 | Masuoka | H10D 86/201 |
| | | | 257/369 |
| 2011/0169061 A1 | 7/2011 | Sukekawa et al. | |
| 2012/0074467 A1* | 3/2012 | Abe | H10B 41/10 |
| | | | 257/E23.141 |
| 2018/0069131 A1 | 3/2018 | Balakrishnan et al. | |
| 2018/0226390 A1 | 8/2018 | Kang et al. | |
| 2022/0068955 A1* | 3/2022 | King | H10B 43/10 |
| 2022/0109000 A1* | 4/2022 | Liu | H10B 41/41 |
| 2022/0199641 A1* | 6/2022 | Fukuzumi | H10B 41/10 |

OTHER PUBLICATIONS

Ibe et al., Impact of Scaling on Neutron-Induced Soft Error in SRAMs from a 250 nm to a 22 nm Design Rule, IEEE Transactions on Electron Devices, vol. 57, No. 7, (Jul. 2010), pp. 1527-1538.

(Continued)

*Primary Examiner* — Bilkis Jahan
(74) *Attorney, Agent, or Firm* — TraskBritt

(57) ABSTRACT

Microelectronic devices include at least one memory cell, each with six transistors collectively comprising six pillars grouped in pillar pairs and formed from a semiconductor material. Each of the pillar pairs includes a first and a second pillar. Gate electrodes are also included, with each gate electrode extending between and horizontally around a portion of the first pillar and a portion of the second pillar of a respective one of the pillar pairs. Conductive structures are electrically coupled to the six pillars. At least one of the conductive structures is in physical contact with more than one of the pillars of the microelectronic device. Related methods and electrical systems are also disclosed.

20 Claims, 30 Drawing Sheets

(56) References Cited

OTHER PUBLICATIONS

Karda et al., U.S. Appl. No. 17/655,479, "Inverters, and Related Memory Devices and Electronic Systems," filed Mar. 18, 2022, 35 pages.
Matagne et al., DTCO and TCAD for a 12 Layer-EUV Ultra-Scaled Surrounding Gate Transistor 6T-SRAM, 2018 International Conference on Simulation of Semiconductor Processes and Devices (SISPAD), IEEE, (Sep. 2018), pp. 45-48.
Unisantis Electronics, Technology, Learn more about Unisantis, https://unisantis.com/technology/, (last accessed Mar. 10, 2022), 7 pages.
Wikipedia, Definition of Static Random-Access Memory, (last edited on Aug. 16, 2022), 5 pages.

\* cited by examiner

COMPACT MICROELECTRONIC 6T SRAM MEMORY DEVICES, AND RELATED SYSTEMS AND METHODS

TECHNICAL FIELD

The disclosure, in various embodiments, generally relates to the field of microelectronic device design and fabrication. More specifically, the disclosure relates to the design and fabrication of static random-access memory (SRAM) devices with six transistors (e.g., "6T SRAM" cells).

BACKGROUND

Transistors are commonly used in microelectronic devices configured as memory devices. Memory devices are generally provided as internal integrated circuits in computers or other electronic devices. There are many types of memory including, but not limited to, random-access memory (RAM), read only memory (ROM), static random access memory (SRAM), dynamic random access memory (DRAM), synchronous dynamic random access memory (SDRAM), Flash memory, and resistance variable memory. Some memory devices, including SRAM devices, include several field-effect transistors (FET), and each FET typically includes a gated channel region between a pair of source/drain regions. For example, a conventional SRAM cell known as a "6T SRAM cell" includes six transistors (e.g., six FETs), which may be referred to as "M1," "M2," "M3," "M4," "M5," and "M6," respectively. Transistors M1 to M4 may function as storage devices, storing each bit of the cell, and form two cross-coupled inverters. Transistors M5 and M6 may serve as access devices to control access to the storage devices during read and write operations.

An ongoing challenge for designers and fabricators of microelectronic devices, including of 6T SRAM cells, is to increase the level of integration (e.g., density) of the devices and the features within the microelectronic device by reducing the dimensions of individual features and/or by reducing the distance separating neighboring features.

BRIEF DESCRIPTION OF THE DRAWINGS

FIG. 2A through FIG. 2H are schematic illustrations of a microelectronic device including memory cells configured as 6T SRAM cells, according to embodiments of the disclosure, wherein:

FIG. 2A is a cross-sectional, elevational view corresponding to section line A-A within FIG. 2B to FIG. 2G;

FIG. 2B is a cross-sectional, plan view corresponding to section line B-B of FIG. 2A and FIG. 2H, and wherein some insulative material is not illustrated for ease of viewing other features;

FIG. 2C is a cross-sectional, plan view corresponding to section line C-C of FIG. 2A and FIG. 2H;

FIG. 2D is a cross-sectional, plan view corresponding to section line D-D of FIG. 2A and FIG. 2H;

FIG. 2E is a cross-sectional, bottom view corresponding to section line E-E of FIG. 2A and FIG. 2H;

FIG. 2F is a cross-sectional, bottom view corresponding to section line F-F of FIG. 2A and FIG. 2H;

FIG. 2G is a cross-sectional, bottom view corresponding to section line G-G of FIG. 2A and FIG. 2H; and FIG. 2H is a cross-sectional, elevational view corresponding to section line H-H within FIG. 2B to FIG. 2G.

FIG. 18A through FIG. 18I are schematic illustrations of a microelectronic device including memory cells configured as 6T SRAM cells and which may be formed according to the method of FIG. 3A through FIG. 17C, according to embodiments of the disclosure, wherein:

FIG. 18A is a cross-sectional, elevational view corresponding to section line A-A within FIG. 18A to FIG. 18G;

FIG. 18B is a cross-sectional, plan view corresponding to section line B-B of FIG. 18A, FIG. 18H, and FIG. 18I, and wherein some insulative material is not illustrated for ease of viewing other features;

FIG. 18C is a cross-sectional, plan view corresponding to section line C-C of FIG. 18A, FIG. 18H, and FIG. 18I;

FIG. 18D is a cross-sectional, plan view corresponding to section line D-D of FIG. 18A, FIG. 18H, and FIG. 18I;

FIG. 18E is a cross-sectional, bottom view corresponding to section line E-E of FIG. 18A, FIG. 18H, and FIG. 18I;

FIG. 18F is a cross-sectional, bottom view corresponding to section line F-F of FIG. 18A, FIG. 18H, and FIG. 18I;

FIG. 18G is a cross-sectional, bottom view corresponding to section line G-G of FIG. 18A, FIG. 18H, and FIG. 18I;

FIG. 18H is a cross-sectional, elevational view corresponding to section line H-H within FIG. 18B to FIG. 18G; and FIG. 18I is a cross-sectional, elevational view corresponding to section line I-I within FIG. 18B to FIG. 18G.

DETAILED DESCRIPTION

Figure 1:
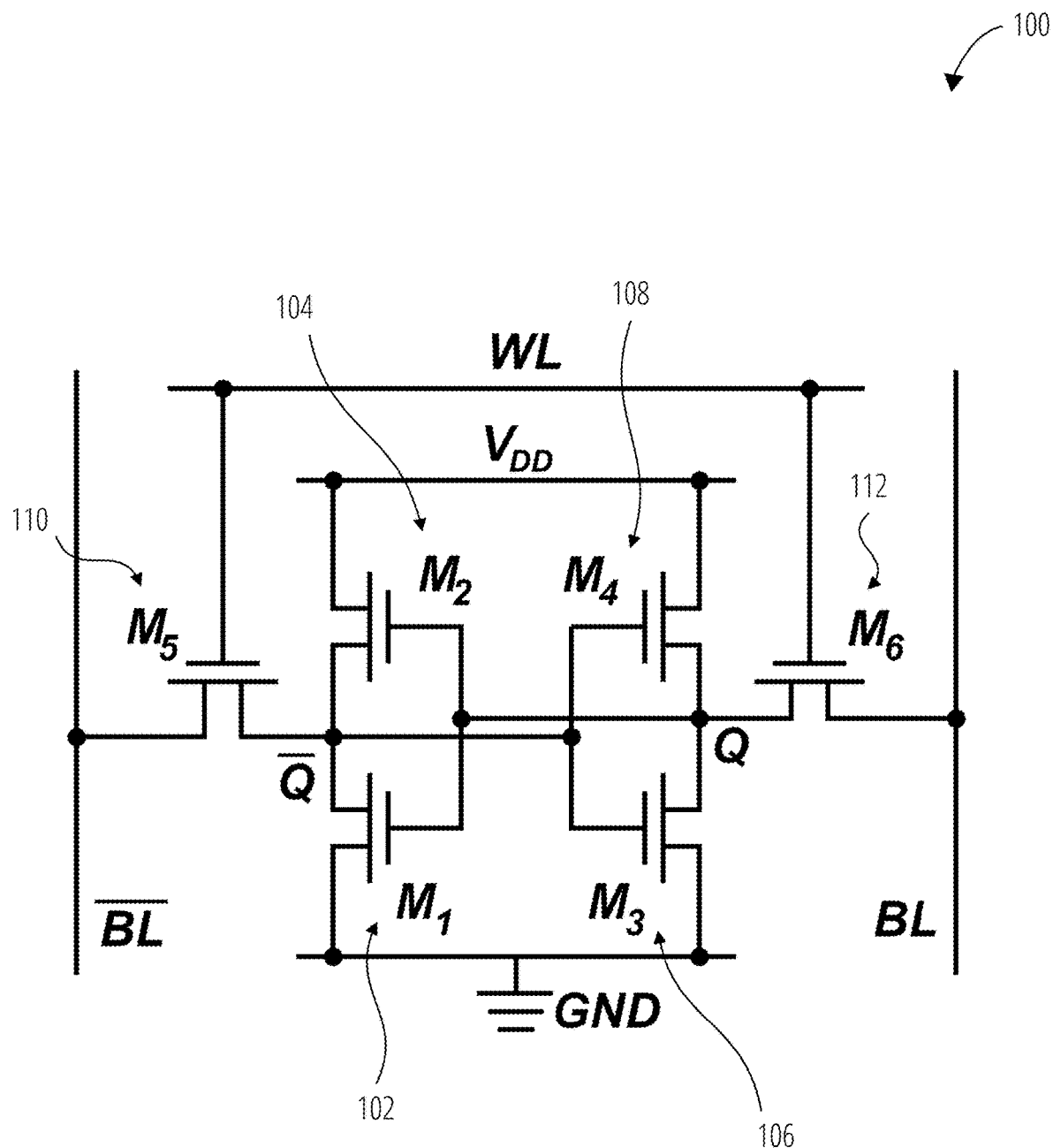
FIG. 1 is a circuit schematic of a static memory microelectronic device, configured as a "6T SRAM" cell, according to embodiments of the disclosure.

Structures (e.g., microelectronic device structures), apparatuses (e.g., microelectronic devices, such as memory devices, which may be configured as SRAM (e.g., 6T SRAM) devices), and systems (e.g., electronic systems), according to embodiments of the disclosure, include compact features for compact structure and apparatus design and increased features and device integration and scaling. For example, a gate electrode may be disposed between and only partially horizontally surround two pillars that provide source/drain regions and channel regions; and, the width of the gate electrode may be about equal to or less than the distance between the outermost surfaces of the two pillars. As another example, one or more contact features (e.g., conductive plugs, wordline ("WL") contacts, reference voltage ("GND") contacts) may be dimensioned, positioned, and/or otherwise configured such that a single one of the contact features may provide electrical contact to more than one pillar. In some embodiments, some elongate conductive features (e.g., wordlines, bitlines) may be relatively wider in one or more horizontal directions to reduce electrical resistance in the features and to facilitate accurate fabrication. In these or other embodiments, corresponding contact features (e.g., WL contacts) may be arranged in an offset pattern, rather than being in linear alignment, to inhibit electrical shorting between contact features of the apparatus and systems.

As used herein, the term "pillar" means and refers to a structure with a greatest dimension in primarily a vertical direction and comprising primarily semiconductive material(s). A "pillar" may be generally box shaped, may be generally cylindrical, or may be some alternative vertically-oriented shape.

As used herein, a feature referred to with the adjective "source/drain" means and refers to the feature being configured for association with either or both the source region and the drain region of the device that includes the "source/drain" feature. A "source region" may be otherwise configured as a "drain region" and vice versa without departing from the scope of the disclosure.

In the descriptions herein, some regions may be described in association with the designations "P" or "N" to distinguish different dopant types. A "P"-type region may have a concentration (e.g., dopant level) of suitable dopant(s) within a range from about $10^{14}$ atoms/cm$^3$ to about $10^{20}$ atoms/cm$^3$. An "N"-type region may have a concentration (e.g., dopant level) of suitable dopant(s) within a range from about $10^{14}$ atoms/cm$^3$ to about $10^{20}$ atoms/cm$^3$. Regions described as being "N"-type may have an opposite-type conductivity-enhancing dopant than regions described as being "P"-type, and vice versa.

As used herein, the terms "opening" and "trench" mean and include a volume extending through or into at least one structure or at least one material, leaving a gap in that at least one structure or at least one material, or a volume extending between structures or materials, leaving a gap between the structures or materials. Unless otherwise described, an "opening" and/or "trench" is not necessarily empty of material. That is, an "opening" or "trench" is not necessarily void space. An "opening" or "trench" formed in or between structures or materials may comprise structure(s) or material(s) other than that in or between which the opening is formed. And, structure(s) or material(s) "exposed" within an opening or trench is/are not necessarily in contact with an atmosphere or non-solid environment. Structure(s) or material(s) "exposed" within an opening or trench may be adjacent or in contact with other structure(s) or material(s) that is/are disposed within the opening or trench.

As used herein, the term "wafer" means and includes not only a conventional, substantially circular wafer of a single material (e.g., a single crystal silicon), but also other bulk substrates in the form of a silicon-on-insulator (SOT) structure, as well as bulk substrates comprising other materials (e.g., semiconductor materials (e.g., germanium, gallium arsenide)), as well as substrates employed in fabrication of structures thereon, which substrates may comprise other materials such as glasses or ceramics, in addition to the foregoing.

As used herein, the terms "substrate" and "base structure" mean and include a base material or other construction upon which components, such a microelectronic devices and structures therein, are formed. The substrate or base structure may be a semiconductor substrate, a base semiconductor material on a supporting structure, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOT") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base structure" in the following description, previous process stages may have been utilized to form materials, structures, or junctions in the base semiconductor structure, base structure, or other foundation.

As used herein, the terms "conductive" and "conducting," when used in reference to a material or structure, mean and include a material or structure that is electrically conductive or electrically conducting, unless otherwise specified (e.g., as "thermally conductive," or "thermally conducting"). A "conductive" or "conducting" material or structure may be formed of and include one or more metals or metal-containing compositions. The metals may include one or more of titanium (Ti), tungsten (W), cobalt (Co), nickel (Ni), and/or platinum (Pt). Metal-containing compositions may include one or more of metal silicides, metal nitrides, and/or metal carbides. In these or other embodiments, "conductive" or "conductive" material may alternatively or additionally include conductively-doped semiconductor material(s) (e.g., conductively-doped silicon, conductively-doped germanium).

As used herein, the terms "insulative" and "insulating," when used in reference to a material or structure, mean and include a material or structure that is electrically insulative or electrically insulating, unless otherwise specified (e.g., as "thermally insulative," or "thermally insulating"). An "insulative" or "insulating" material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of "x," "y," and/or "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative" or "insulating" structure means and includes a structure formed of and including "insulative" or "insulating" material.

As used herein, the term "vertical" means and includes a direction perpendicular to a primary surface of the substrate on which a referenced material or structure is located. The "height" of a respective material or structure may be defined as a dimension in a vertical plane. With reference to the figures, the "vertical" direction may be parallel to an indicated "Z" axis, may be perpendicular to an indicated "X" axis, and may be perpendicular to an indicated "Y" axis.

As used herein, the term "horizontal" means and includes a direction parallel to a primary surface of the substrate on which the referenced material or structure is located. The "width" and "length" of a respective material or structure may be defined as dimensions in a horizontal plane. With reference to the figures, the "horizontal" direction may be perpendicular to an indicated "Z" axis, may be parallel to an indicated "X" axis, and may be parallel to an indicated "Y" axis.

As used herein, the term "lateral" means and includes a direction in a horizontal plane parallel to a primary surface of the substrate on which a referenced material or structure is located and substantially perpendicular to a "longitudinal" direction. The "width" of a respective material or structure may be defined as a dimension in the lateral direction of the horizontal plane. With reference to the figures, the "lateral" direction may be parallel to an indicated "X" axis, may be perpendicular to an indicated "Y" axis, and may be perpendicular to an indicated "Z" axis.

As used herein, the term "longitudinal" means and includes a direction in a horizontal plane parallel to a primary surface of the substrate on which a referenced material or structure is located, and substantially perpendicular to a "lateral" direction. The "length" of a respective material or structure may be defined as a dimension in the longitudinal direction of the horizontal plane. With reference to the figures, the "longitudinal" direction may be parallel to an indicated "Y" axis, may be perpendicular to an indicated "X" axis, and may be perpendicular to an indicated "Z" axis.

As used herein, the term "width" means and includes a dimension, along an indicated "X" axis in a horizontal plane (e.g., at a certain elevation, if identified), defining a maximum distance, along such "X" axis in the horizontal plane, of the whole of the material or structure in question or of a concerned portion of the material or structure in question. For example, a width of a gate electrode may be a maximum X-axis dimension from one lateral end of the gate electrode to an opposite lateral end of the gate electrode.

As used herein, the term "length" means and includes a dimension, along an indicated "Y" axis in a horizontal plane (e.g., at a certain elevation, if identified), defining a maximum distance, along such "Y" axis in the horizontal plane, of the material or structure in question or of a concerned portion of the material or structure in question.

As used herein, the terms "thickness" or "thinness" are spatially relative terms that mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material or structure relative to at least two other materials or structures. The term "between" may encompass both a disposition of one material or structure directly adjacent the other materials or structures and a disposition of one material or structure indirectly adjacent to the other materials or structures.

As used herein, the term "proximate" is a spatially relative term used to describe disposition of one material or structure near to another material or structure. The term "proximate" includes dispositions of indirectly adjacent to, directly adjacent to, and internal to.

As used herein, features (e.g., regions, materials, openings, structures, assemblies, devices) described as "neighboring" one another mean and include features of the disclosed identity (or identities) that are located most proximate (e.g., closest to) one another. One or more additional features (e.g., additional regions, additional materials, additional structures, additional openings, additional assemblies, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with the "neighboring" features is positioned between the "neighboring" features. For example, a structure of material X "neighboring" a structure of material Y is the first material X structure, e.g., of multiple material X structures, that is nearest the particular structure of material Y. Accordingly, features described as "horizontally neighboring" one another mean and include features of the disclosed identity (or identities) that are located most horizontally proximate (e.g., horizontally closest to) one another.

As used herein, the term "consistent"—when referring to a parameter, property, or condition of one structure, material, feature, or portion thereof in comparison to the parameter, property, or condition of another such structure, material, feature, or portion of such same aforementioned structure, material, or feature—is a relative term that means and includes the parameter, property, or condition of the two such structures, materials, features, or portions being equal, substantially equal, or about equal, at least in terms of respective dispositions of such structures, materials, features, or portions. For example, two structures having "consistent" heights as one another may each define a same, substantially same, or about the same height, from a lower surface to an upper surface of each respective such structure, despite the two structures being at different elevations of a larger structure.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0 percent met, at least 95.0 percent met, at least 99.0 percent met, or even at least 99.9 percent met.

As used herein, the terms "on" or "over," when referring to an element as being "on" or "over" another element, are spatially relative terms that mean and include the element being directly on top of, adjacent to (e.g., laterally adjacent to, horizontally adjacent to, longitudinally adjacent to, vertically adjacent to), underneath, or in direct contact with the other element. It also includes the element being indirectly on top of, adjacent to (e.g., laterally adjacent to, horizontally adjacent to, longitudinally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, any spatially relative terms used in this disclosure are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation," when used with regard to a material's or feature's positioning (as opposed to a dopant "level"), are spatially relative terms used to describe one material's or feature's relationship to another material(s) or feature(s) as illustrated in the figures, using—as a reference point—the lowest illustrated surface of the structure that includes the materials or features. As used herein, a "level" and an "elevation" are each defined by a horizontal plane parallel to a primary surface of the substrate or base structure on or in which the structure (that includes the materials or features) is formed. When used with reference to the drawings, "lower levels" and "lower elevations" are relatively nearer to the bottom-most illustrated surface of the respective structure, while "higher levels" and "higher elevations" are relatively further from the bottom-most illustrated surface of the respective structure.

As used herein, the term "depth" is a spatially relative term used to describe one material's or feature's relationship to another material(s) or feature(s) as illustrated in the figures, using as a reference point—the highest illustrated surface of the structure (e.g., stack structure) that includes the materials or features. When used with reference to the drawings, a "depth" is defined by a horizontal plane parallel to the highest illustrated surface of the structure (e.g., stack structure) that includes the materials or features.

Unless otherwise specified, any spatially relative terms used in this disclosure are intended to encompass different orientations in addition to the orientation depicted in the drawings. For example, the materials in the drawings may be inverted, rotated, etc., with "upper" levels and elevations then illustrated proximate the bottom of the page, "lower" levels and elevations then illustrated proximate the top of the page, and with greatest "depths" extending a greatest vertical distance upward.

As used herein, the terms "comprising," "including," "having," and grammatical equivalents thereof are inclusive, open-ended terms that do not exclude additional, unrecited elements or method steps. These terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a material (e.g., composition) described as "comprising," "including," and/or "having" a species may be a material that, in some embodiments, includes additional species as well and/or a material that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" means and includes any and all combinations of one or more of the associated listed items.

As used herein, the singular forms "a," "an," and "the" are intended to include the plural forms as well, unless the context clearly indicates otherwise.

As used herein, an "(s)" at the end of a term means and includes the singular form of the term and/or the plural form of the term, unless the context clearly indicates otherwise.

As used herein, the terms "configured" and "configuration" mean and refer to a size, shape, material composition, orientation, and arrangement of a referenced feature (e.g., region, material, structure, opening, assembly, device) so as to facilitate a referenced operation or property of the referenced feature in a predetermined way.

The illustrations presented herein are not meant to be actual views of any particular material, structure, sub-structure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded; surfaces and features illustrated to be vertical may be non-vertical, bent, and/or bowed; and/or structures illustrated with consistent transverse widths and/or lengths throughout the height of the structure may taper in transverse width and/or length. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless context otherwise indicates, materials described herein may be formed by any suitable technique, including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the deposition/growth technique may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

With reference to FIG. 1, microelectronic devices, according to embodiments described herein, may be fabricated and otherwise configured to include memory cells of an SRAM array. FIG. 1 schematically illustrates an example 6T SRAM cell 100. The 6T SRAM cell 100 includes six transistors: a first transistor 102 (also identified as "M1"), a second transistor 104 (also identified as "M2"), a third transistor 106 (also identified as "M3"), a fourth transistor 108 (also identified as "M4"), a fifth transistor 110 (also identified as "M5"), and a sixth transistor 112 (also identified as "M6"). The second transistor 104 (M2) and the fourth transistor 108 (M4) may be P-channel devices, and the remaining transistors (e.g., first transistor 102 (M1), third transistor 106 (M3), fifth transistor 110 (M5), and sixth transistor 112 (M6)) may be N-channel devices. The fifth transistor 110 (M5) and the sixth transistor 112 (M6) may be configured as access transistors. The first transistor 102 (M1) and the second transistor 104 (M2) may be configured, respectively, as a first driver transistor (e.g., a pulldown transistor) and a first load transistor (e.g., a pullup transistor) of a first inverter. The third transistor 106 (M3) and the fourth transistor 108 (M4) may be configured, respectively, as a second driver transistor and a second load transistor of a second inverter. The first and second inverters may be cross-coupled with one another to form a bistable circuit (also referred to in the art as a "Bistable Flip-flop").

A wordline ("WL") may be electrically coupled with gates of the access transistors (e.g., the fifth transistor 110 (M5) and the sixth transistor 112 (M6)). First and second comparative bitlines ("$\overline{BL}$" and "BL," respectively) may be coupled with terminals of the access transistors (e.g., the fifth transistor 110 (M5) and the sixth transistor 112 (M6)). The comparative bitlines may extend to circuitry used for read and/or write operations associated with the 6T SRAM cell 100. Such circuitry may include one or more components, such as, e.g., CMOS components, sense amplifiers, drivers. The P-channel transistors (e.g., the second transistor 104 (M2) and the fourth transistor 108 (M4)) may have source/drain regions coupled with a first reference voltage ("VDD"). N-channel transistors (e.g., the first transistor 102 (M1) and the third transistor 106 (M3)) may have source/drain regions coupled with a second reference voltage ("GND"). The second reference voltage may be less than the first reference voltage.

Figure 2A:
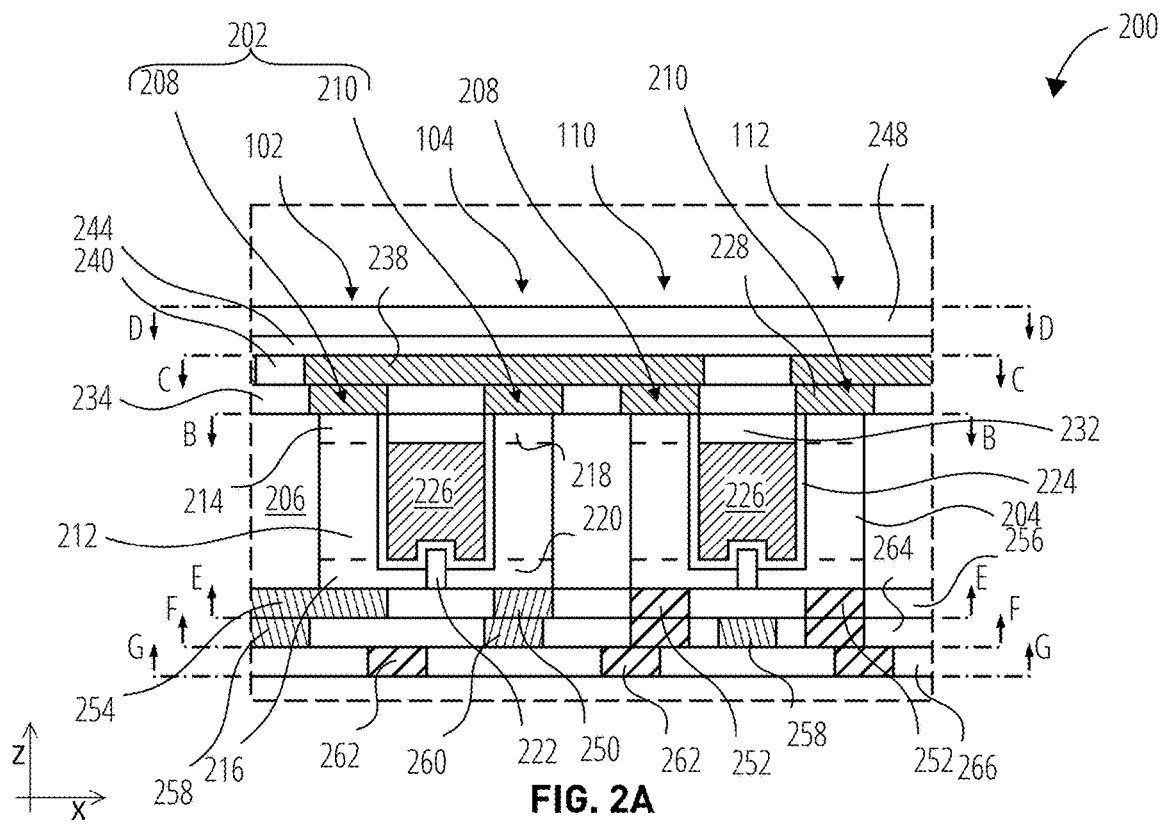
Figure 2B:
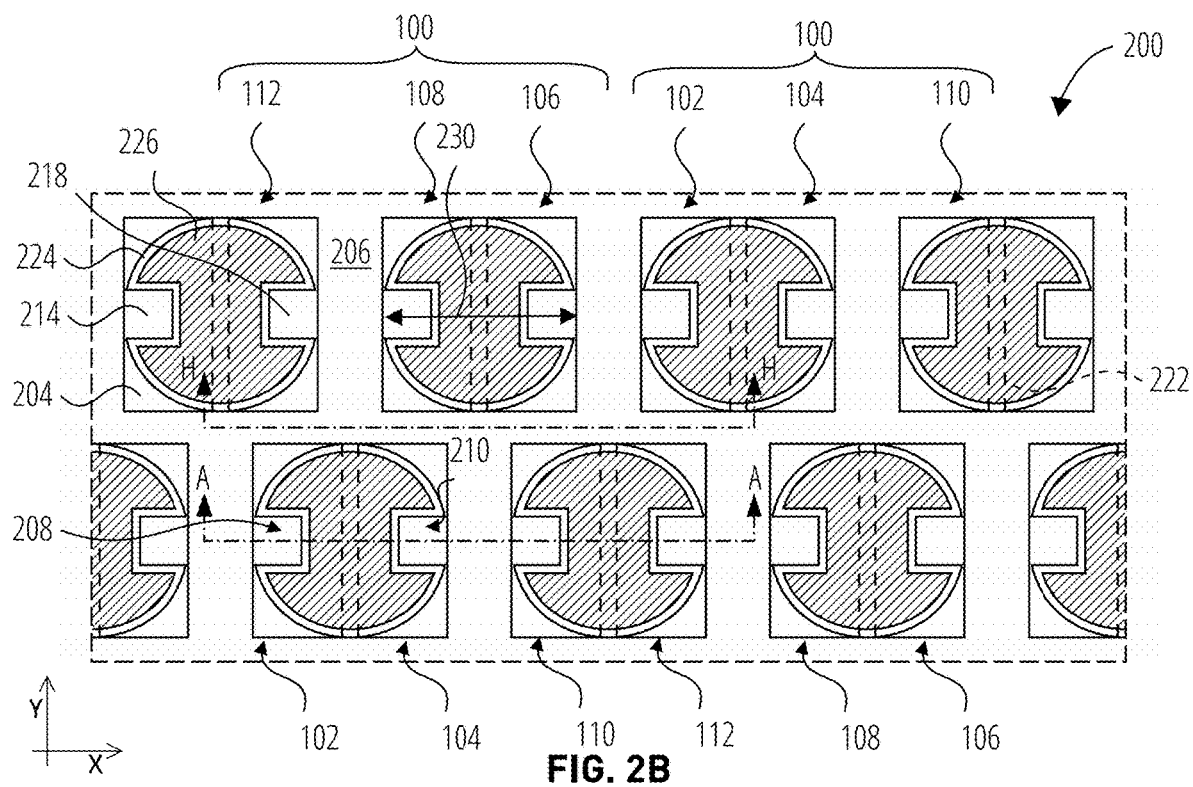

With reference to FIG. 2A through FIG. 2H, illustrated is a microelectronic device 200, which may—as illustrated in FIG. 2B—include one or more 6T SRAM cells 100 with the first through sixth transistors 102 to 112 (M1 to M6). Each of the transistors (e.g., first through sixth transistors 102 to 112) may be associated with (e.g., comprise, be provided by) a pillar 202 that is formed from and includes a semiconductor material 204. In some embodiments, the pillars 202 are generally box shaped, with rectangular (e.g., square) transverse cross-sectional areas and with four distinguishable vertical sidewall s.

The semiconductor material 204 may comprise any one or more semiconductive material(s). In some embodiments, the semiconductor material 204 comprises, consists essentially of, or consists of silicon (e.g., monocrystalline silicon) with one or more dopants, as described further below.

Insulative structures 206 may extend horizontally around regions (e.g., volumes) of the semiconductor material 204—as illustrated in FIG. 2B—to isolate pairs of the pillars 202 from neighboring pairs. The insulative structures 206 may, therefore, be characterized as "shallow trench isolation (STI)" regions of the microelectronic device 200. The insulative structures 206 may provide an insulative wall providing a boundary or periphery around pairs of the pillars 202, such that each volume of the semiconductor material 204 surrounded by the insulative structures 206 may include two of the pillars 202—a first pillar 208 and a second pillar 210—formed from the semiconductor material 204.

As used herein the term "first pillar" 208 refers to a left-most illustrated pillar 202, and the term "second pillar" 210 refers to a right-most illustrated pillar 202 of a pair of associated pillars 202, wherein, "associated" pillars 202 are pillars 202 that are formed from the same general portion of semiconductor material 204 that is defined by surrounding insulative structure 206 material(s). Therefore, the terms "first pillar" 208 and "second pillar" 210 are relative terms only.

The insulative structures 206 may be formed of and include one or more insulative material(s), such as any of the insulative materials described above. In some embodiments, the insulative structures 206 comprise, consist essentially of, or consist of silicon dioxide.

A doped region may be formed along an upper surface of the semiconductor material 204 to provide an upper source/drain region of each pillar 202 above a vertical channel region 212, and another doped region may be formed along a lower surface of the semiconductor material 204 to provide a lower source/drain region of each pillar 202 below the vertical channel region 212. Accordingly, the first pillar 208 includes a first upper doped region 214 above its vertical channel region 212 and includes a first lower doped region 216 below its vertical channel region 212; and the second pillar 210 includes a second upper doped region 218 above its vertical channel region 212 and includes a second lower doped region 220 below its vertical channel region 212. Approximate boundaries of the source/drain regions (e.g., the first upper doped region 214, the first lower doped region 216, the second upper doped region 218, and the second upper doped region 218) are illustrated by dashed lines in FIG. 2A and other figures.

The dopant types and levels of the semiconductor material 204 of the vertical channel region 212, the upper doped region (e.g., the first upper doped region 214 or the second upper doped region 218), and the lower doped region (e.g., the first lower doped region 216 or the second lower doped region 220) of each pillar 202 may be tailored according to the function of the transistor associated with the pillar 202. In some embodiments, pillars 202 associated with the second transistor 104 (M2) and the fourth transistor 108 (M4) include semiconductor material 204 in the vertical channel region 212 that is of an N-type monocrystalline silicon with N-type doping. As another example, for pillars 202 associated with the first transistor 102 (M1), third transistor 106 (M3), fifth transistor 110 (M5), and sixth transistor 112 (M6), the semiconductor material 204 of the vertical channel region 212 may be P-type monocrystalline silicon with P-type doping. Accordingly, with regard to the structures illustrated in FIG. 2A, the vertical channel region 212 of the second pillar 210 that is associated with the second transistor 104 (M2) may be N-type doped and its second upper doped region 218 and its second lower doped region 220 may be P-type doped. Correspondingly, the vertical channel regions 212 of the first pillars 208 and the other second pillar 210 that are associated, respectively, with the first transistor 102 (M1), the fifth transistor 110 (M5), and the sixth transistor 112 (M6), may be P-type doped and their associated doped regions (e.g., first upper doped regions 214, second upper doped region 218, first lower doped regions 216, second lower doped region 220) may be N-type doped.

In some embodiments, each of the doped regions (e.g., the first upper doped region 214, the second upper doped region 218, the first lower doped region 216, the second lower doped region 220) may be relatively thin (e.g., shallow) within the semiconductor material 204. For example, each doped region (e.g., the first upper doped region 214, the second upper doped region 218, the first lower doped region 216, the second lower doped region 220) may have a height of about 30 nm or less (e.g., up to about 30 nm, up to about 20 nm, up to about 10 nm).

The pillars 202 may be formed, as described further below, such that the first lower doped regions 216 and the second lower doped regions 220 extend horizontally beyond the width of the respective vertical channel region 212, toward one another. In each isolated pair of pillars 202, the first lower doped region 216 may be physically spaced from and electrically insulated from the second lower doped region 220 by an insulative isolation structure 222, which may extend a length of the region of semiconductor material 204 that is surrounded by the insulative structure 206. Accordingly, the insulative isolation structure 222 may also be referred to as an STI region. The width and height of the insulative isolation structure 222 may be greater or less than the insulative isolation structure 222 illustrated in FIG. 2A and other figures provided that the insulative isolation structure 222 separates and electrically isolates the first lower doped region 216 from the second lower doped region 220.

One or more insulative materials(s) may be formed and disposed along vertical sidewalls of the pillars 202 that are not otherwise in physical contact with the insulative structure 206, to provide a liner 224, as illustrated in FIG. 2B. Accordingly, in some embodiments, three of the four vertical sidewalls of each of the pillars 202 (e.g., the first pillar 208, the second pillar 210) may be substantially covered by the liner 224. The liner 224 may also extend between the pair of pillars 202 (e.g., from the first pillar 208 to the second pillar 210) and over the insulative isolation structure 222, as illustrated in FIG. 2A. Other regions of the semiconductor material 204 isolated within a surrounding region of the insulative structure 206 may also be lined with the liner 224, as illustrated in FIG. 2B.

The liner 224 may be formed of and include any one or more insulative material(s) (e.g., dielectric material(s)) described above. In some embodiments, the liner 224 comprises, consists essentially of, or consists of silicon dioxide. The liner 224 may be characterized as a "gate dielectric" material.

Extending between and partially surrounding each pillar 202 (FIG. 1) of a pair (e.g., the first pillar 208 and the second pillar 210) is a gate electrode 226, which may be horizontally surrounded by the liner 224. The liner 224 may also underlay a whole of a lower surface of the gate electrode 226, as illustrated in FIG. 2A.

The gate electrode 226 may be formed of and include any one or more conductive materials described above. In some embodiments, the gate electrode 226 is formed of and includes metal(s) (e.g., titanium, tungsten, cobalt, nickel, platinum), metal-containing material(s) (e.g., metal silicide(s), metal nitride(s), metal carbide(s)), conductively-doped semiconductor material(s) (e.g., conductively-doped silicon, conductively-doped germanium), or any combination of any one or more of the foregoing. In some embodiments, the conductive plugs 228 comprise, consist essentially of, or consist of conductively-doped polycrystalline silicon.

Each gate electrode 226 is dimensioned, positioned, and otherwise configured to extend only partially horizontally around the first pillar 208 and the second pillar 210 of an individual pair of the pillars 202 (FIG. 1), such as to horizontally surround three of the four sides of each of the first pillar 208 and the second pillar 210. The lateral dimensions of each gate electrode 226 may be about equal to or less than the horizontal distance between the outermost sides of the first pillar 208 and the second pillar 210, which distance is illustrated as distance 230 in FIG. 2B.

With the gate electrode 226 not fully surrounding (e.g., not fully surrounding the horizontal periphery of) the first pillar 208 and the second pillar 210, the gate electrode 226 may exhibit a relatively more compact horizontal footprint, which may enable increased device scaling and integration in the microelectronic device 200 relative to a conventional microelectronic device (e.g., a microelectronic device with a conventional 6T SRAM cell).

In some embodiments, a periphery of the gate electrode 226 may be generally curved (e.g., circular) to both longitudinal sides of the first pillar 208 and the second pillar 210, as illustrated in FIG. 2B. Accordingly, the gate electrode 226 may define a generally round (e.g., circular) horizontal cross-sectional area, except for where the first pillar 208 and the second pillar 210 are disposed.

With reference to FIG. 2A, each gate electrode 226 may be recessed relative to an upper surface of the first pillar 208 and the second pillar 210, such that an upper surface of the gate electrode 226 may be proximate a lower boundary of the first upper doped region 214 and the second upper doped region 218.

An insulative cap 232 may be above the gate electrode 226 to fill remaining space between the first pillar 208 and the second pillar 210. The insulative cap 232 may be formed of and include any one or more of the insulative materials described above. In some embodiments, the insulative caps 232 comprise, consist essentially of, or consist of silicon dioxide.

With continued reference to FIG. 2A, an insulative region 234 may be formed over the pillars 202, the gate electrodes 226 (and the insulative caps 232), and the insulative structures 206. Conductive plugs 228 may extend through the insulative region 234 to the upper surfaces of the pillars 202.

As illustrated in FIG. 2A, at least some of the conductive plugs 228 may each extend to and directly physically contact a different one of the pillars 202 (FIG. 1) (e.g., first pillar 208, second pillar 210) at an upper surface thereof (e.g., at the first upper doped region 214 or the second upper doped region 218) to provide electrical coupling to individual pillars 202 and the associated individual transistor. Others of the conductive plugs 228—which are referred to herein as "dual-contact conductive plugs" 236—may be disposed over and extend vertically downward to physically contact a longitudinally front-most or rear-most region of one of the gate electrodes 226 so as to electrically couple with both pillars 202 (and both transistors) associated with the gate electrode 226.

The insulative region 234 may provide substantially a layer (continuous or discontinuous) in which the conductive plugs 228 are formed. The insulative region 234 may be formed of and include any one or more of the insulative materials described above. In some embodiments, the insulative region 234 comprises, consists essentially of, or consists of silicon dioxide, silicon nitride, or any combination of any one or more of the foregoing.

The conductive plugs 228 may be formed of and include any one or more of the conductive materials described above. In some embodiments, the conductive plugs 228 comprise, consist essentially of, or consist of metal(s) (e.g., titanium, tungsten, cobalt, nickel, platinum), metal-containing material(s) (e.g., metal silicide(s), metal nitride(s), metal carbide(s)), conductively-doped semiconductor material(s) (e.g., conductively-doped silicon, conductively-doped germanium), or any combination of any one or more of the foregoing. In some embodiments, the conductive plugs 228 comprise, consist essentially of, or consist of tungsten, titanium, nitride, or both tungsten (e.g., as a bulk metal thereof) and titanium nitride (e.g., as a liner).

Figure 2C:
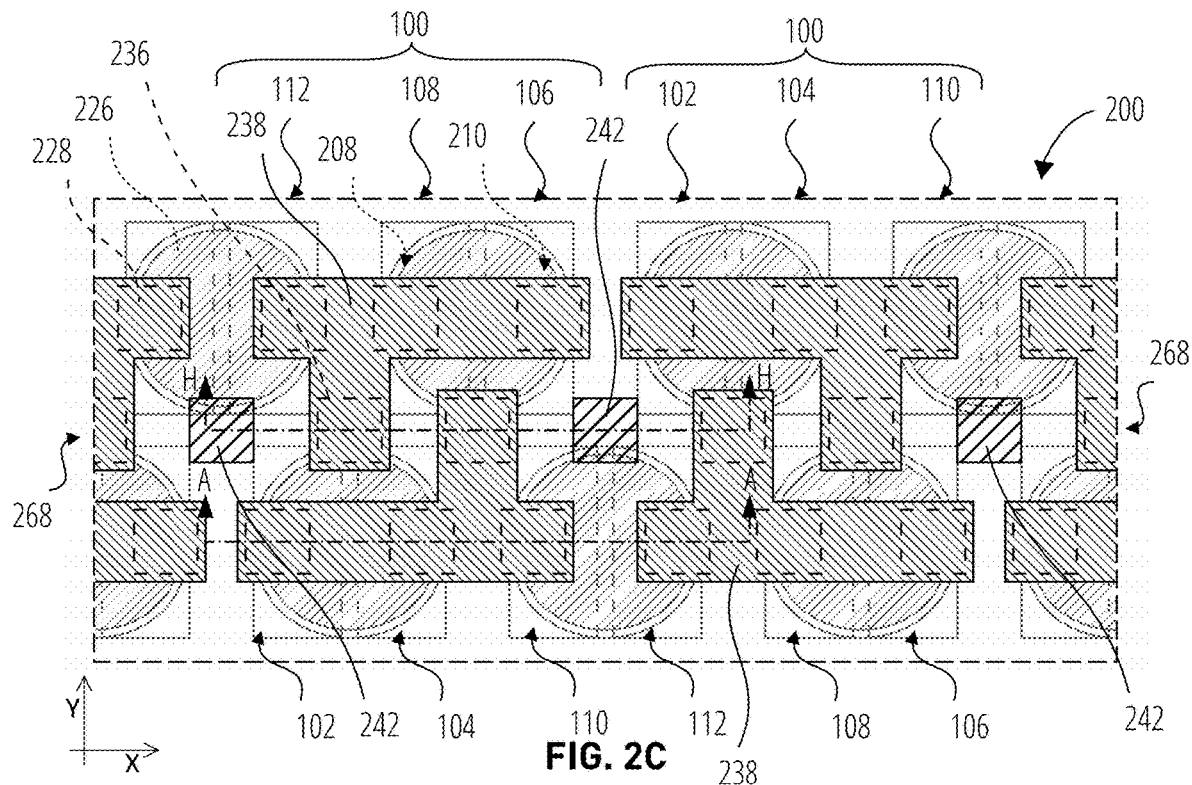

With continued reference to FIG. 2A and FIG. 2C, conductive rails 238 may be formed on the conductive plugs 228, above the insulative region 234, to electrically couple with the conductive plugs 228. The conductive rails 238 may, therefore, directly contact the conductive plugs 228.

The conductive rails 238 may extend vertically through an insulative region 240, which may be distinctive from or an indistinguishable continuation of the insulative region 234. The insulative region 240 may be formed of and include any one or more insulative materials described above. In some embodiments, the insulative region 240 comprises, consists essentially of, or consists of the same material(s) as the insulative region 234 (e.g., silicon dioxide).

As illustrated in FIG. 2C, each conductive rail 238 may connect to multiple (e.g., four) of the conductive plugs 228. In some embodiments, each conductive rail 238 connects to three of the conductive plugs 228 that are individually coupled with individual pillars 202 and connects to one of the conductive plugs 228 (e.g., one dual-contact conductive plug 236) that is dually coupled to a pair of the pillars 202 (e.g., the first pillar 208 and the second pillar 210 of one pair of pillars 202). Accordingly, as illustrated in FIG. 2C, one conductive rail 238 may be in electrical communication with the pillars 202 (FIG. 2A) associated with five of the six transistors (M1 to M6) of the 6T SRAM cell 100, including either (but not both) of the fifth transistor 110 (M5) and the sixth transistor 112 (M6). For example, for an individual one of the 6T SRAM cells 100, one conductive rail 238 (left-uppermost fully illustrated conductive rail 238 of FIG. 2C) may be coupled with the sixth transistor 112 (M6), the fourth transistor 108 (M4), the third transistor 106 (M3), and both the first transistor 102 (M1) and second transistor 104 (M2) of one of the 6T SRAM cells 100; and another conductive rail 238 (left-lowermost fully illustrated conductive rail 238 of FIG. 2C) may be coupled with the first transistor 102 (M1), the second transistor 104 (M2), the fifth transistor 110 (M5), and both the fourth transistor 108 (M4) and the third transistor 106 (M3) of the same 6T SRAM cell 100. The coupling to five of the six transistors may be facilitated by four of the conductive plugs 228, including one conductive plug 228 configured as the dual-contact conductive plug 236, because the dual-contact conductive plug 236 effectively provides coupling to both the first pillar 208 and the second pillar 210 associated with the gate electrode 226 to which the dual-contact conductive plug 236 extends.

Each conductive rail 238 may extend horizontally across three pillars 202 (FIG. 2A), including the first pillar 208 and the second pillar 210 of a pair associated with a common gate electrode 226 and with either the first pillar 208 or the second pillar 210 (but not with both) associated with a laterally neighboring gate electrode 226. The same conductive rail 238 may extend laterally to an adjacent gate electrode 226 associated with the first pillar 208 and the second pillar 210 of still another pair of pillars 202 (FIG. 2A). Therefore, each conductive rail 238 may be substantially "L" shaped.

The conductive rails 238 may be formed of and include any one or more conductive materials described above. For example, the conductive rails 238 may each comprise, consist essentially of, or consist of metal(s) (e.g., titanium, tungsten, cobalt, nickel, platinum), metal-containing composition(s) (e.g., metal silicide, metal nitride, metal carbide), conductively-doped semiconductor material(s) (e.g., conductively-doped silicon, conductively-doped germanium), or any combination of any one or more of the foregoing. The conductive material(s) of the conductive rails 238 may be the same or different than the conductive material(s) of the conductive plugs 228. In some embodiments, the conductive rails 238 comprise, consist essentially of, or consist of tungsten.

With continued reference to FIG. 2C, additional conductive contact structures, referred to herein as conductive WL contacts 242 are also formed to extend through the insulative region 234 (FIG. 2A) and the insulative region 240 (FIG. 2A), as well as through an insulative region 244 (FIG. 2A) above the insulative region 240. The conductive WL contacts 242 may be formed of and include any one or more of the conductive materials described above.

The insulative region 244 may be formed of and include any one or more insulative materials described above. The insulative region 244 may be distinctive from or an indistinguishable continuation of the insulative region 240 and, in some embodiments, also the insulative region 234. In some embodiments, the insulative region 244 comprises the same material(s) as the insulative region 240 and/or the insulative region 234 (e.g., silicon dioxide).

Each conductive WL contact 242 may extend to and directly physically contact the individual one of the gate electrodes 226—in a lateral front-most or rear-most region of the gate electrode 226—that extends between the fifth transistor 110 (M5) of one of the 6T SRAM cells 100 and the sixth transistor 112 of one other of the 6T SRAM cells 100. Accordingly, each 6T SRAM cell 100 is associated with two conductive WL contacts 242, one via connection to the gate electrode 226 adjacent the sixth transistor 112 (M6) and another via connection to the gate electrode 226 adjacent the fifth transistor 110 (M5). Also, each conductive WL contact 242 is electrically coupled, via one of the gate electrodes 226, with the pair of pillars 202 (e.g., the first pillar 208 and the second pillar 210) that are partially surrounded by that one gate electrode 226. Therefore, one conductive WL contact 242 provides electrical coupling with multiple (e.g., two) of the pillars 202 (FIG. 2A), which further facilitates a compact design for the microelectronic device 200 and enables increased device integration and scaling.

In some embodiments, the conductive WL contacts 242 associated with a series of the 6T SRAM cells 100 may be substantially linearly aligned, as illustrated in FIG. 2C.

Figure 2D:
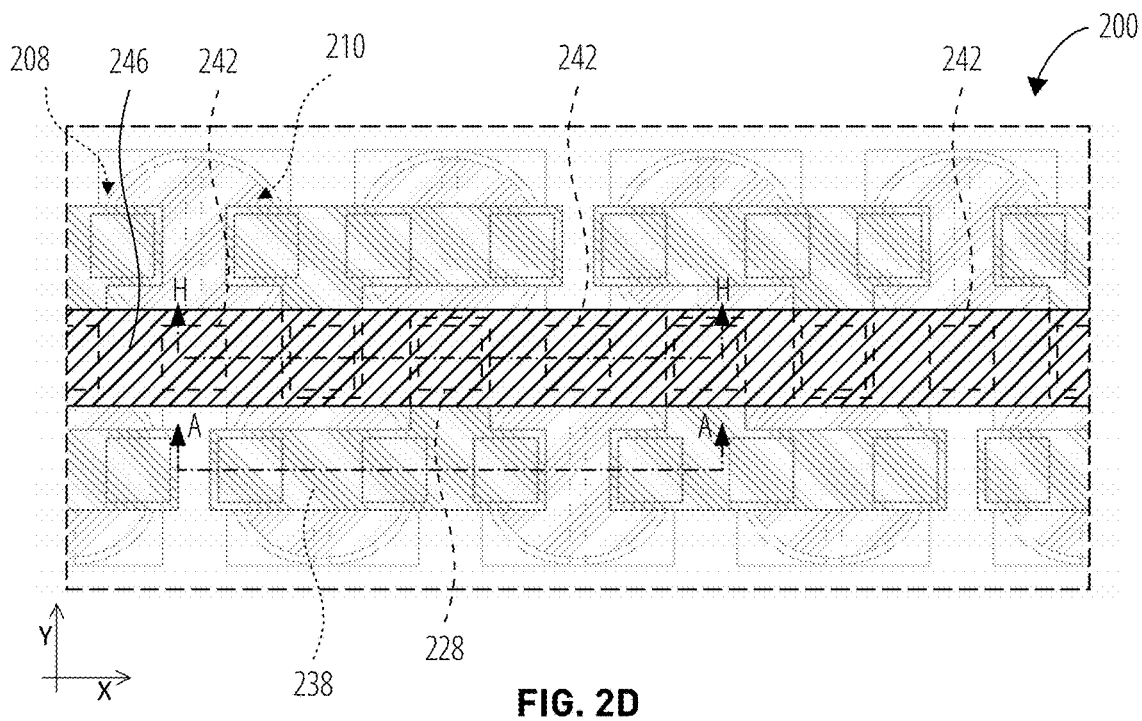

With continued reference to FIG. 2A and with reference to FIG. 2D, wordlines may be formed above and in direct physical contact with the conductive WL contacts 242. In some embodiments, the wordlines are in the form of substantially linear, elongate WL structures 246 (FIG. 2D), corresponding to a substantial linear alignment of a series of the conductive WL contacts 242 (FIG. 2C). The elongate WL structures 246 may be electrically coupled to other circuitry of the microelectronic device 200, and read/write operations for the 6T SRAM cells 100 may be facilitated by electrical communication via the elongate WL structures 246, the connected conductive WL contacts 242, gate electrodes 226, conductive plugs 228, and conductive rails 238.

The wordlines (e.g., the elongate WL structures 246) may be formed to extend through an insulative region 248 that is at elevations above the insulative region 244 and the upper-most portions of the conductive WL contacts 242 (FIG. 2D). The insulative region 244 may be vertically between the elongate WL structures 246 and the conductive rails 238 so that the elongate WL structures 246 are not in direct physical or electrical contact with the conductive rails 238.

The insulative region 248 may be formed of and include any one or more insulative materials described above. The insulative region 248 may be distinctive from or an indistinguishable continuation of the insulative region 244 and, in some embodiments, also the insulative region 240 and/or the insulative region 234. In some embodiments, the insulative region 248 comprises the same material(s) as the insulative region 244, the insulative region 240, and/or the insulative region 234 (e.g., silicon dioxide).

The elongate WL structures 246 may be formed of and include any one or more of the conductive materials described above. In some embodiments, the elongate WL structures 246 comprise, consist essentially of, or consist of the same conductive material(s) as the conductive rails 238 and/or conductive plugs 228.

The microelectronic device 200 may include multiple elongate WL structures 246, which may be arranged substantially parallel to one another, and each may be associated and electrically coupled with a series of 6T SRAM cells 100.

With continued reference to FIG. 2A, additional conductive features may be included below the pillars 202 (e.g., first pillars 208, second pillars 210), gate electrodes 226, and semiconductor material 204 to provide additional electrical communication with the 6T SRAM cells 100. In some embodiments, these additional conductive features include conductive contact structures (e.g., conductive VDD contacts 250, conductive BL contacts 252, and GND contacts 254, described further below) extending through an insulative structure 256 that is at elevations below the pillars 202 and the gate electrodes 226 to provide electrical contacts to pillars 202 (FIG. 2A) (e.g., the first pillars 208, the second pillars 210) of the 6T SRAM cells 100. The additional conductive features may also include additional elongate conductive "line" structures (e.g., elongate GND structures 258, elongate VDD structures 260, and elongate BL structures 262) that extend horizontally (e.g., longitudinally) across the microelectronic device 200 with direct physical contact with respective ones of the additional conductive contact structures, to provide electrical coupling between the lines and the 6T SRAM cells 100. The line structures may extend vertically through an insulative structure 264 that below the insulative structure 256, and some of the line structures may also extend vertically through an insulative structure 266 that is below the insulative structure 264.

Figure 2E:
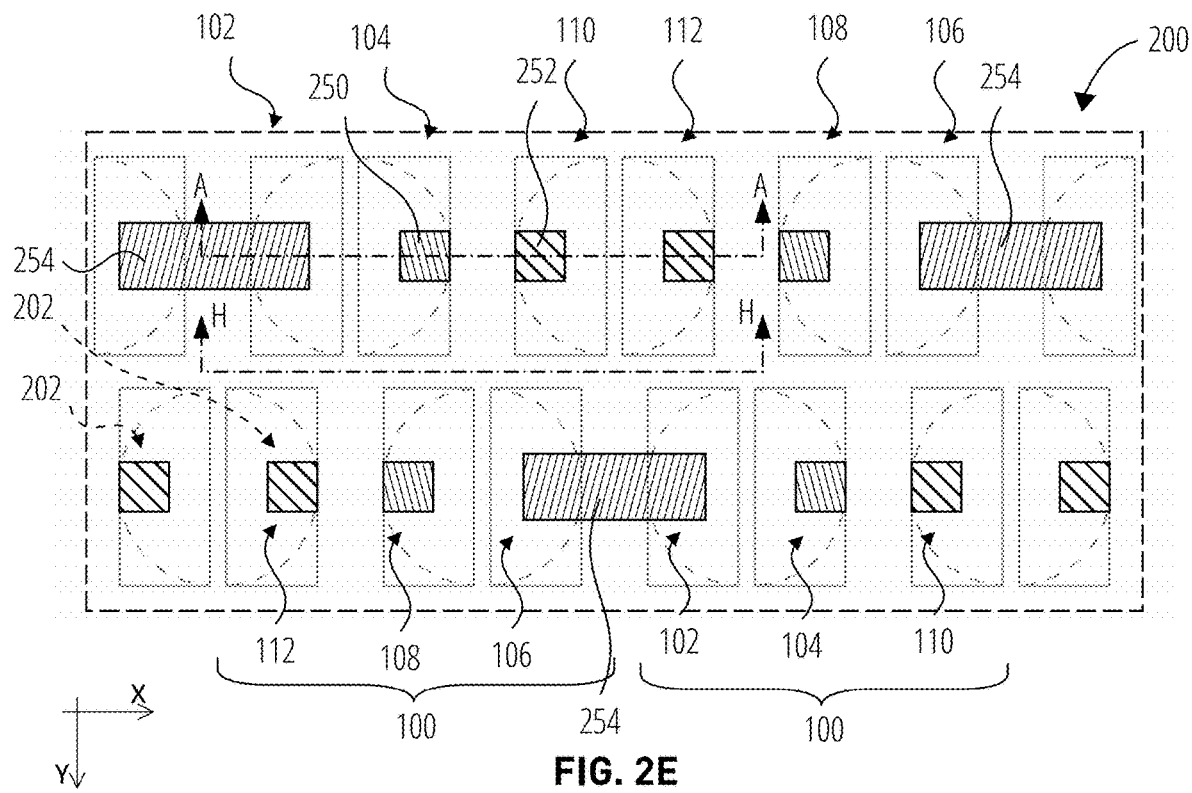

The conductive VDD contacts 250 may be arranged, such as illustrated in FIG. 2E, so that one conductive VDD contact 250 extends to and physically contacts the upper surface of the pillar 202 (e.g., second pillar 210) providing the second transistor 104 (M2) of the 6T SRAM cell 100, and such that one other conductive VDD contact 250 extends to and physically contacts the upper surface of the pillar 202 (e.g., first pillar 208) providing the fourth transistor 108 (M4) of the same 6T SRAM cell 100.

As illustrated in FIG. 2A, the conductive VDD contacts 250 may be formed in (e.g., extend vertically through) the insulative structure 256 that is below the insulative structures 206, the pillars 202, and the gate electrodes 226. The elongate VDD structures 260 may be formed in (e.g., extend vertically through) the insulative structure 264 that is below the insulative structure 256.

Figure 2F:
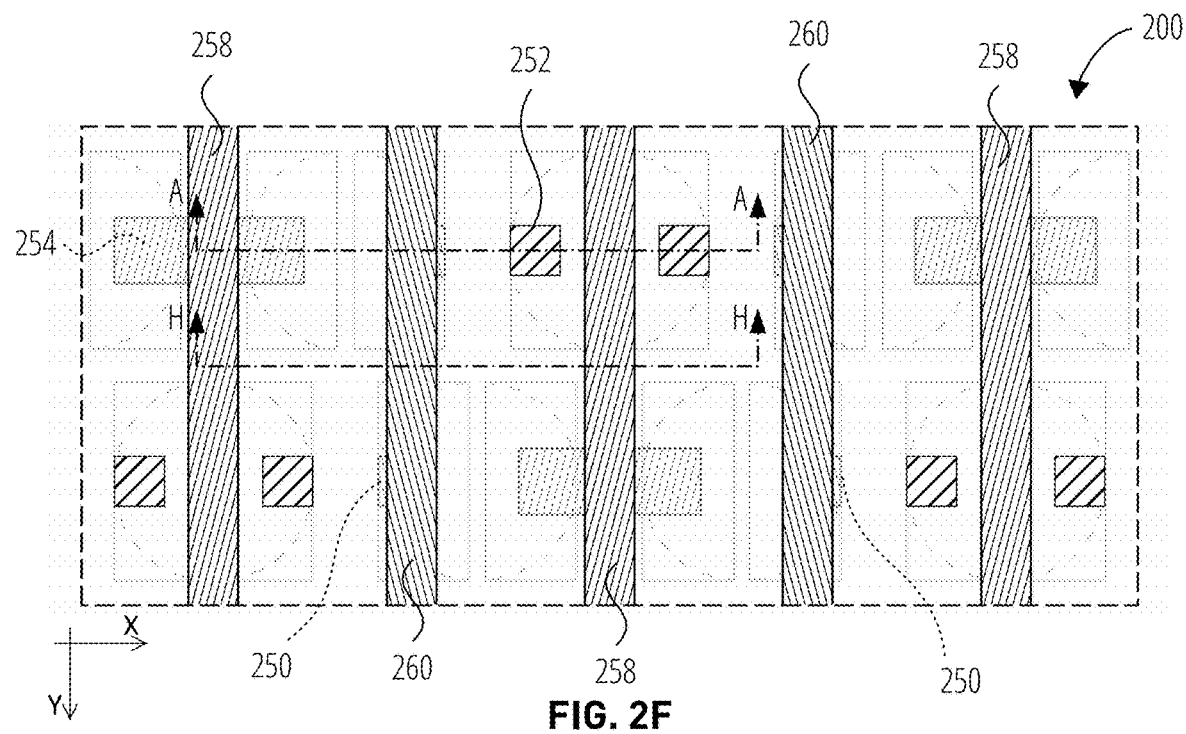

As illustrated in FIG. 2F, one of the elongate VDD structures 260 may extend horizontally (e.g., longitudinally) with direct physical connection and electrical coupling to substantially longitudinally aligned conductive VDD contacts 250 to provide the VDD connection between the second transistor 104 (M2) and the fourth transistor 108 (M4) illustrated in FIG. 1. Multiple elongate VDD structures 260 may be arranged substantially parallel to one another. The elongate VDD structures 260 may be formed in elevations of the insulative structure 264, as illustrated in FIG. 2A.

The conductive BL contacts 252 may be arranged, such as illustrated in FIG. 2E, so that one conductive BL contact 252 extends to and physically contacts the upper surface of the pillar 202 (e.g., the first pillar 208) providing the fifth transistor 110 (M5) of the 6T SRAM cell 100 and such that one other conductive BL contact 252 extends to and physically contacts the upper surface of the pillar 202 (e.g., the second pillar 210) providing the sixth transistor 112 (M6) of the same 6T SRAM cell 100.

As illustrated in FIG. 2A, the conductive BL contacts 252 may be formed in (e.g., extend vertically through) the insulative structure 256 and the insulative structure 264 that are below the insulative structures 206, the pillars 202, and the gate electrodes 226. The elongate BL structures 262 may be formed (e.g., extend vertically through) the insulative structure 266 that is below the insulative structure 264.

Figure 2G:
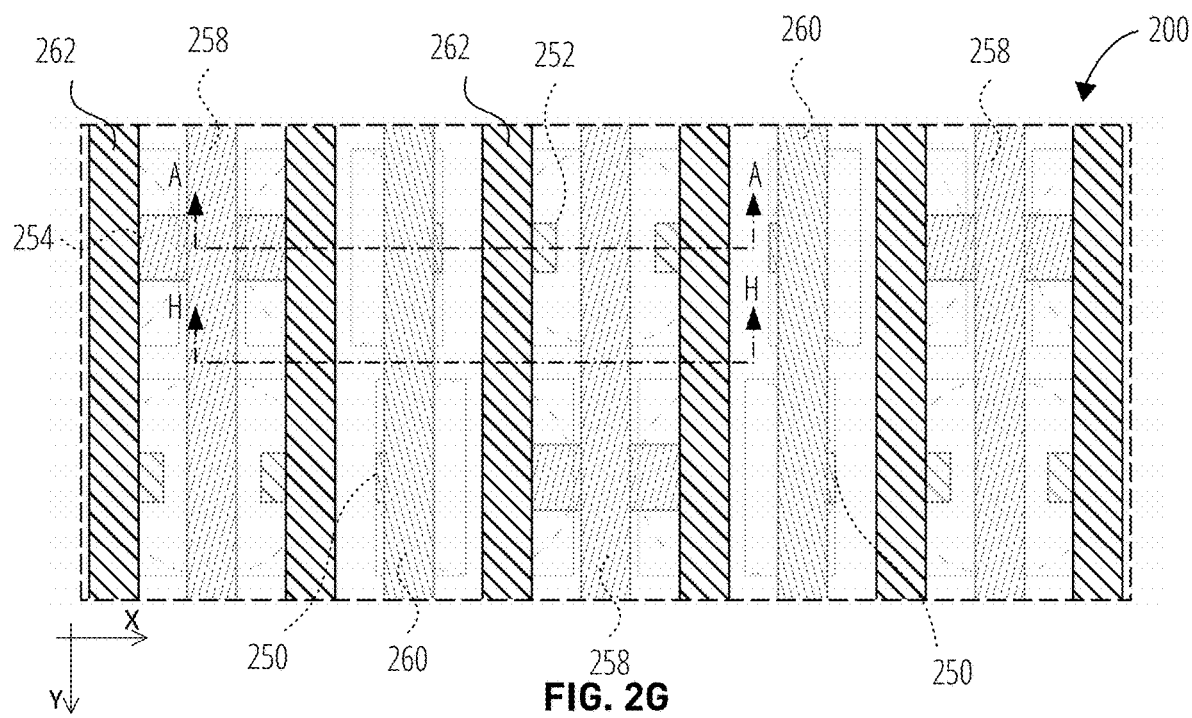

As illustrated in FIG. 2G, one of the elongate BL structures 262 may extend horizontally (e.g., longitudinally) with direct physical connection and electrical coupling to substantially longitudinally aligned conductive BL contacts 252 to provide the "BL" or the "BL" connections illustrated in FIG. 1. Multiple elongate BL structures 262 may be arranged substantially parallel to one another.

As illustrated in FIG. 2A, the elongate BL structures 262 may be formed in elevations of the insulative structure 266. Therefore, the elongate BL structures 262 may be disposed in elevations (e.g., of the insulative structure 266) that are below the elevations (e.g., of the insulative structure 264) occupied by the elongate VDD structures 260 and below the elevations (e.g., of the insulative structure 256) occupied by the conductive VDD contacts 250.

The GND contacts 254 may be arranged, as illustrated in FIG. 2E, so that one GND contact 254 extends to and physically contacts the upper surface of the pillar 202 (e.g., the first pillar 208) providing the first transistor 102 (M1) of the 6T SRAM cell 100 as well as extending to and physically contacting the upper surface of the pillar 202 (e.g., the second pillar 210) providing the third transistor 106 (M3) of a neighboring 6T SRAM cell 100.

As illustrated in FIG. 2A and FIG. 2E, a single GND contact 254 may be formed to be relatively wider than (e.g., at least twice as wide as) other contact structures (e.g., wider than the conductive VDD contacts 250, wider than the conductive BL contacts 252) of the 6T SRAM cell 100. Therefore, a single one of the GND contacts 254 provides contact to multiple pillars 202 of multiple 6T SRAM cells 100. This configuration may also facilitate a compact 6T SRAM cell 100 design and increased device integration and scaling.

As illustrated in FIG. 2A, the GND contacts 254 may be formed in (e.g., extend vertically through) the insulative structure 256 that is below the insulative structures 206, the pillars 202, and the gate electrodes 226. Therefore, the GND contacts 254 may occupy substantially the same elevations as occupied by the conductive VDD contacts 250.

As illustrated in FIG. 2F, one of the elongate GND structures 258 may extend horizontally (e.g., longitudinally) with direct physical connection and electrical coupling to the GND contacts 254 of overlapped horizontal area to provide the second reference voltage ("GND") of FIG. 1. Multiple elongate GND structures 258 may be arranged substantially parallel to one another.

As illustrated in FIG. 2A, the elongate GND structures 258 may be formed in elevations of the insulative structure 264. Therefore, the elongate GND structures 258 may be disposed in elevations (e.g., of the insulative structure 264) that are below the elevations (e.g., of the insulative structure 256) occupied by the GND contacts 254, the conductive VDD contacts 250, and portions of the conductive BL contacts 252, and above the elevations (e.g., of the insulative structure 266) occupied by the conductive BL contacts 252. Accordingly, in at least some areas, the insulative structure 266 vertically spaces areas of the GND contact 254 from overlapping areas of the elongate BL structures 262. Therefore, the GND contacts 254 may be formed to the above-described relatively wider horizontal dimension without causing electrical shorting between the GND contacts 254 and the elongate BL structures 262. This arrangement may also promote a compact microelectronic device 200 design and increased device integration and scaling.

With reference to FIG. 2G, the elongate BL structures 262, the elongate GND structures 258, and the elongate VDD structures 260 may be arranged to be substantially parallel to one another, extending in a horizontal (e.g., longitudinal) direction that is generally perpendicular to a horizontal (e.g., lateral) direction in which the elongate WL structures 246 (FIG. 2D) extend. The elongate BL structures 262 may be arranged so that one elongate BL structures 262 is laterally between one of the elongate GND structures 258 and one of the elongate VDD structures 260.

Figure 2H:
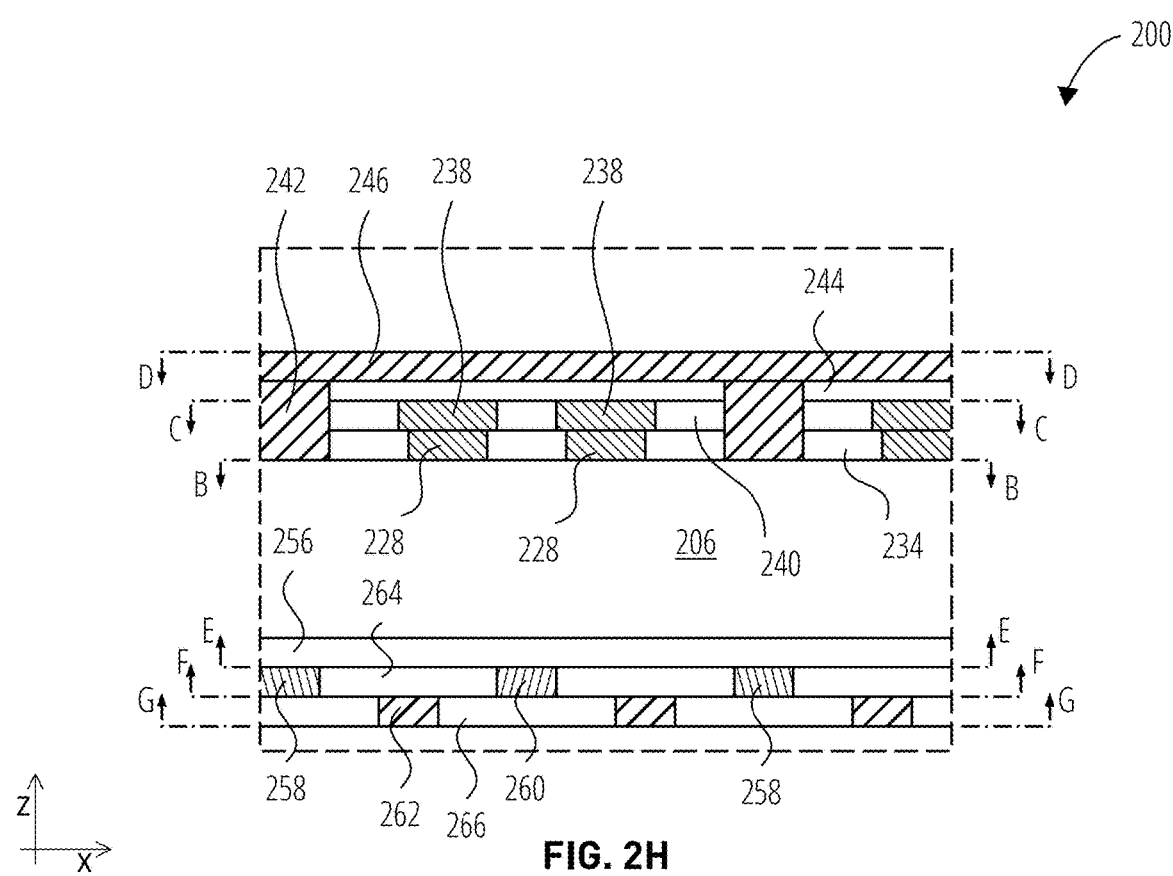

FIG. 2H illustrates an example of a relative lateral and elevational arrangement of the elongate WL structures 246, the conductive WL contacts 242, the conductive rails 238, the conductive plugs 228, the insulative region 234, the insulative region 240, and the insulative region 244 in an area vertically above the insulative structure 206. FIG. 2H also further illustrates an example of a relative lateral and elevational arrangement of the elongate GND structures 258, the elongate VDD structures 260, the elongate BL structures 262, the insulative structure 256, the insulative structure 264, and the insulative structure 266 in an area vertically below the insulative structure 206.

Any or all of the conductive VDD contacts 250, the conductive BL contacts 252, the GND contacts 254, the elongate VDD structures 260, the elongate BL structures 262, and the elongate GND structures 258 may be formed of and include any one or more of the conductive materials described above, and the respective conductive material(s) of these features may be the same or different than one another.

Any or all of the insulative structure 264, the insulative structure 256, and the insulative structure 266 may be formed of one or more of the insulative materials described above. The insulative structure 264, the insulative structure 256, and the insulative structure 266 may be distinctive from one another or they may be indistinguishable continuations of one another and may comprise, consist essentially of, or consist of the same insulative material(s) (e.g., silicon dioxide) or different insulative material(s).

Accordingly, disclosed is a microelectronic device comprising at least one memory cell. Each memory cell comprises six transistors comprising six pillars grouped in pillar pairs and formed from a semiconductor material. Each of the pillar pairs comprises a first pillar and a second pillar. The at least one memory cell also comprises gate electrodes. Each of the gate electrodes extends between and partially horizontally surrounds the first pillar and the second pillar of a different one of the pillar pairs. Conductive structures are electrically coupled to the six pillars. At least one of the conductive structures is in physical contact with more than one of the pillars of the microelectronic device.

With reference to FIG. 3A through FIG. 17C, illustrated are various stages of a method of forming a microelectronic device, such as the microelectronic device 200 of FIG. 2A through FIG. 2H and other microelectronic devices of embodiments of the disclosure.

Figure 3A:
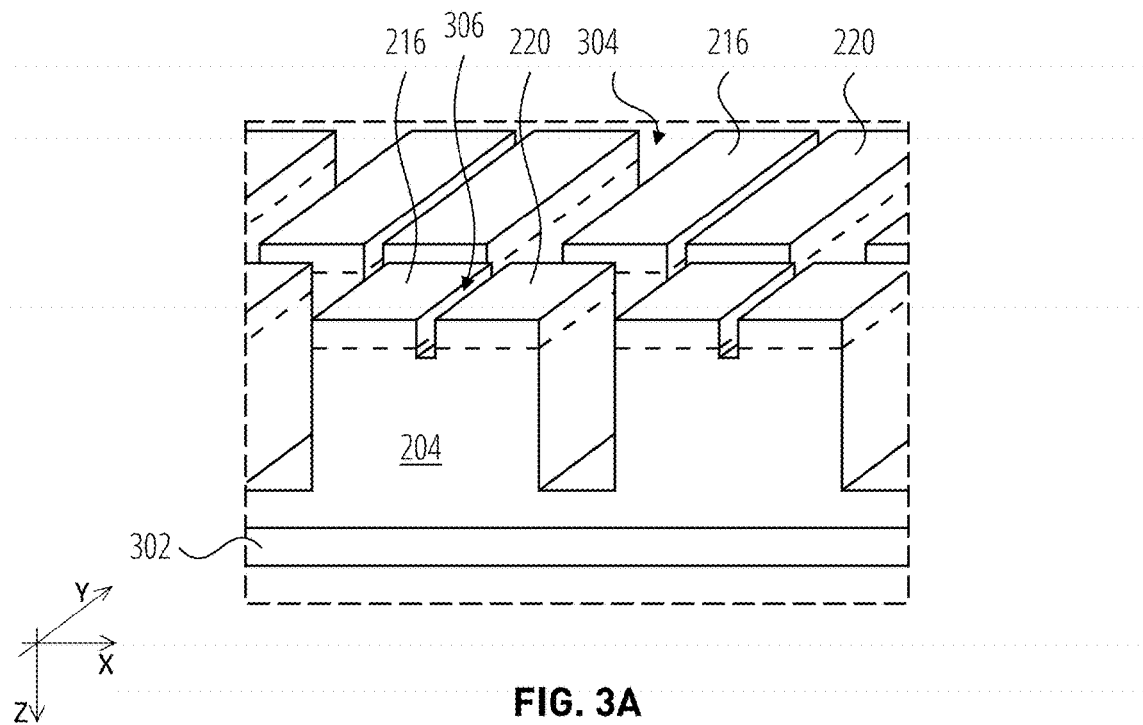
FIG. 3A through FIG. 17C are schematic views of various stages of processing to fabricate a microelectronic device, such as the microelectronic device of FIG. 2A through FIG. 2H and other figures, according to embodiments of the disclosure, wherein figures sharing a same numeral identifier may illustrate a same processing stage; wherein figures identified with the letters "A" and "C" are views of a portion of the structures illustrated in the related "B"-identified features and corresponding to section lines A-A and C-C, respectively, in the "B"-identified features; wherein figures accompanied by an illustrated X-Y-Z axes symbol are cross-sectional isometric views from either the front-top where the Z-axis is indicated to be upward directed or from the front-bottom where the Z-axis is indicated to be downward directed; wherein figures accompanied by an illustrated X-Y axes symbol with an upward directed Y-axis are plan views; wherein figures accompanied by an illustrated X-Y axes symbol with a downward directed Y-axis are bottom views; figures accompanied by an illustrated X-Z axes symbol with an upward directed Z axis are cross-sectional elevational views; and figures accompanied by an illustrated X-Z axes symbol with a downward directed Z axis are cross-sectional inverted elevational views.
Figure 3B:
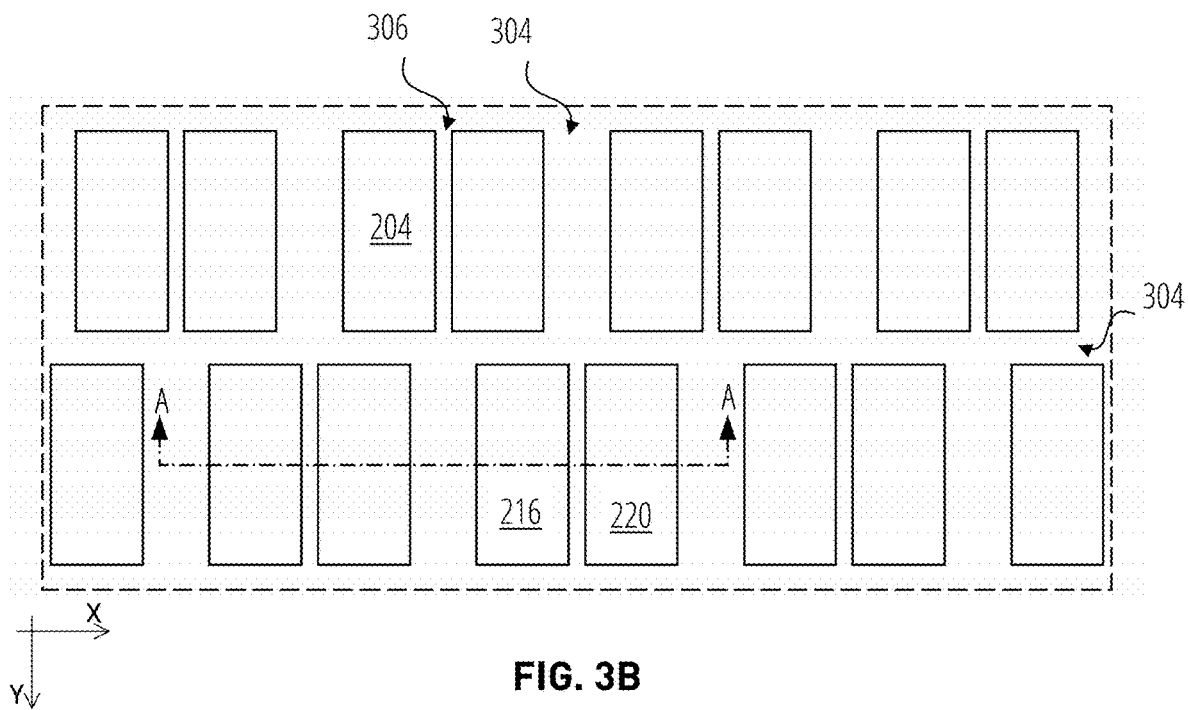

With reference to FIG. 3A and FIG. 3B, a structure formed of the semiconductor material 204 may be supported by a support structure 302 (e.g., a wafer), and the semiconductor material 204 may be doped, along an initially upper surface, with dopant types and dopant levels to form the first lower doped regions 216 and the second lower doped regions 220. The semiconductor material 204 may be patterned (e.g., etched) to form trenches 304 where the insulative structures 206 (FIG. 2B) are to be formed and to form trenches 306 where the insulative isolation structures 222 (FIG. 2A) are to be formed. The trenches 306 may be formed to a sufficient depth to physically space and isolate the first lower doped region 216 from the second lower doped region 220 of each area of the semiconductor material 204 defined by the trenches 304.

Figure 4A:
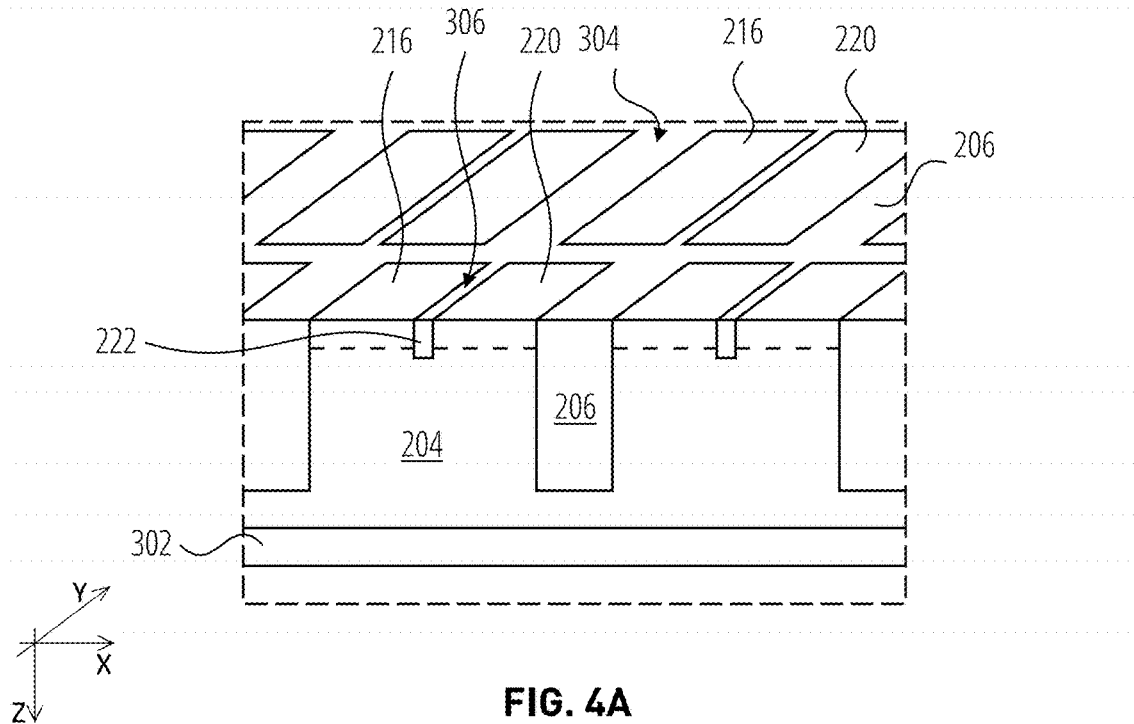
Figure 4B:
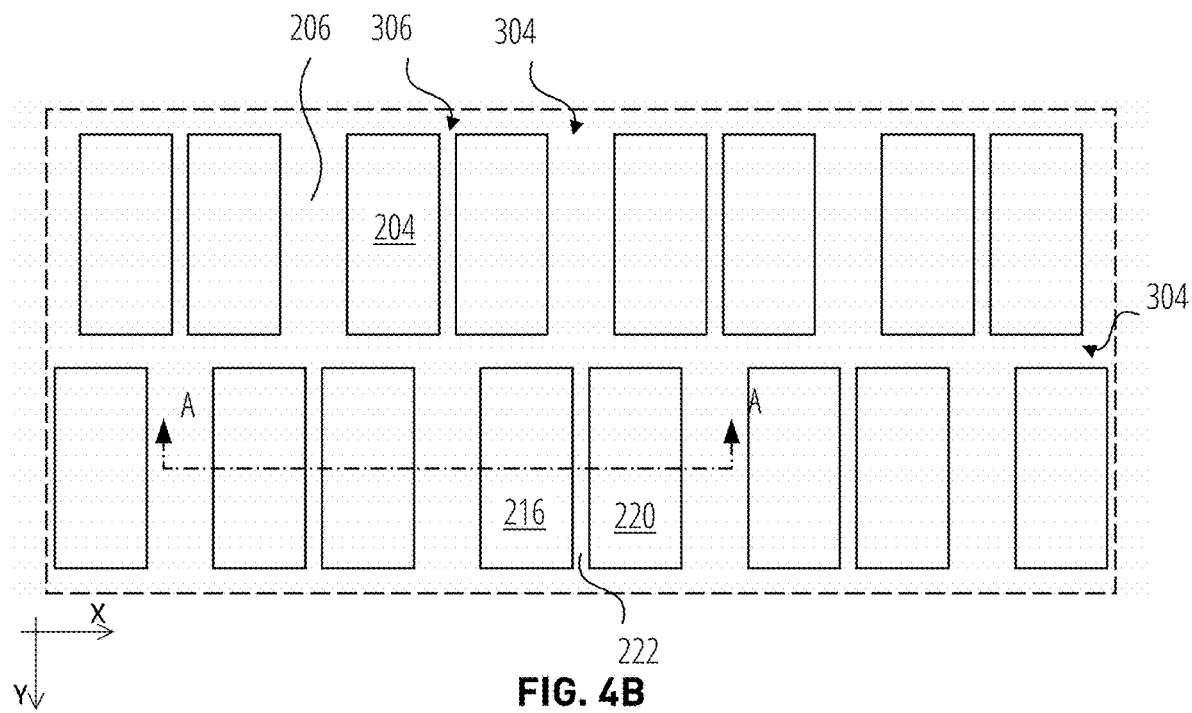

With reference to FIG. 4A and FIG. 4B, the insulative material(s) of the insulative structure 206 may be formed (e.g., deposited) in the trenches 304, and the insulative material(s) of the insulative isolation structure 222 may be formed in the trenches 306. In some embodiments, the structure may be subjected to planarization after such insulative material formation acts.

Figure 5A:
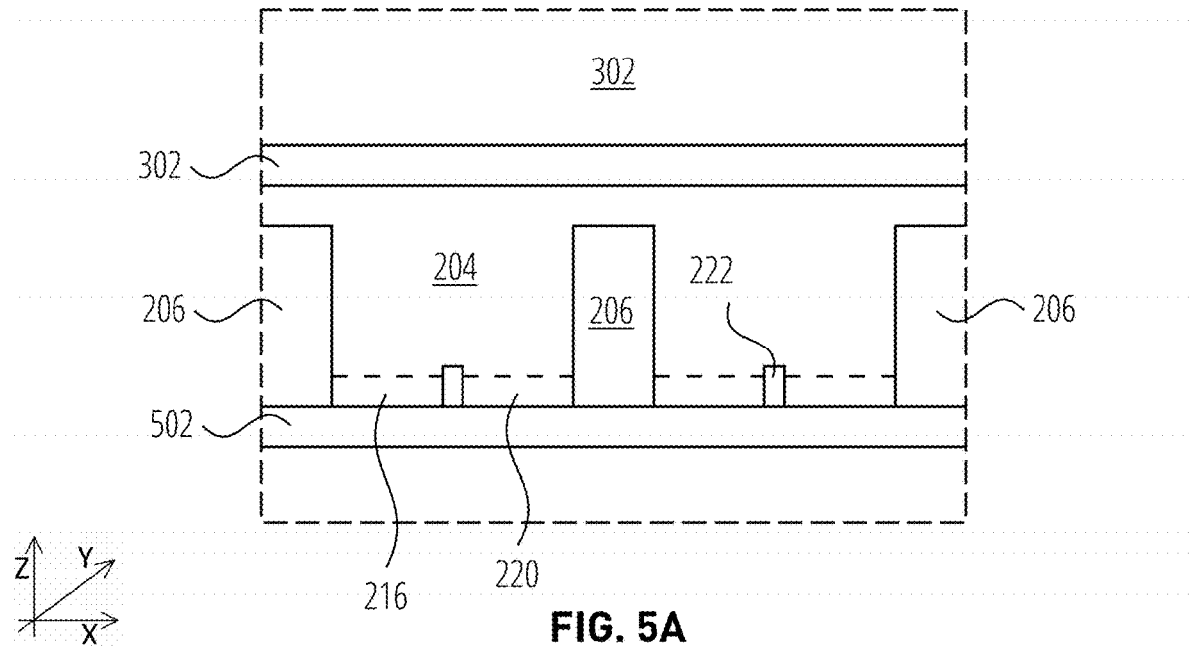
Figure 5B:
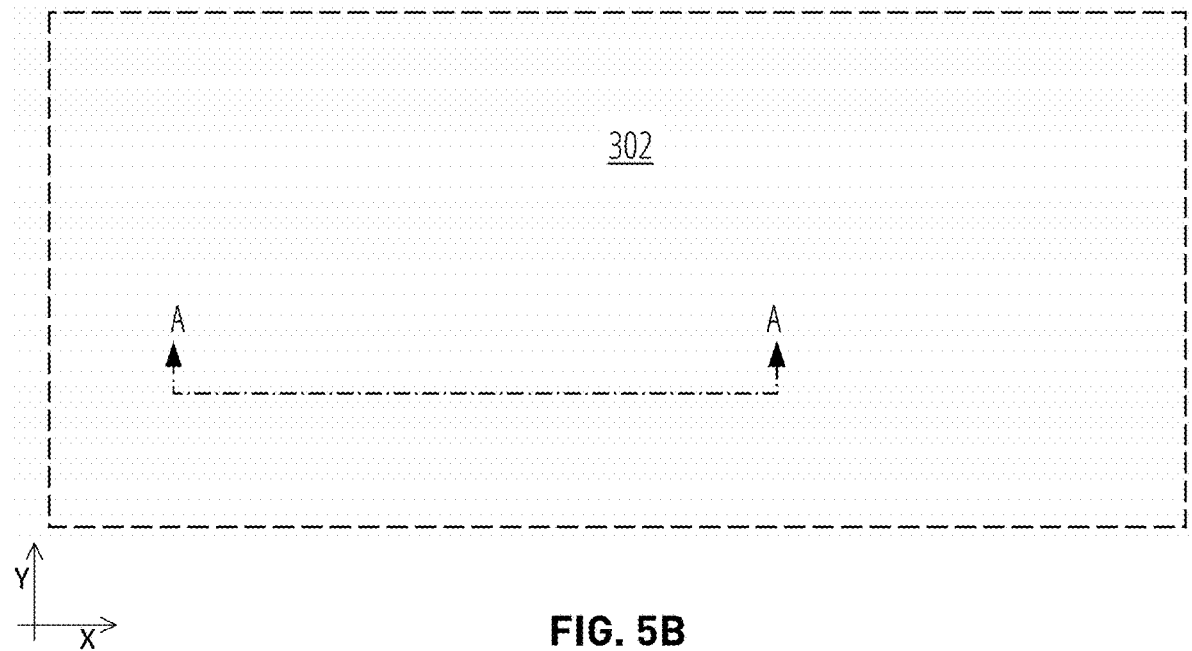

With reference to FIG. 5A and FIG. 5B, the structure may be inverted and the previously-upper surface(s) joined (e.g., bonded) to an additional support structure 502.

Figure 6A:
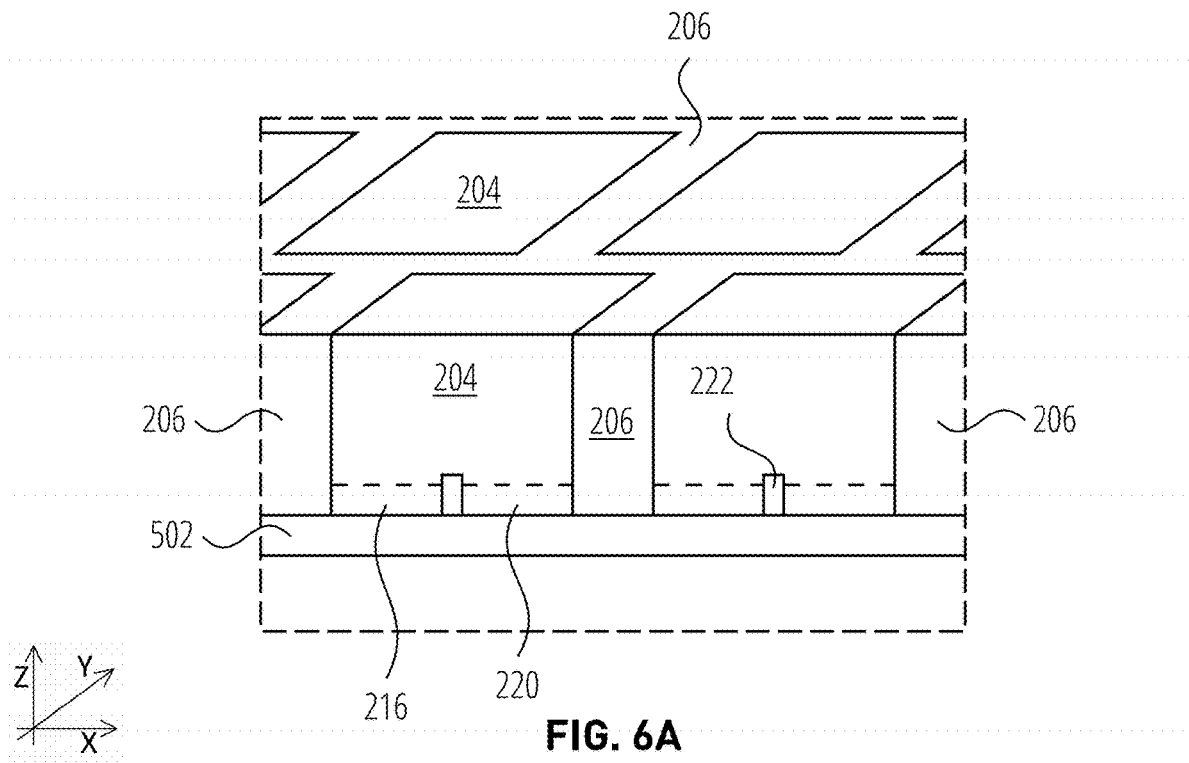
Figure 6B:
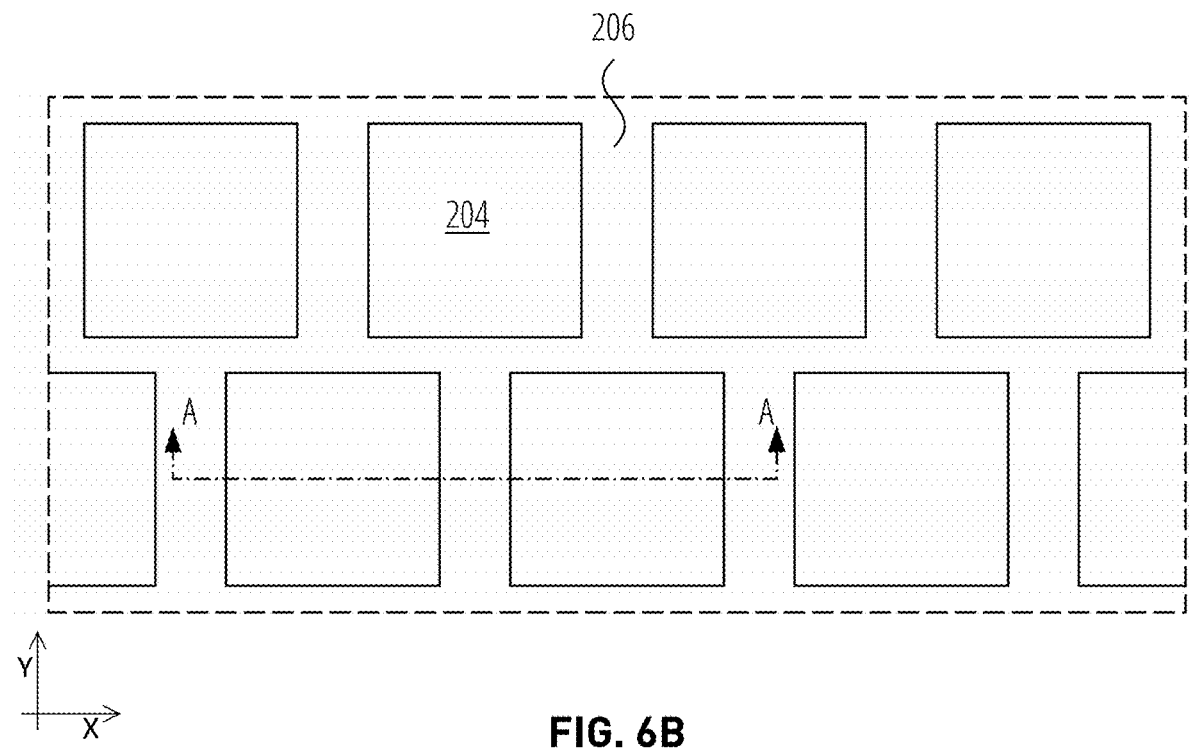

The support structure 302, now disposed on top of the semiconductor material 204, may be removed, such as by grinding or other material-removal technique(s), to expose the semiconductor material 204 and the insulative structure 206 along the now-upper surface of the structure, as illustrated in FIG. 6A and FIG. 6B. Accordingly, the insulative structure 206 may extend an entire height of the semiconductor material 204. The first lower doped region 216, the second lower doped region 220, and the insulative isolation structure 222 may be disposed along a lower surface, directly adjacent the additional support structure 502.

Figure 7A:
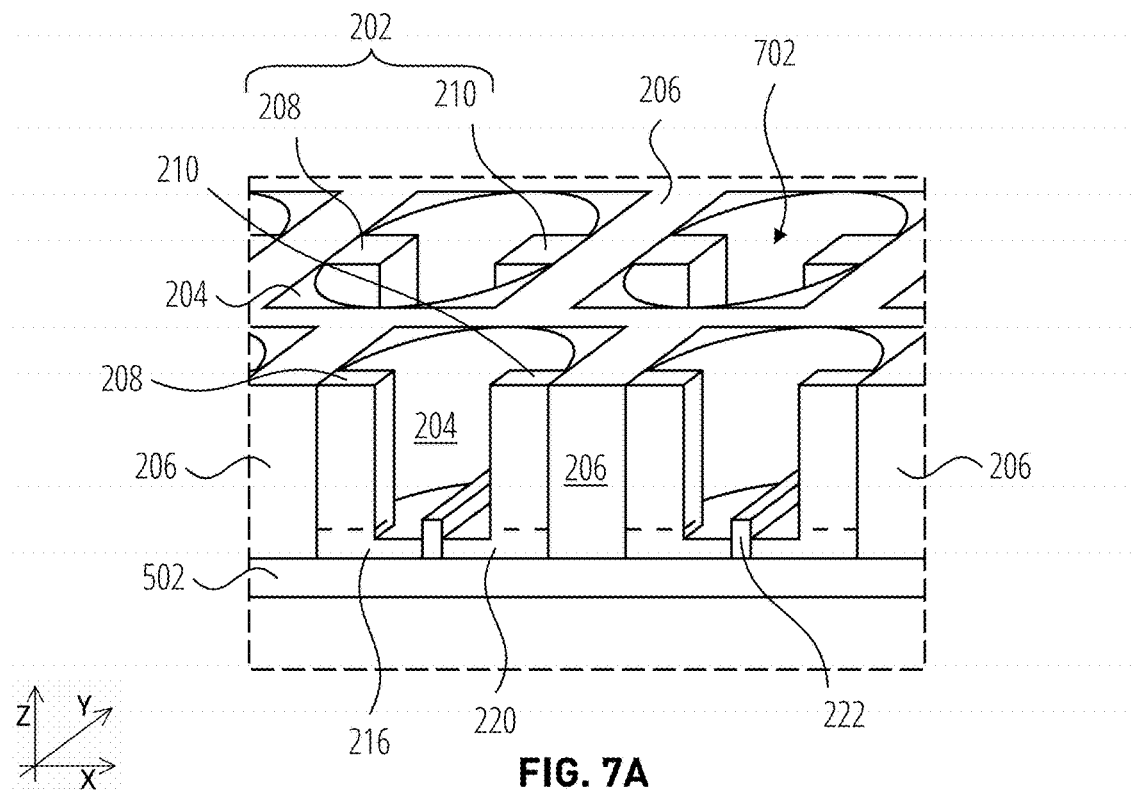
Figure 7B:
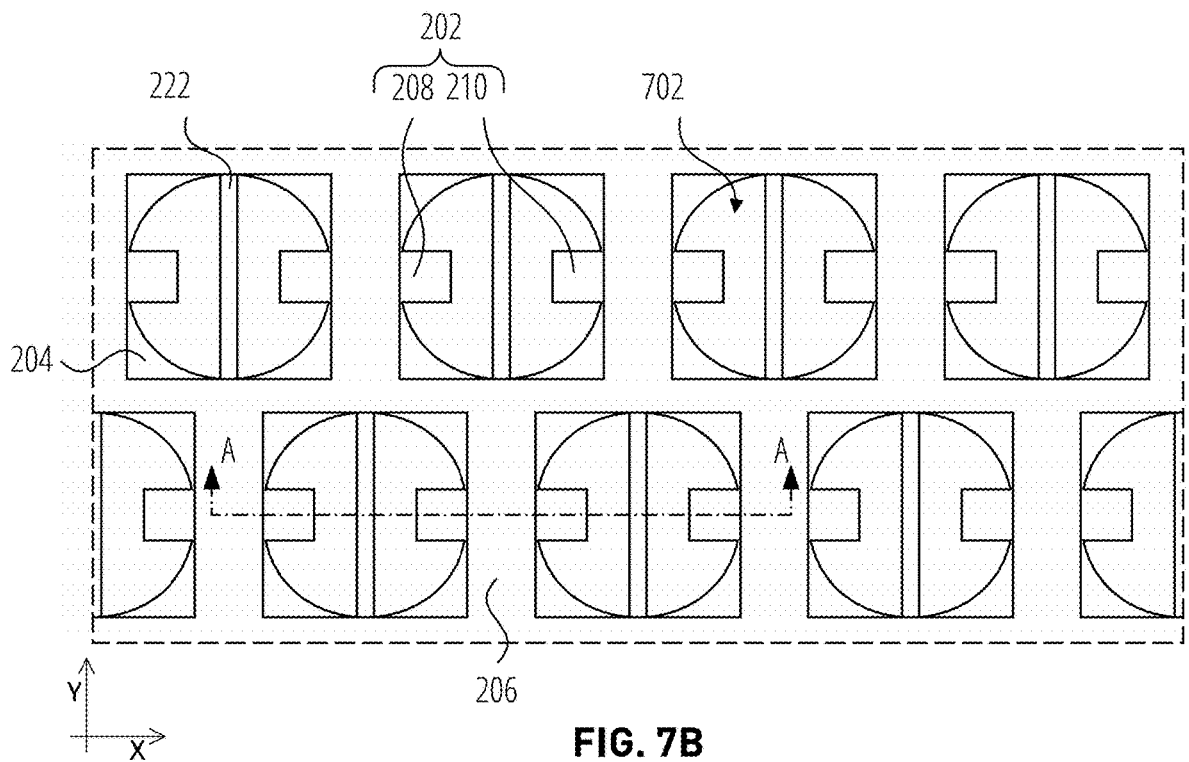

With reference to FIG. 7A and FIG. 7B, openings 702 may be formed (e.g., etched) into each area of the semiconductor material 204 to define the pillars 202 (e.g., the first pillar 208, the 210) of each pair of pillars 202. The openings 702 may be formed to a sufficient depth to extend at least to and/or partially into the first lower doped region 216 and the second lower doped region 220, exposing at least an uppermost portion of the insulative isolation structure 222.

Figure 8A:
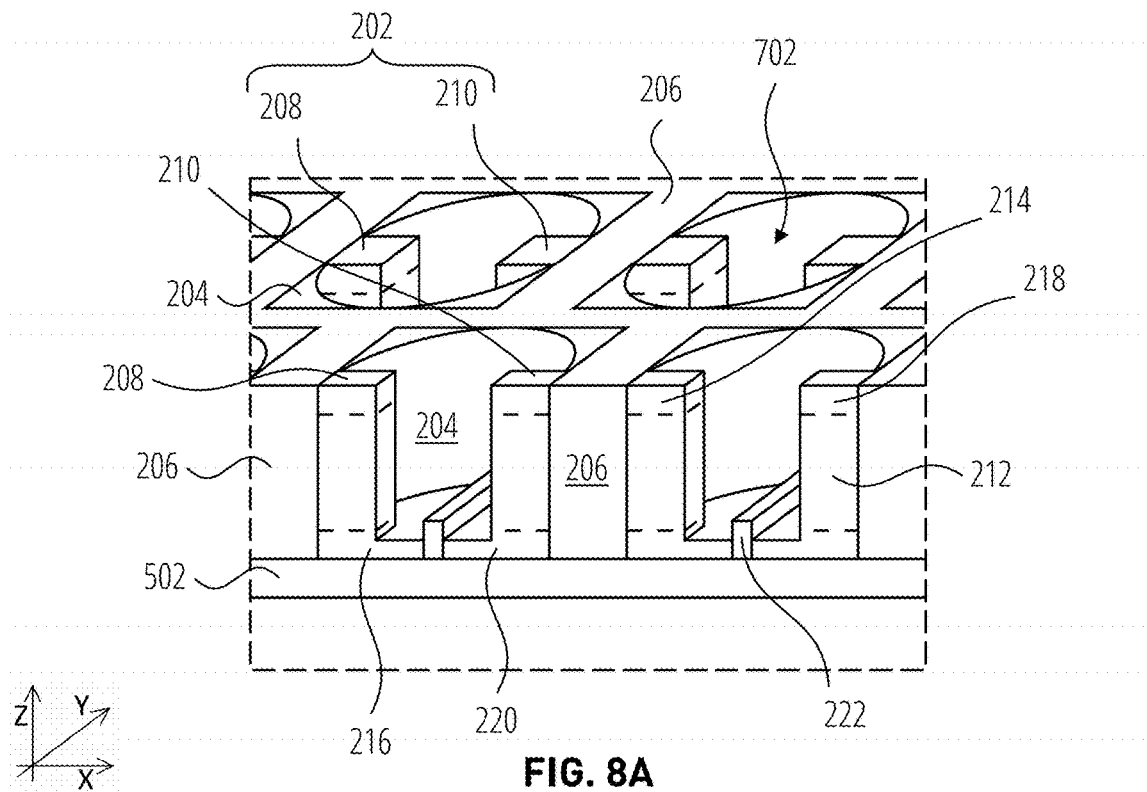
Figure 8B:
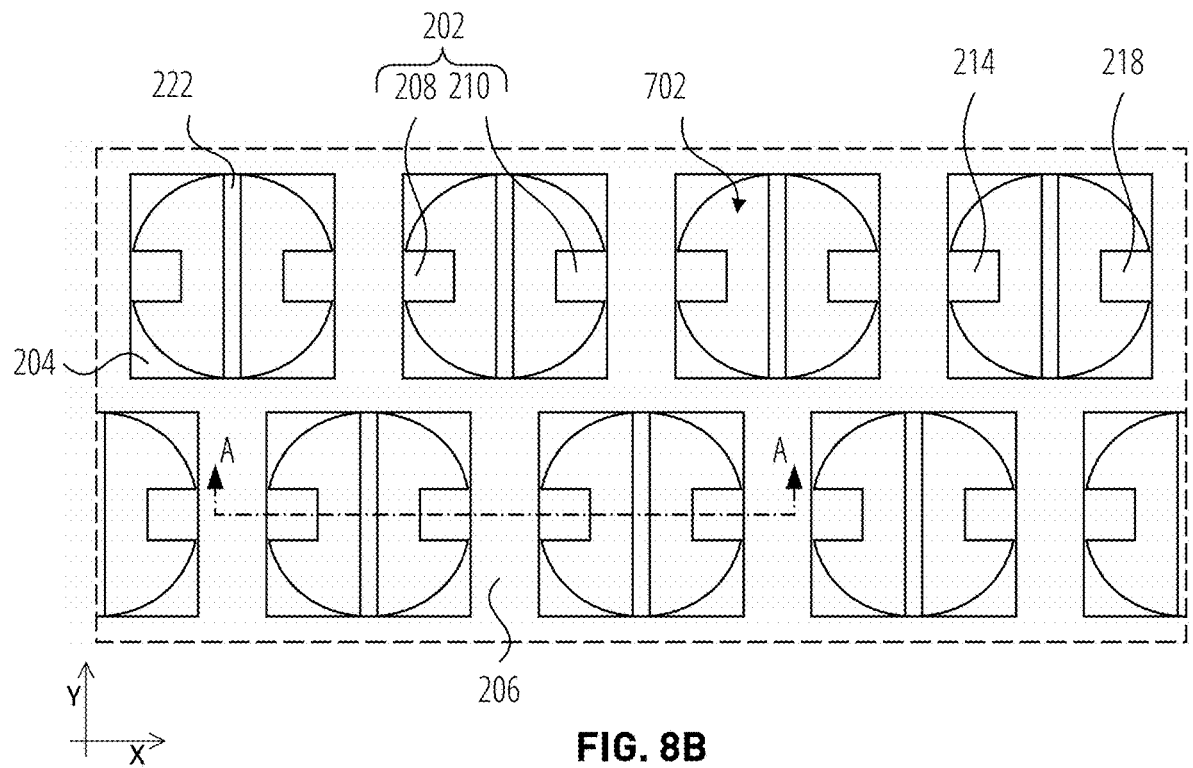

With reference to FIG. 8A and FIG. 8B, additional dopant(s) may be added to the semiconductor material 204 of at least the first pillars 208 and the second pillars 210 to define the vertical channel regions 212 with the desired dopant type and dopant level for the transistor to be provided by each respective pillar 202. Dopant(s) may also be incorporated (e.g., implanted) into the upper surface of the pillars 202, with sufficient dopant type and dopant level, so as to provide the first upper doped region 214 and the second upper doped region 218 in each pair of pillars 202. For example, to form a P-type region, a photomask may be formed over any N-type region(s) already formed or to be formed and—with the photomask in place—suitable dopant(s) (e.g., phosphorous (P), arsenic (As), or any combination of the foregoing) may be injected into the target region to form the P-type region. As another example, to form an N-type region, a photomask may be formed over any P-type region(s) already formed or to be formed and—with the photomask in place—suitable dopant(s) (e.g., boron (B)) may be injected into the target region to form the N-type region.

Figure 9A:
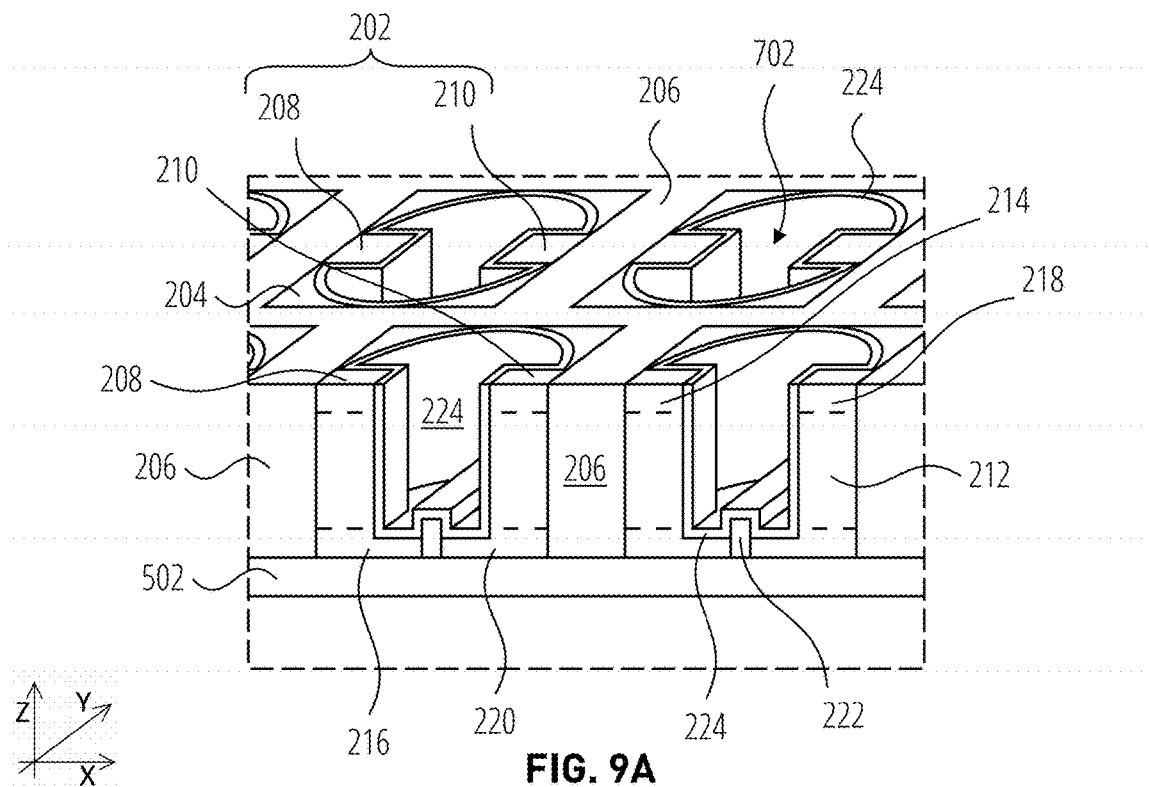
Figure 9B:
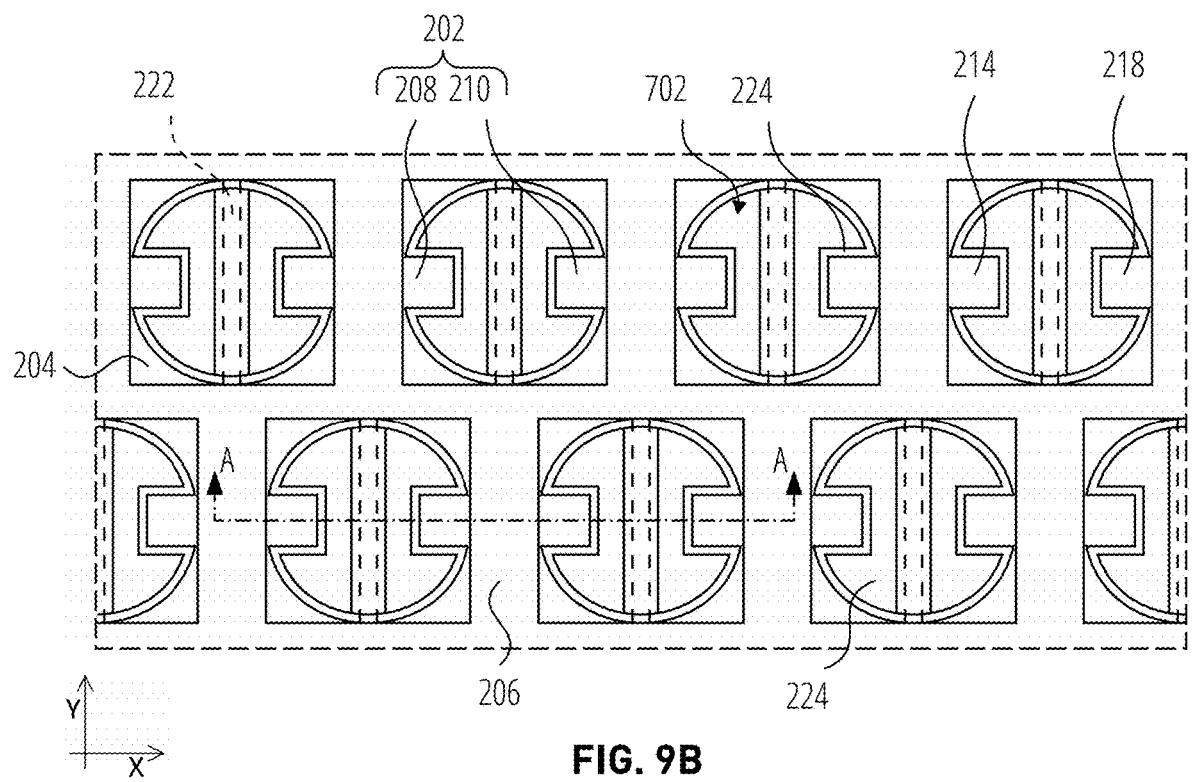

With reference to FIG. 9A and FIG. 9B, the liner 224 may then be formed in the openings 702 by forming (e.g., conformally depositing) the insulative material(s) of the liner 224 along the surfaces exposed in the openings 702.

Figure 10A:
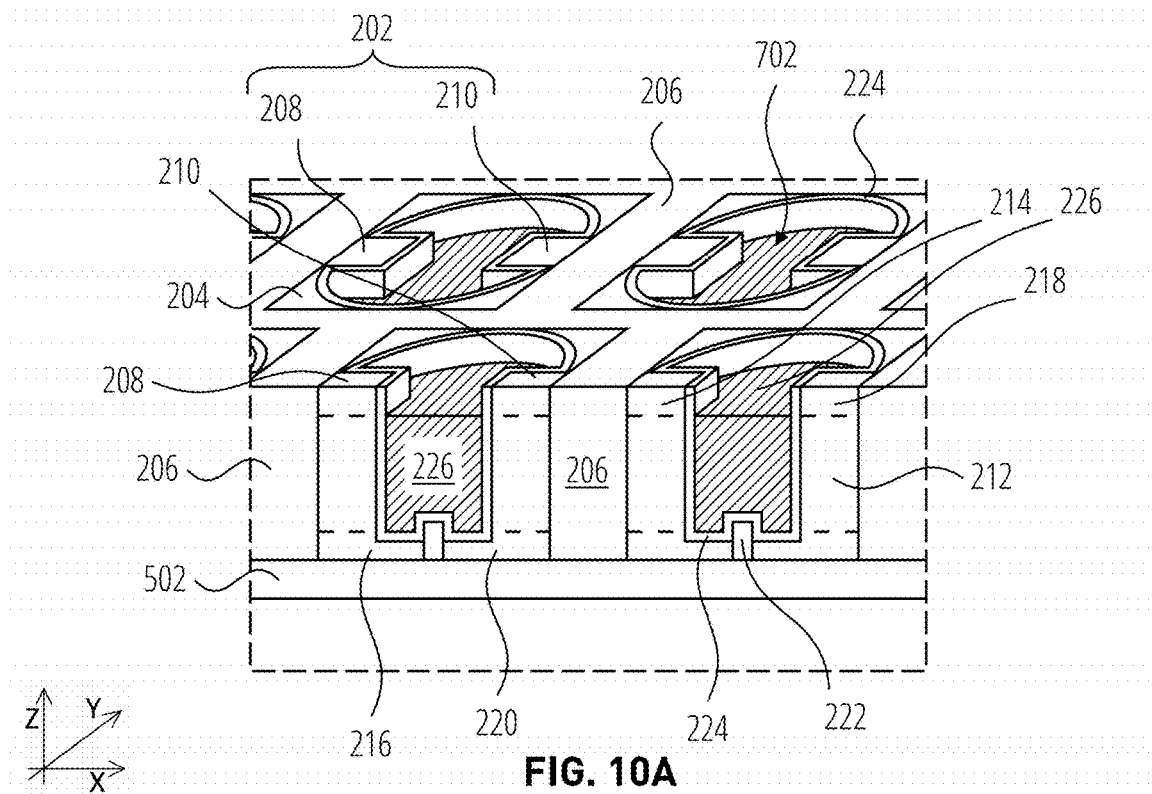
Figure 10B:
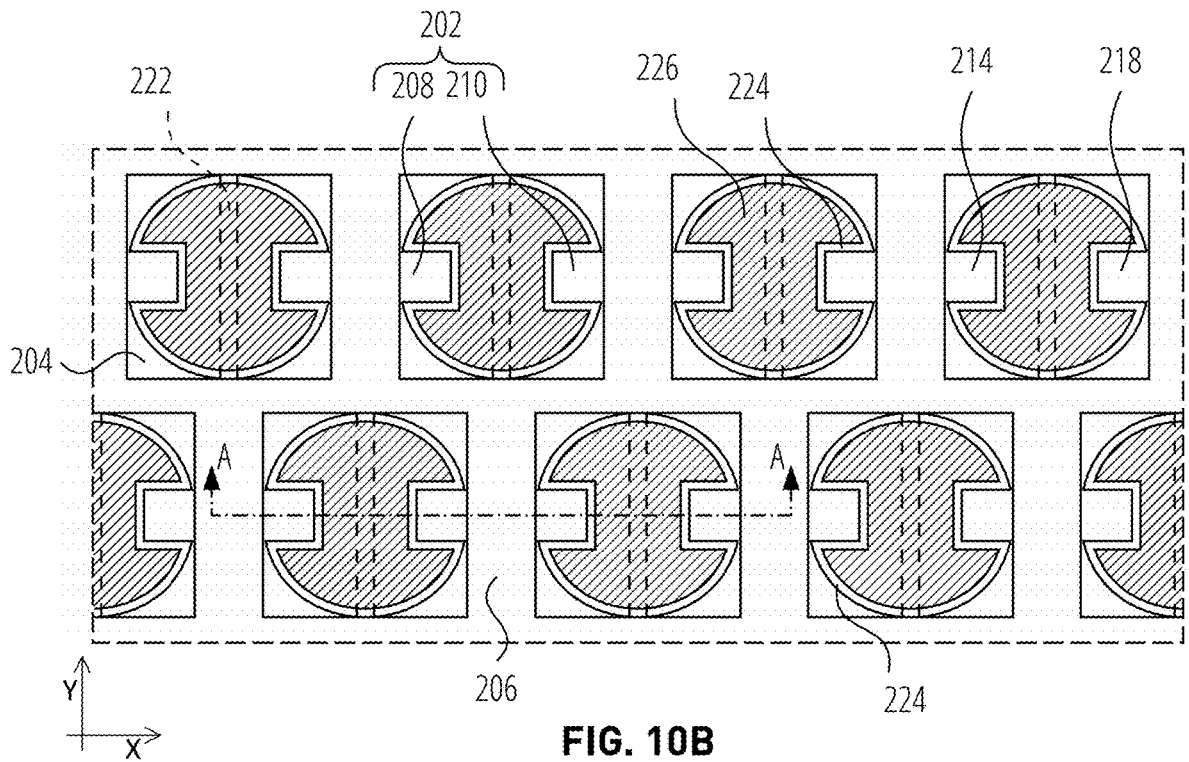

With reference to FIG. 10A and FIG. 10B, the conductive material(s) of the gate electrode 226 may be formed (e.g., deposited) on the liner 224 in the openings 702. The gate electrodes 226 may be formed to substantially fill the openings 702 and then recessed to about the elevation of the lower boundary of the first upper doped region 214 and the second upper doped region 218. Alternatively, the gate electrodes 226 may be formed to partially fill the openings 702 up to about the elevation of the lower boundary of the first upper doped region 214 and the second upper doped region 218.

Figure 11A:
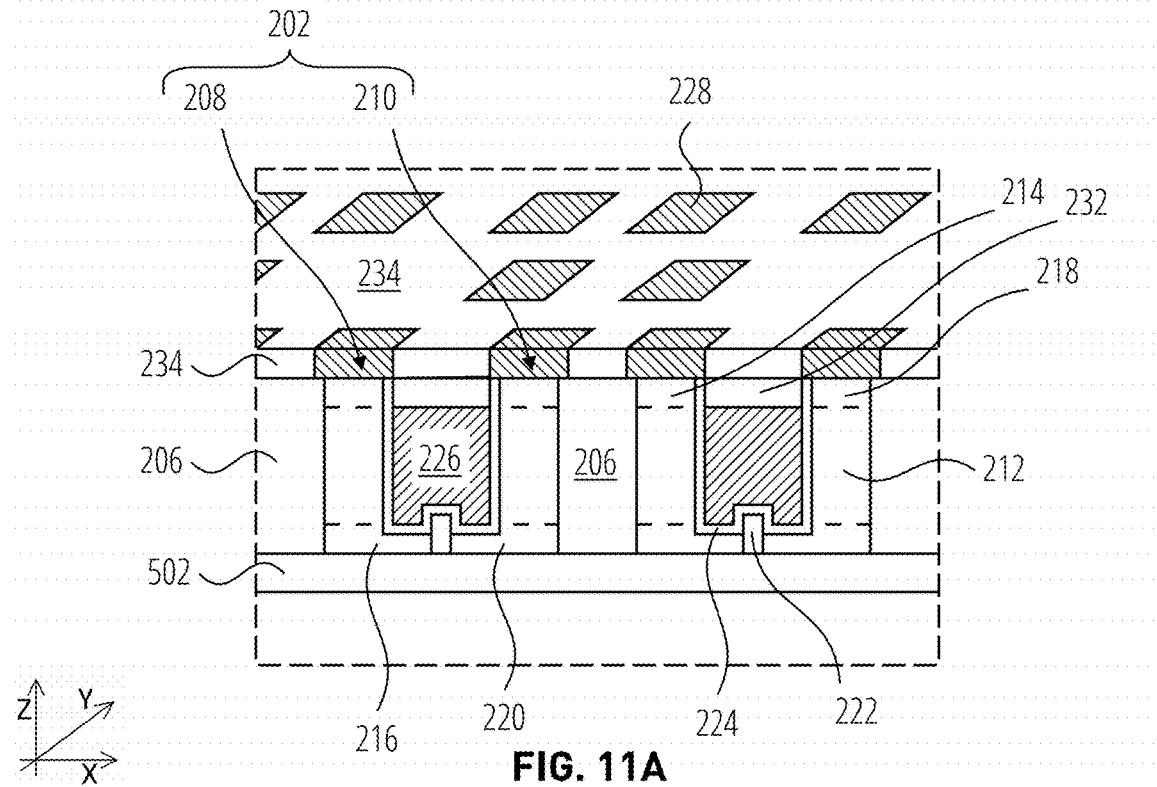
Figure 11B:
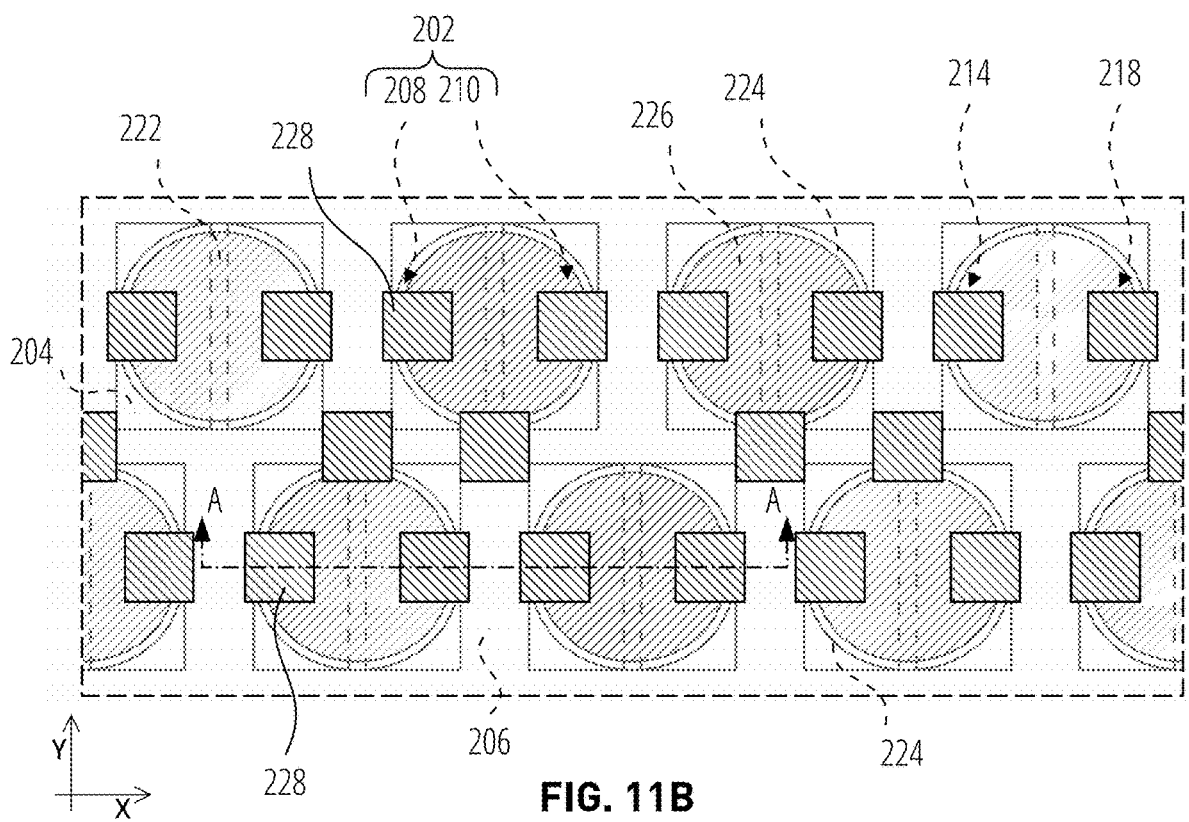

With reference to FIG. 11A and FIG. 11B, the insulative material(s) of the insulative cap 232 may be formed (e.g., deposited) on the gate electrodes 226 to substantially fill the remaining volume of the openings 702 (FIG. 10A). The structure may be planarized to make an upper surface of the insulative caps 232 substantially coplanar with an upper surface of the pillars 202.

The insulative material(s) of the insulative region 234 may be formed (e.g., deposited) over the structure, including on the insulative structures 206, the pillars 202, and the insulative caps 232. Openings may be formed and the conductive material(s) of the conductive plugs 228 formed therein to form the conductive plugs 228 in a desired arrangement, such as that described above with regard to FIG. 2A and FIG. 2C.

Figure 12A:
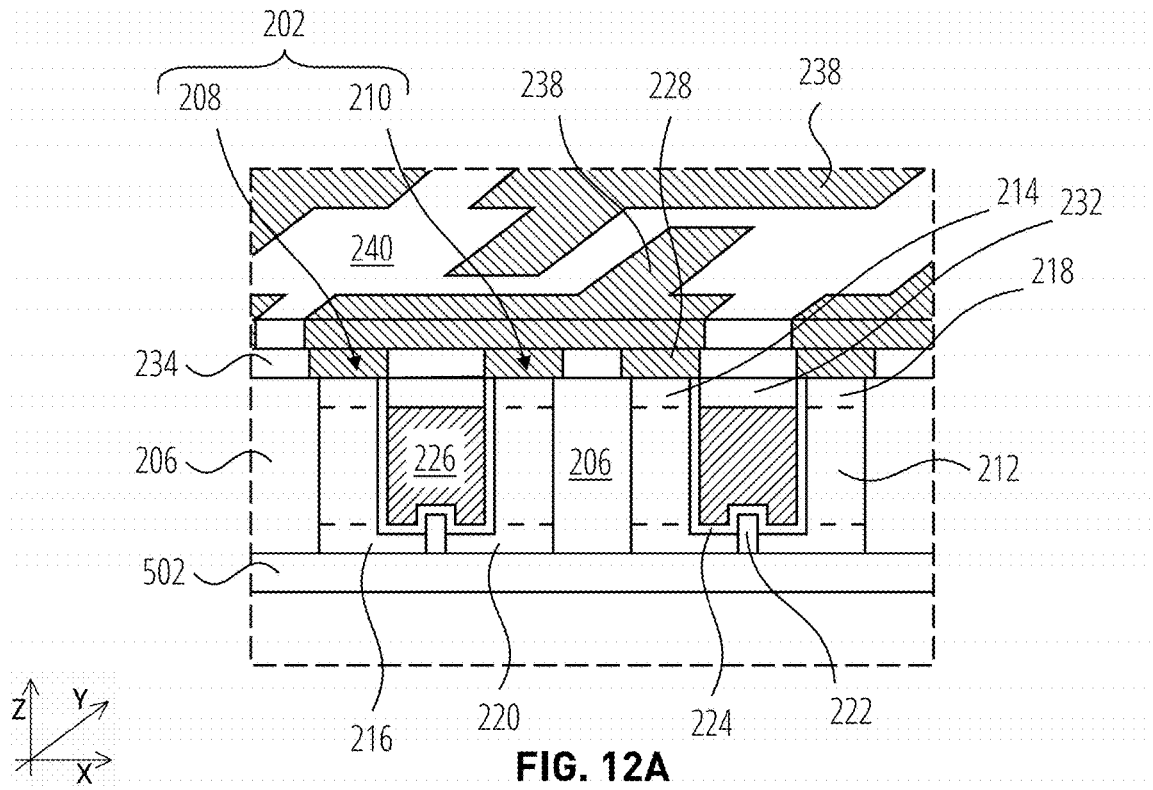
Figure 12B:
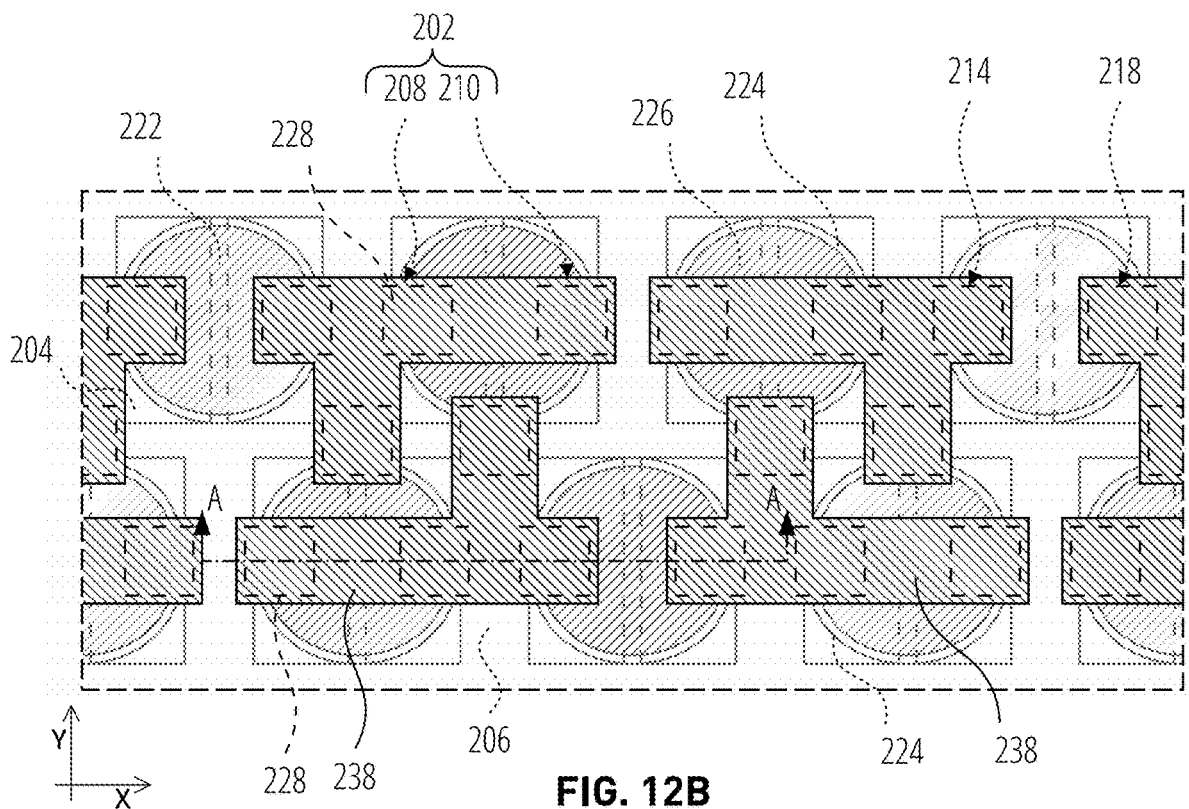

With reference to FIG. 12A and FIG. 12B, the insulative material(s) of the insulative region 240 may be formed (e.g., deposited) on the insulative region 234 and the conductive plugs 228. The insulative region 240 may be patterned (e.g., etched) to form openings of the configuration of the conductive rails 238 to be formed, and the conductive material(s) of the conductive rails 238 may be formed (e.g., deposited) in the openings to form the conductive rails 238 in the desired configurations and arrangement, such as that described above with regard to FIG. 2A and FIG. 2C.

Figure 13A:
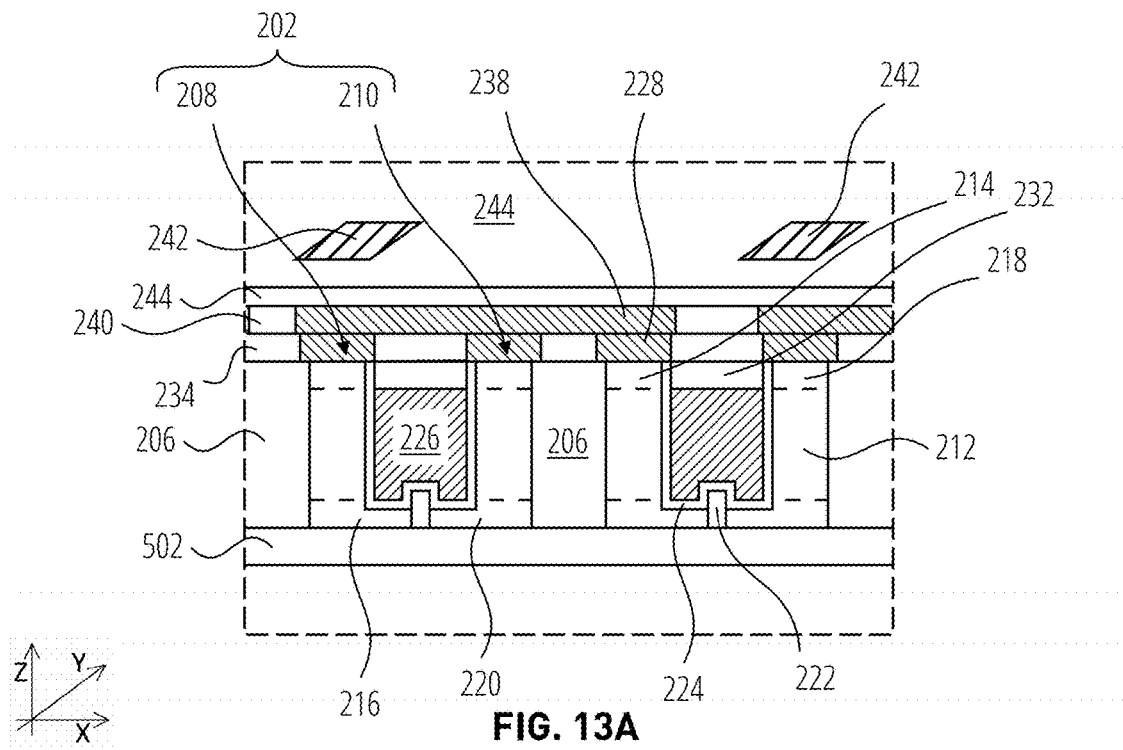
Figure 13B:
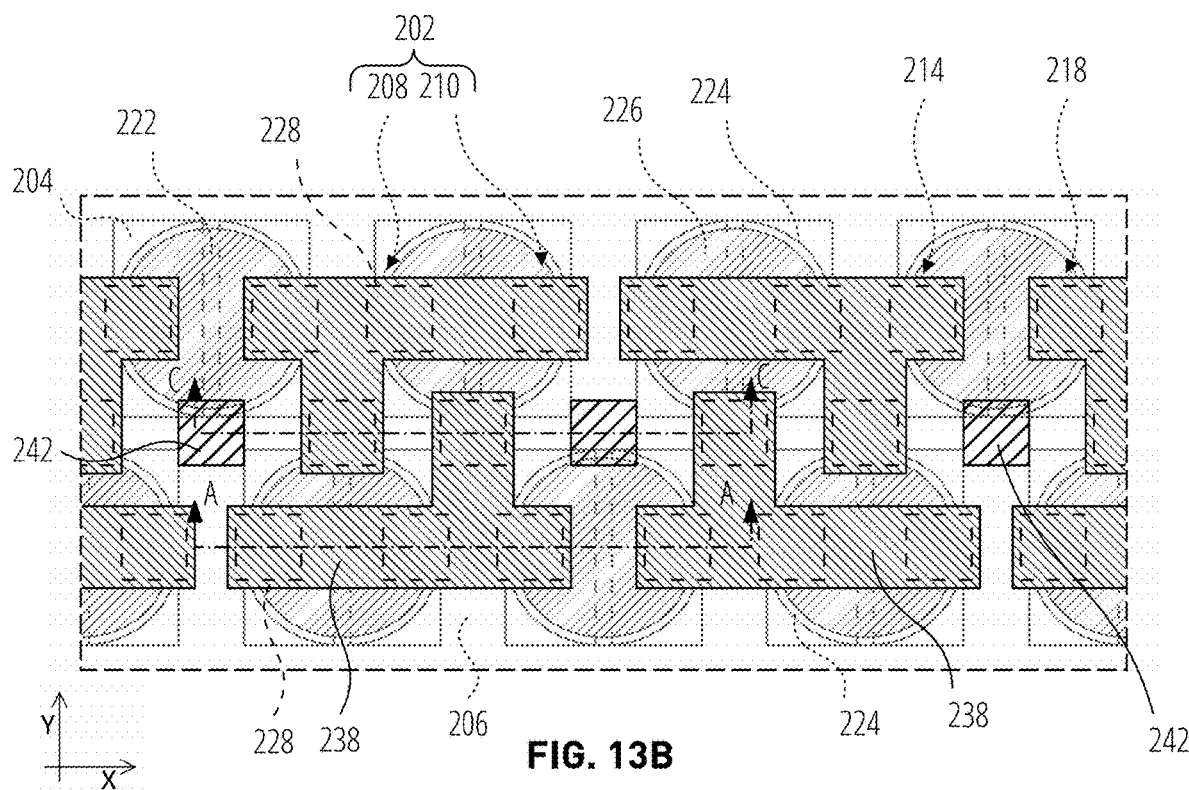
Figure 13C:
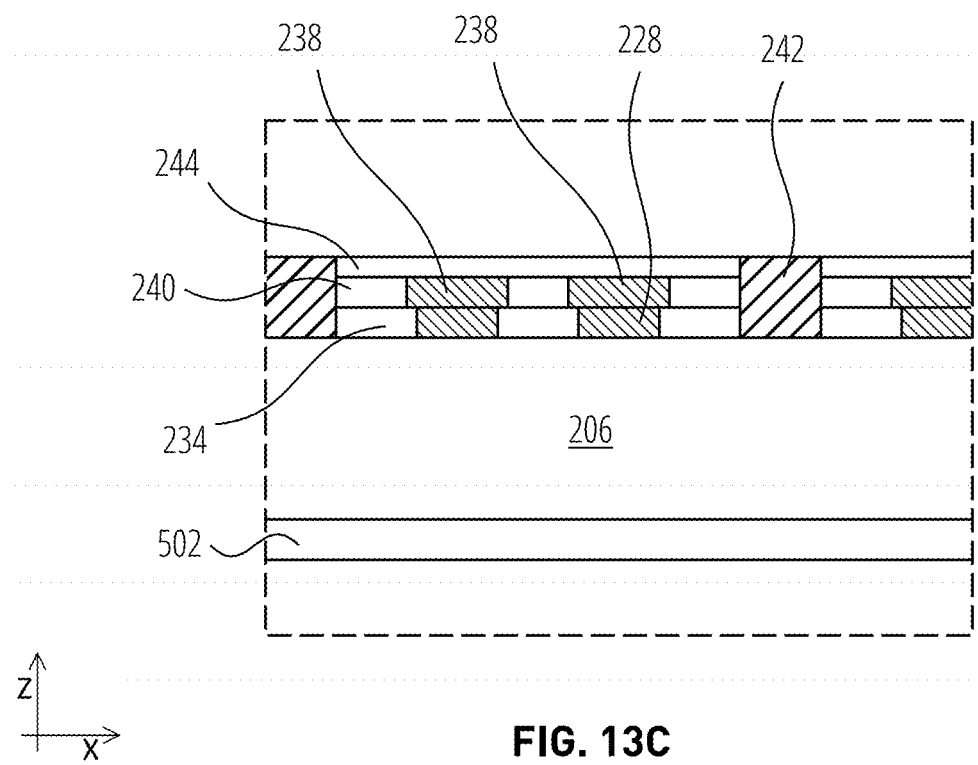

With reference to FIG. 13A, FIG. 13B, and FIG. 13C, the insulative material(s) of the insulative region 244 may be formed (e.g., deposited) on the insulative region 240 and the conductive rails 238. The insulative region 244, the insulative region 240, and the insulative region 234 may be patterned (e.g., etched) to form openings—extending through all the insulative region 234, the insulative region 240, and the insulative region 244—in the configuration of the conductive WL contacts 242 to be formed. The conductive material(s) of the conductive WL contacts 242 may be formed (e.g., deposited) in the openings to form the conductive WL contacts 242 in the desired configurations and arrangement, such as that described above with regard to FIG. 2A, FIG. 2C, and FIG. 2D. Accordingly, as illustrated in FIG. 13C, each conductive WL contact 242 may extend substantially continuously in a vertical direction through the insulative region 234, the insulative region 240, and the insulative region 244.

In some embodiments, such as that illustrated in FIG. 13A and FIG. 13B (as well as in FIG. 2A, FIG. 2C, and FIG. 2D), the conductive WL contacts 242 may be formed in a substantially linear alignment along region 268 (FIG. 2C). The conductive WL contacts 242 may be substantially a same width and length as other conductive contact structures (e.g., the conductive plugs 228).

Figure 14A:
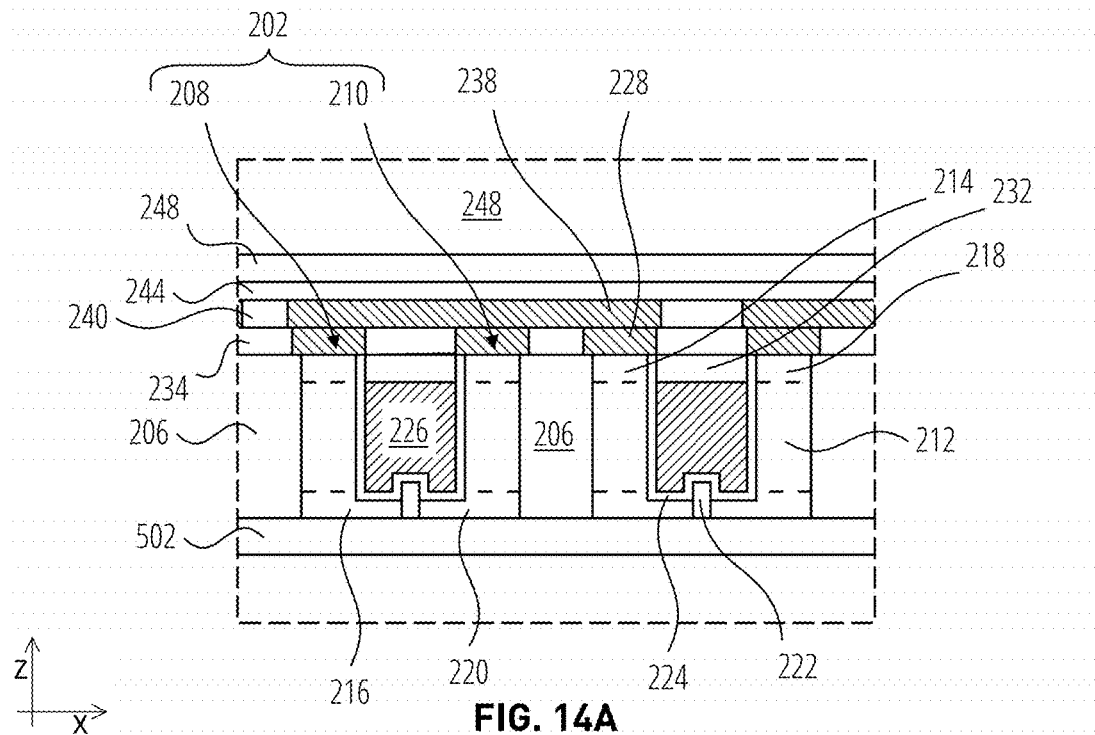
Figure 14B:
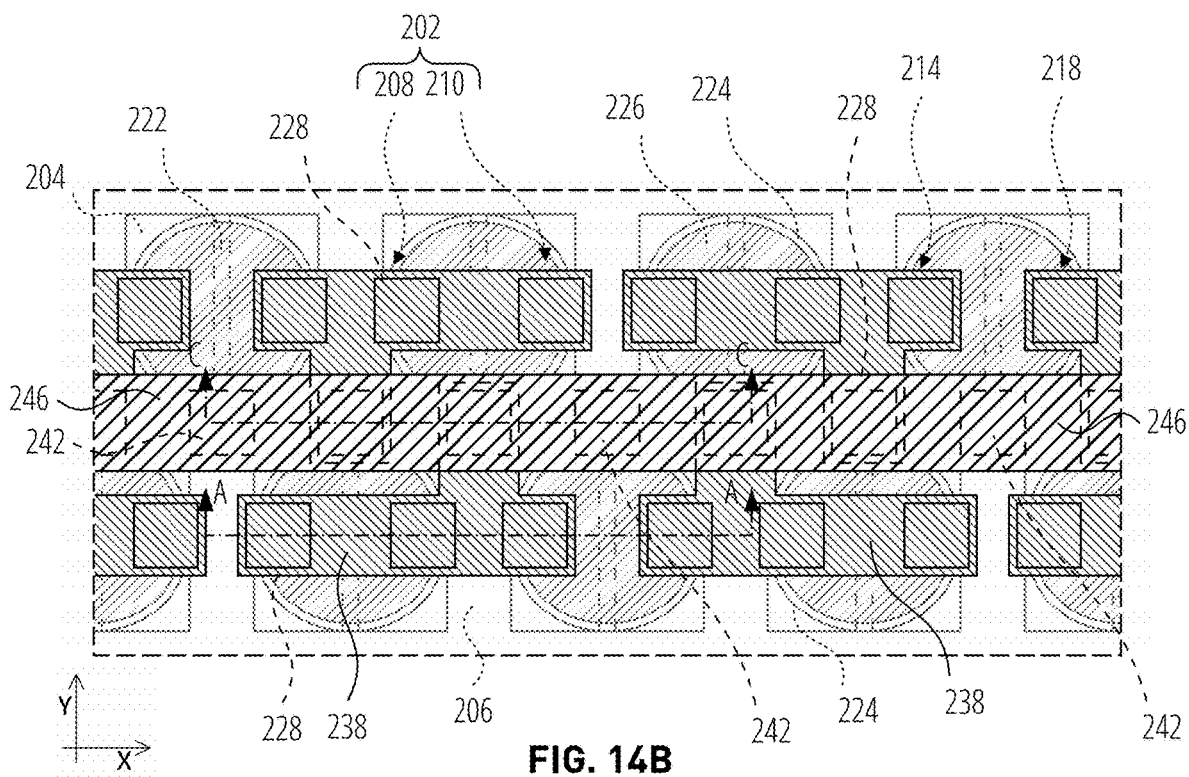
Figure 14C:
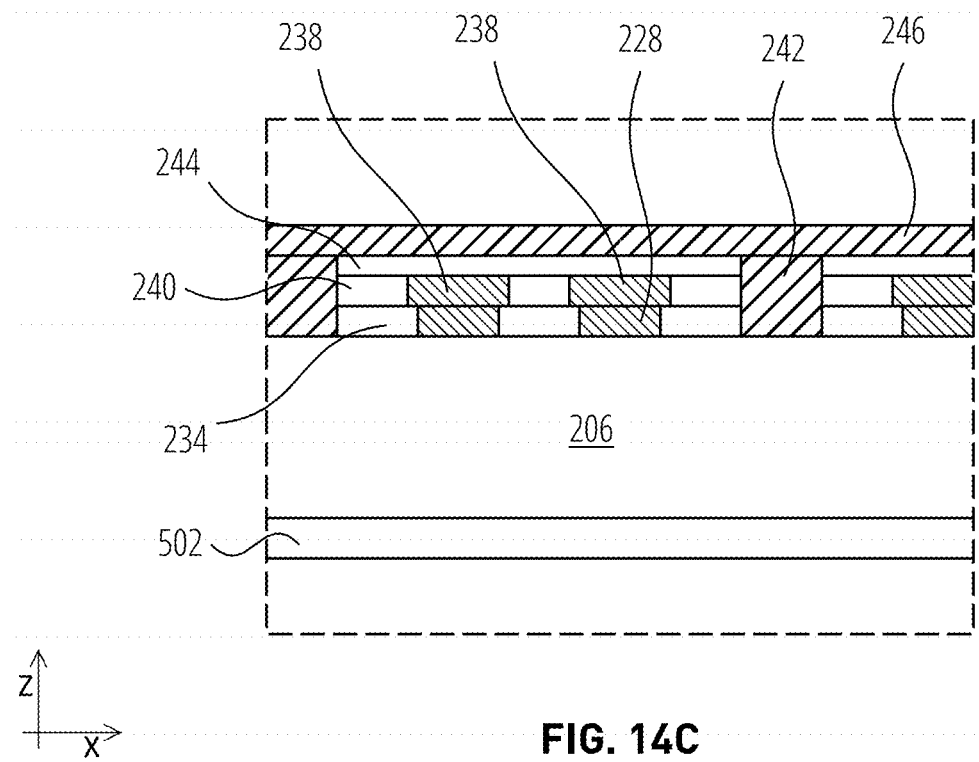

With reference to FIG. 14A, FIG. 14B, and FIG. 14C, the conductive material(s) of the elongate WL structures 246 may be formed (e.g., deposited in another selectively patterned insulative region, or deposited and patterned) above the insulative region 244 and the conductive WL contacts 242 in the desired configurations and arrangement, such as that described above with regard to FIG. 2A and FIG. 2D. In some embodiments, such as that illustrated in FIG. 14B (and FIG. 2D), the elongate WL structures 246 may be formed in a substantially linear arrangement in the regions 268 (FIG. 2C), and the elongate WL structures 246 may define a substantially consistent longitudinal dimension (e.g., length) along the width of each elongate WL structure 246.

Figure 15A:
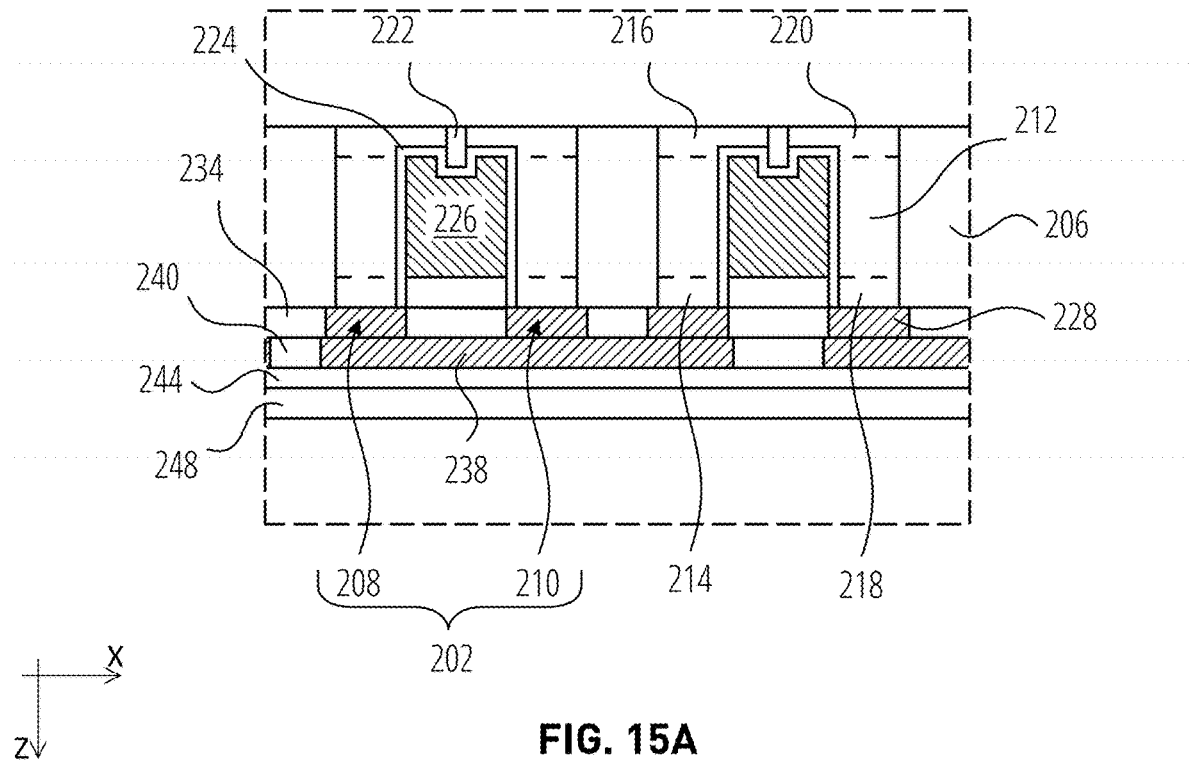
Figure 15B:
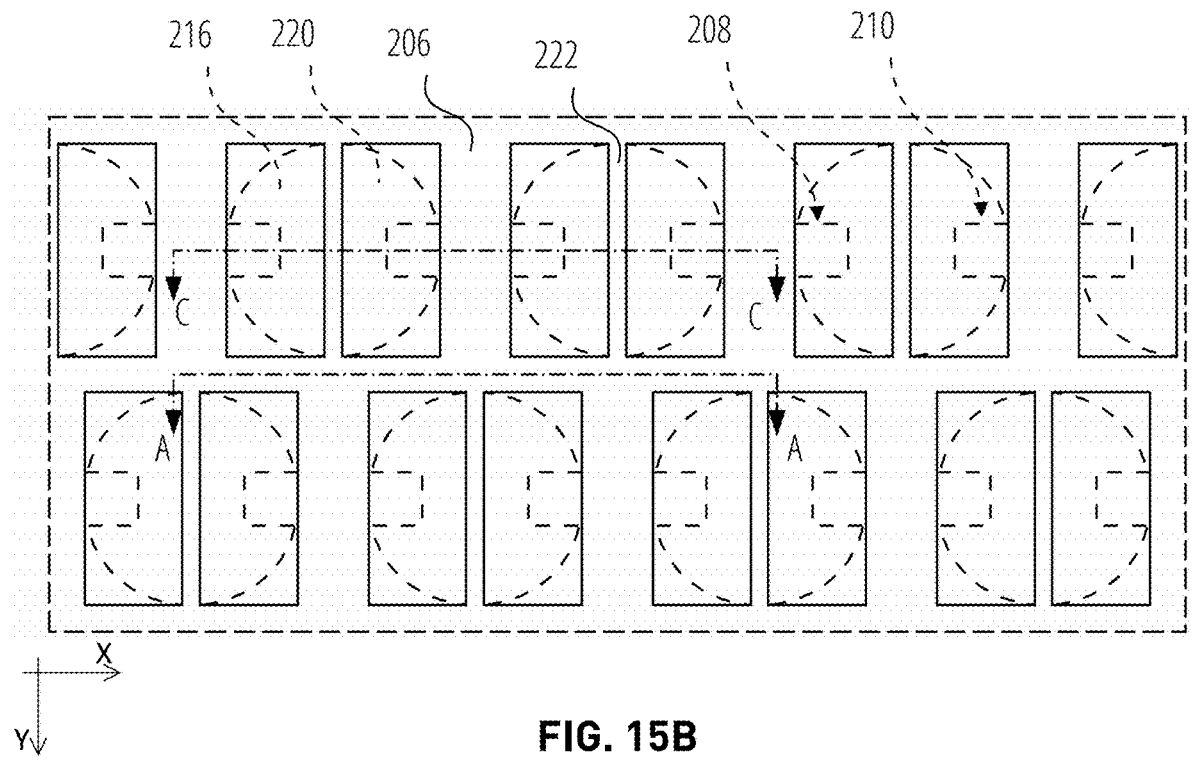
Figure 15C:
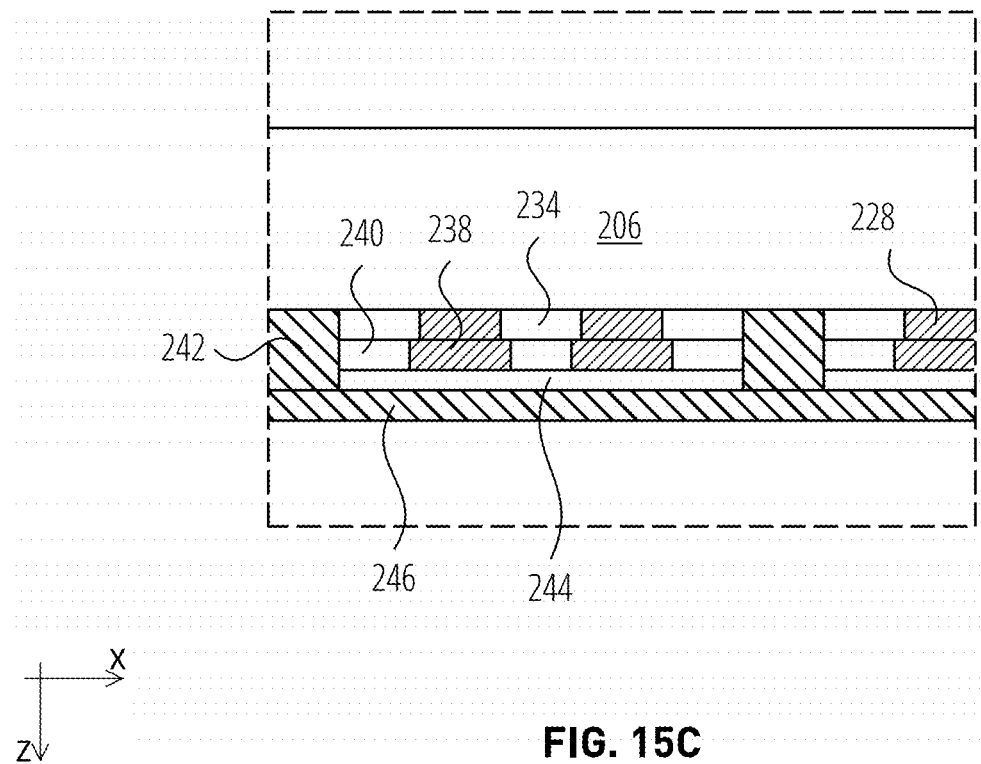

With reference to FIG. 15A, FIG. 15B, and FIG. 15C, the structure may be inverted a second time, and joined (e.g., bonded) to another support structure (e.g., another of the support structures 302 (FIG. 3A)). Once inverted, the additional support structure 502 (FIG. 14A and FIG. 14C) may be removed (e.g., by grinding) to expose, along a then-upper surface of the structure, the insulative structures 206, the first lower doped regions 216, the second lower doped regions 220, and the insulative isolation structures 222.

Figure 16A:
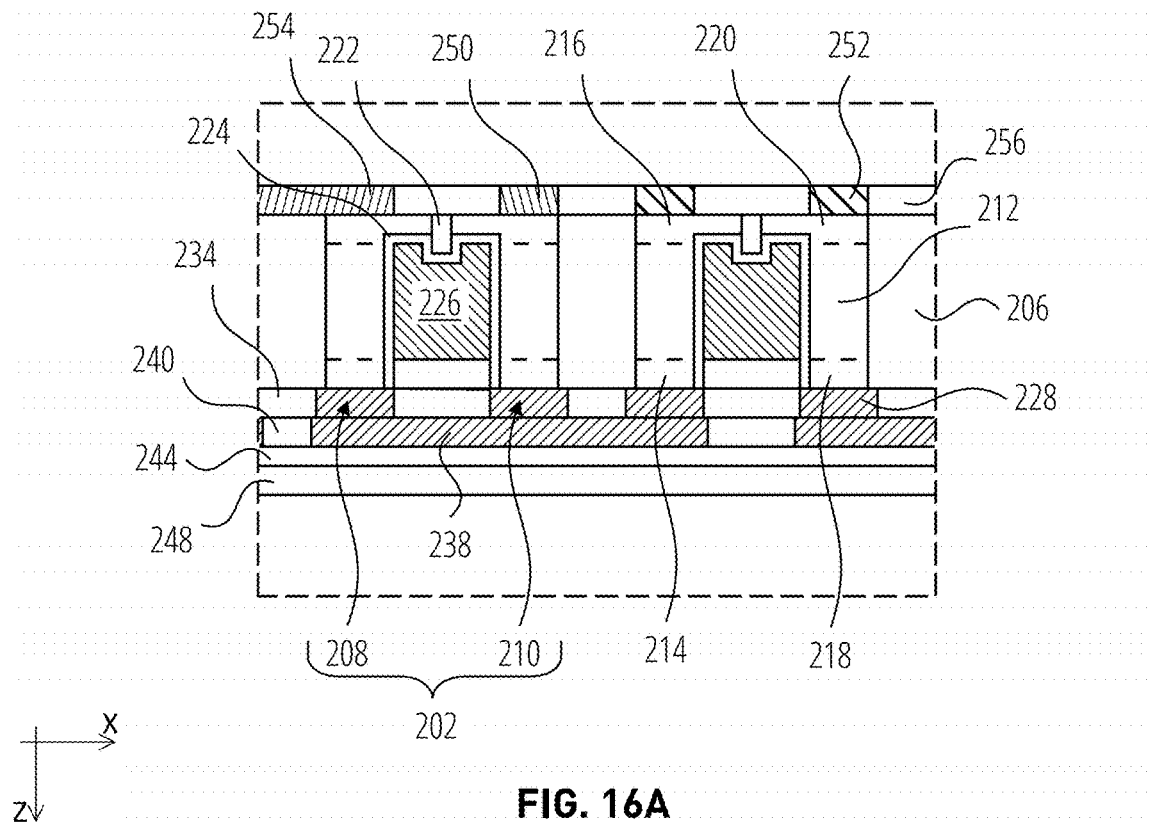
Figure 16B:
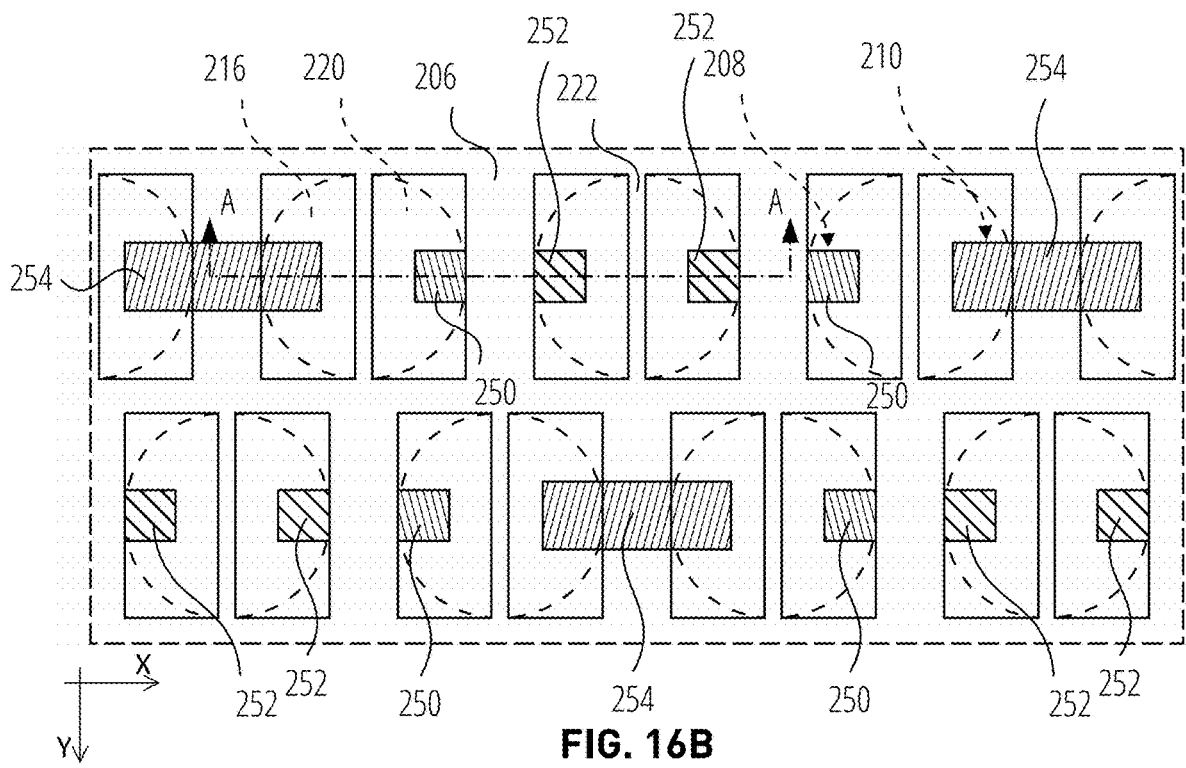

With reference to FIG. 16A and FIG. 16B, the insulative material(s) of the insulative structure 256 may be formed (e.g., deposited) on the exposed surface of the structure. The insulative structure 256 may be patterned to form openings positioned and dimensioned to correspond to the GND contacts 254, the conductive VDD contacts 250, and the conductive BL contacts 252, as described above with regard to FIG. 2A and FIG. 2E. The openings for the GND contacts 254, the conductive VDD contacts 250, and the conductive BL contacts 252 may be formed substantially simultaneously or in one or more stages. The conductive material(s) of the GND contacts 254, the conductive VDD contacts 250, and the conductive BL contacts 252 may be formed in the openings to form the structure of FIG. 16A and FIG. 16B.

Figure 17A:
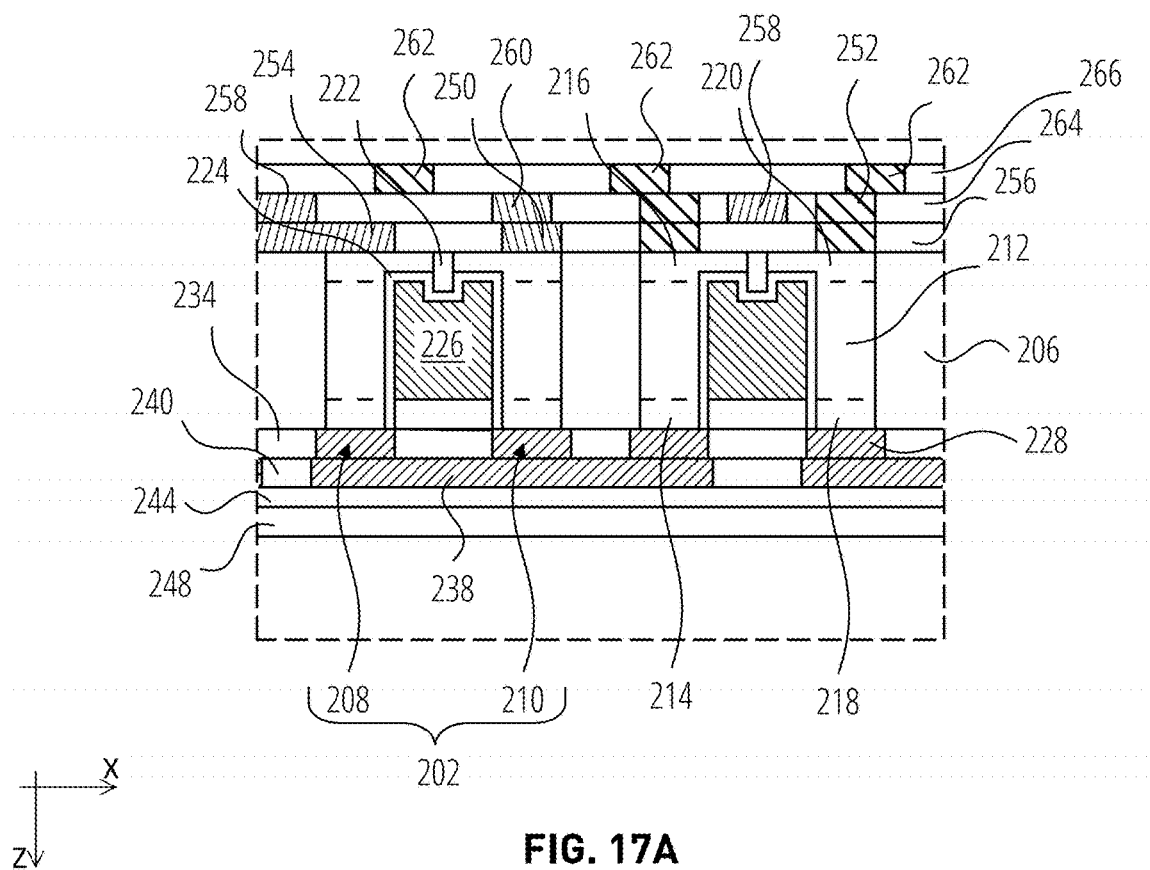
Figure 17B:
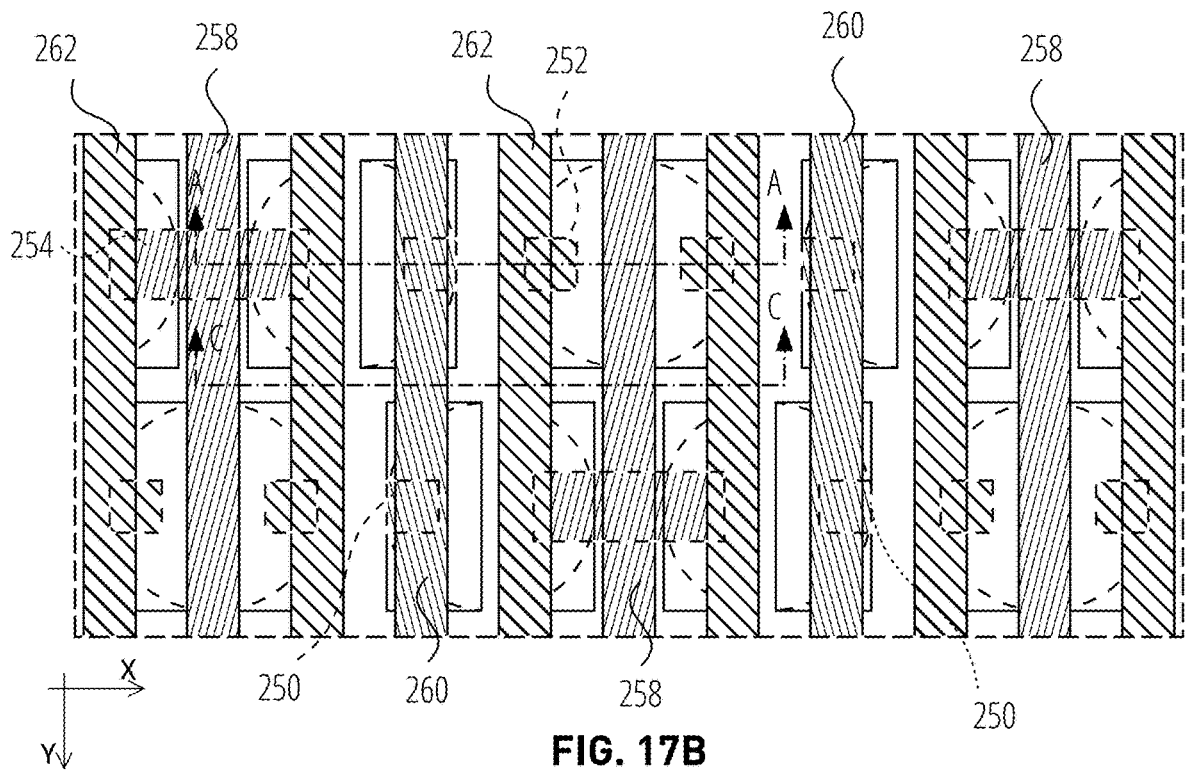
Figure 17C:
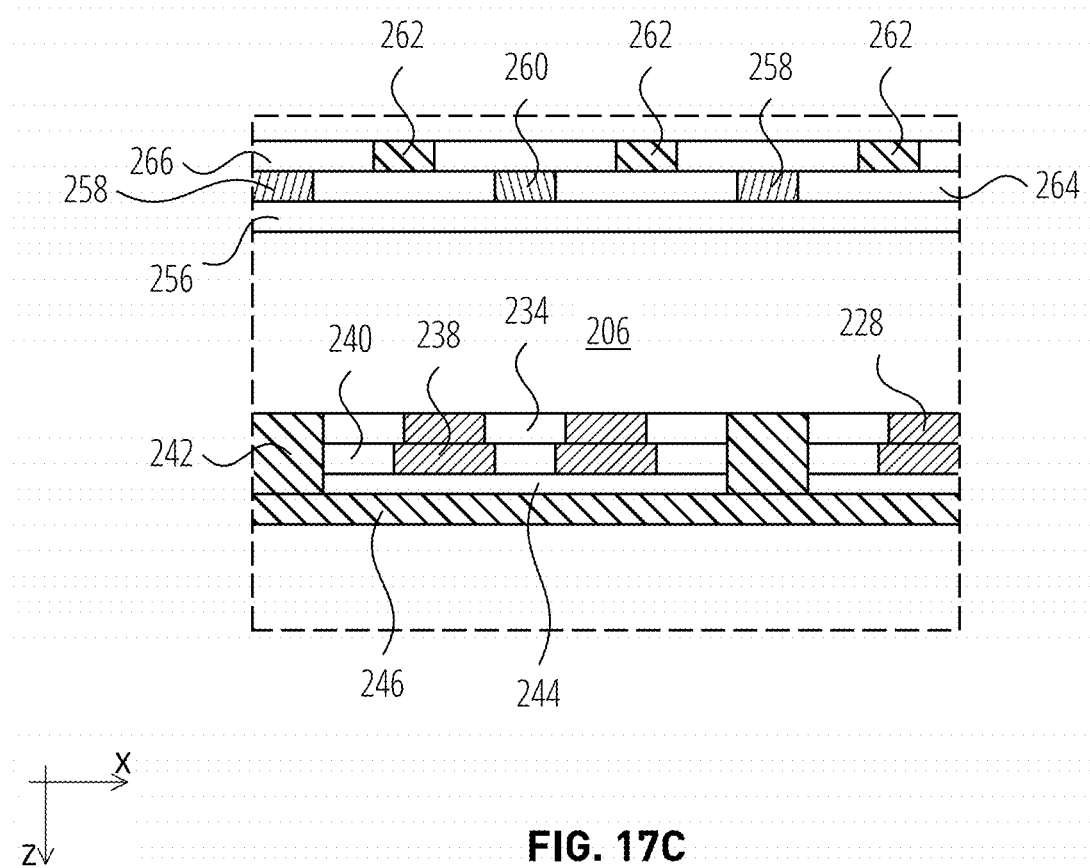

With reference to FIG. 17A, FIG. 17B, and FIG. 17C, the insulative material(s) of the insulative structure 264 may be formed on the insulative structure 256 and the GND contacts 254, the conductive VDD contacts 250, and the conductive BL contacts 252. The insulative structure 256 may be selectively patterned and conductive material(s) formed (e.g., deposited) to form the elongate GND structures 258, the elongate VDD structures 260, and another region of the conductive BL contacts 252 in elevations above the insulative structure 256 and according to the desired arrangement and configurations, such as described above with regard to FIG. 2A, and FIG. 2F. The insulative material(s) of the insulative structure 266 may be formed on the insulative structure 264, the elongate GND structures 258, the elongate VDD structures 260, and the conductive BL contacts 252. The insulative structure 266 may be patterned and conductive material(s) deposited to form the elongate BL structures 262 in the desired arrangement and configurations, such as described above with regard to FIG. 2G.

The structure may then be inverted, and any still-remaining supportive structure above the elongate WL structures 246 removed (e.g., ground) to complete the fabrication of the microelectronic device 200 of FIG. 2A through FIG. 2H.

Accordingly, disclosed is a method of forming a microelectronic device comprising at least one memory cell comprising six transistors. The method comprises, for each of the at least one memory cells, forming four openings extending into a semiconductor material to define, for each of the four openings, a pillar pair. The pillar pair comprises a first pillar and a second pillar. The first pillar comprises a first vertical channel region between a first lower doped region and a first upper doped region. The second pillar comprises a second vertical channel region between a second lower doped region and a second upper doped region. Conductive material is formed in the four openings to form, for each of the pillar pairs, a gate electrode extending between and partially horizontally around the first pillar and the second pillar.

With reference to FIG. 18A through FIG. 18I, illustrated is a microelectronic device 1800 with the same features as the microelectronic device 200, and which may be formed in substantially the same way as the microelectronic device 200 (e.g., by the method illustrated in FIG. 3A to FIG. 17C), but with differently arranged conductive WL contacts 242, longer (e.g., greater longitudinal dimension) and differently configured elongate WL structures 1802 (e.g., compared to the elongate WL structures 246 of FIG. 2D), and wider (e.g., greater lateral dimension) elongate BL structures 1804 (e.g., compared to the elongate BL structures 262 of FIG. 2G).

Figure 18A:
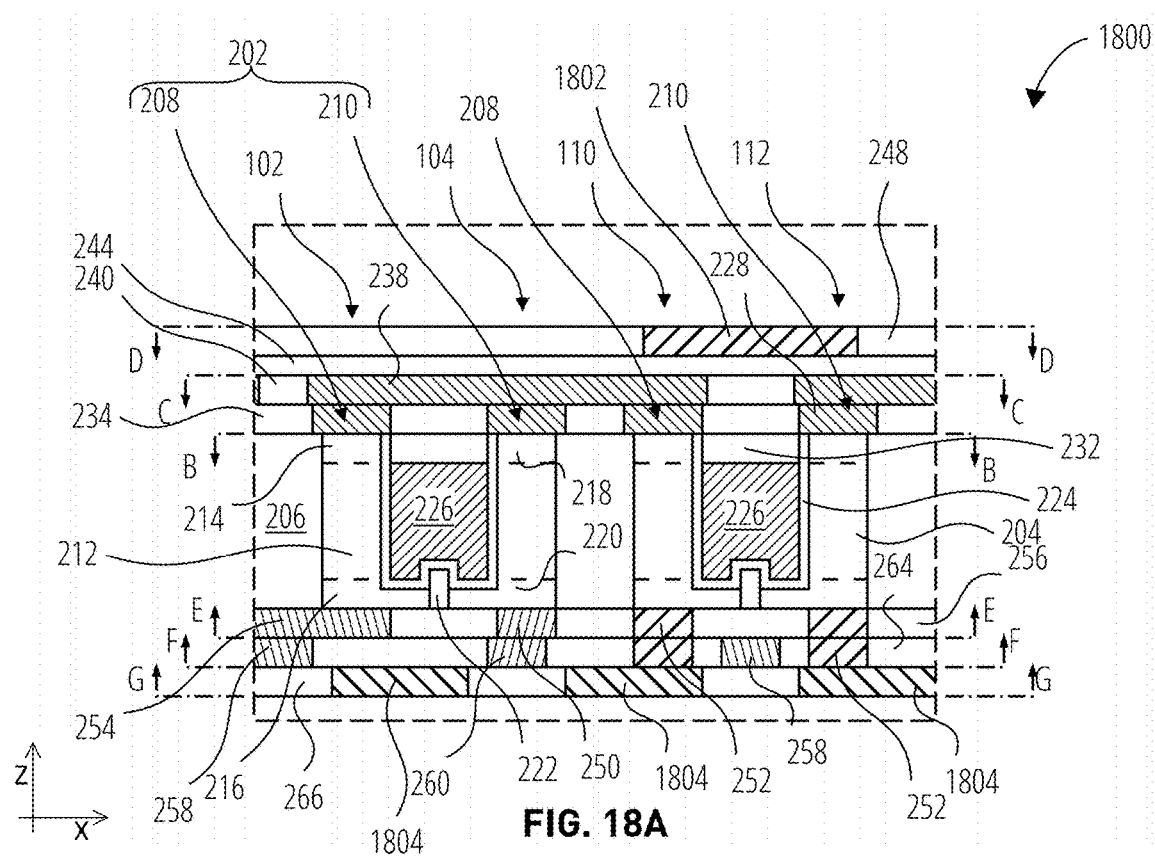
Figure 18B:
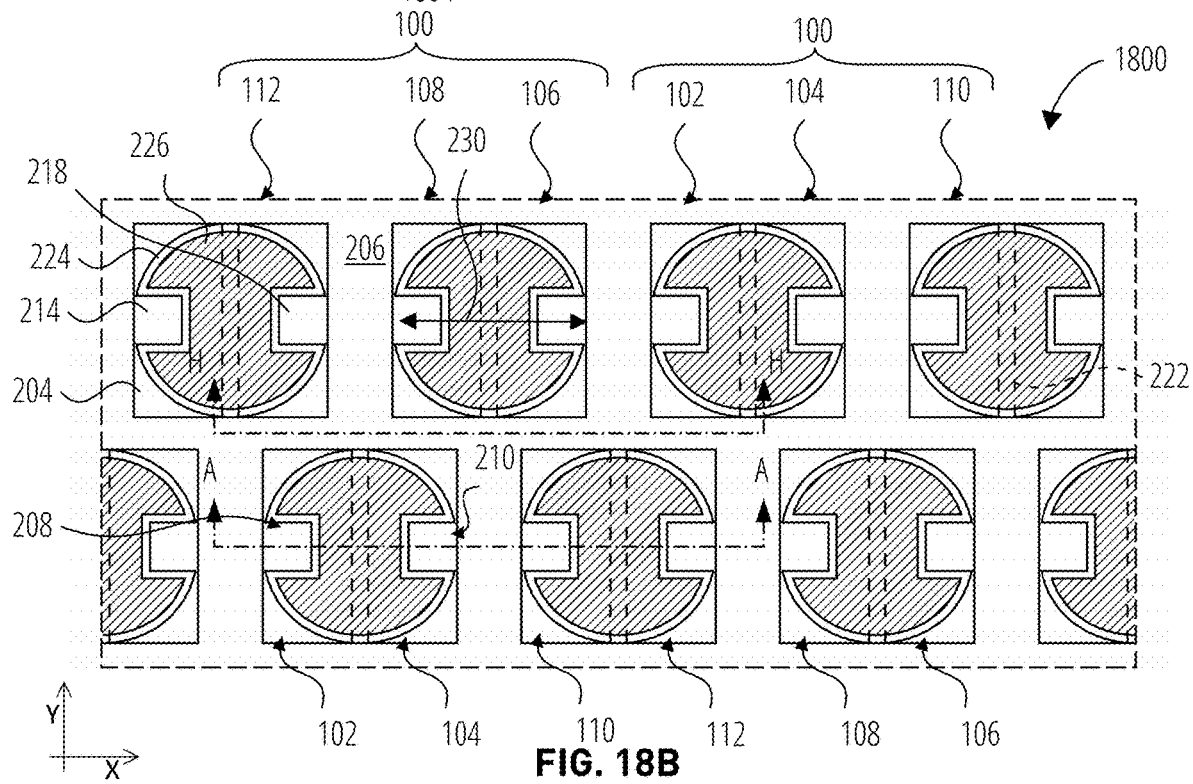
Figure 18C:
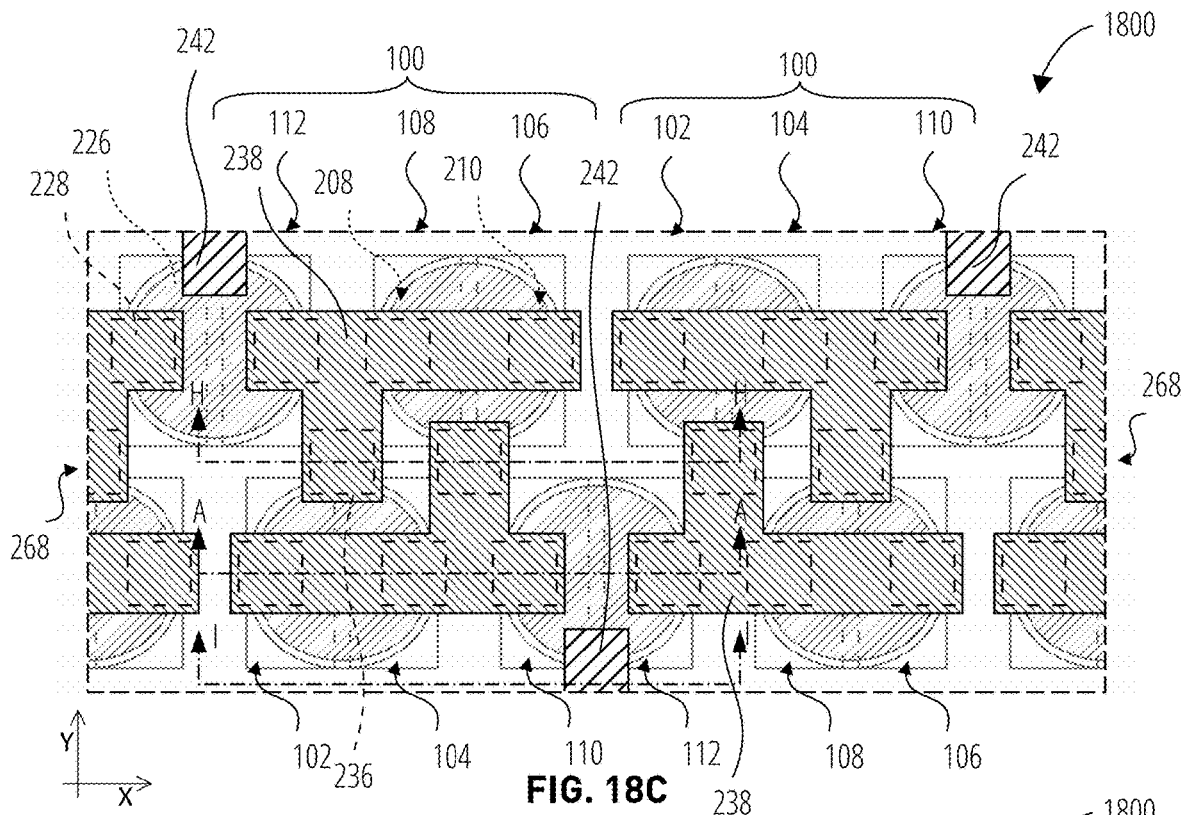

With particular reference to FIG. 18C, the conductive WL contacts 242 may be positioned and arranged not in a linear alignment along region 268 (e.g., as in FIG. 2C), but in a staggered arrangement, with at least some (e.g., each and all) of the conductive WL contacts 242 disposed vertically above and in physical contact with longitudinally distal area of the associated gate electrode 226, relative to the intermediate region 268 (e.g., the region 268 being longitudinally between the four gate electrodes 226 that are part of one of the 6T SRAM cells 100). As illustrated in FIG. 18C, each of the conductive WL contacts 242 may be longitudinally outward (e.g., longitudinally rearward or frontward) from the conductive plugs 228 and the conductive rails 238, relative to the region 268 being longitudinally inward from the conductive plugs 228 and conductive rails 238 of a given 6T SRAM cell 100.

As used herein, the term "staggered" means and includes an arrangement of features in which some features of a series are longitudinally more rearward or frontward of other features of the series. In some embodiments, the "staggered" arrangement may include more rearward features not having any portion that is in a same X-Z plane as any of the more frontward features.

Figure 18D:
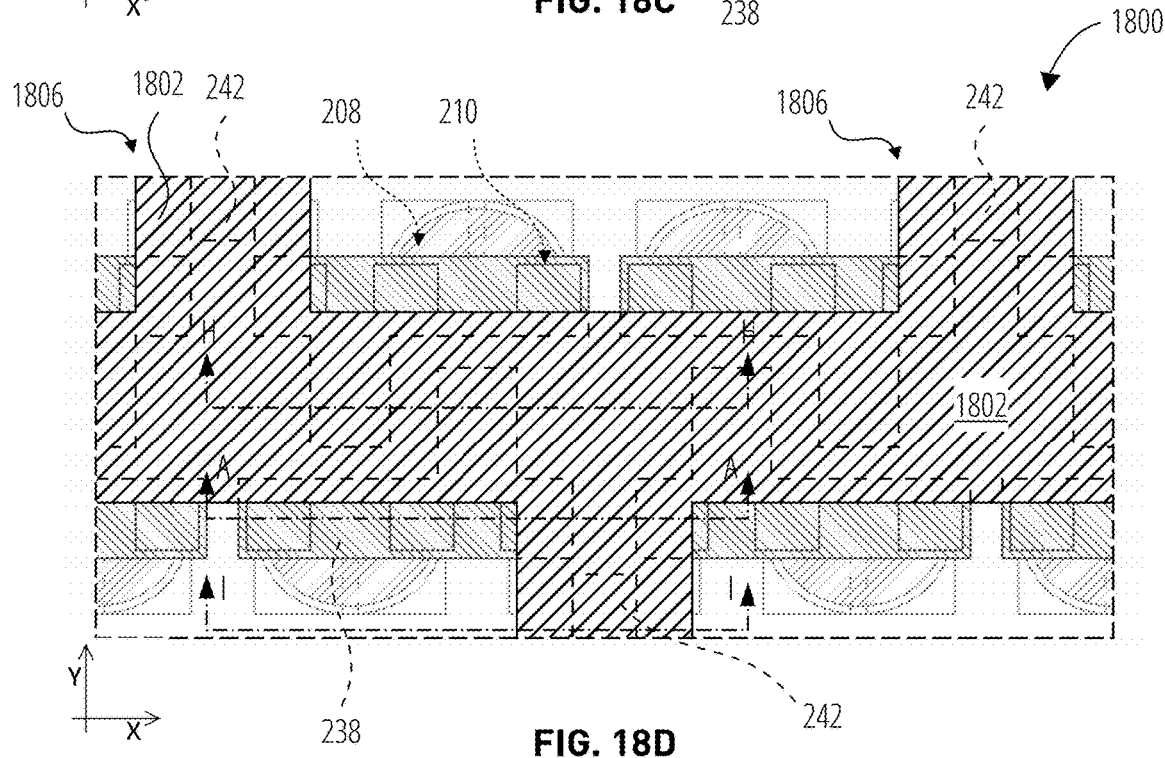
Figure 18E:
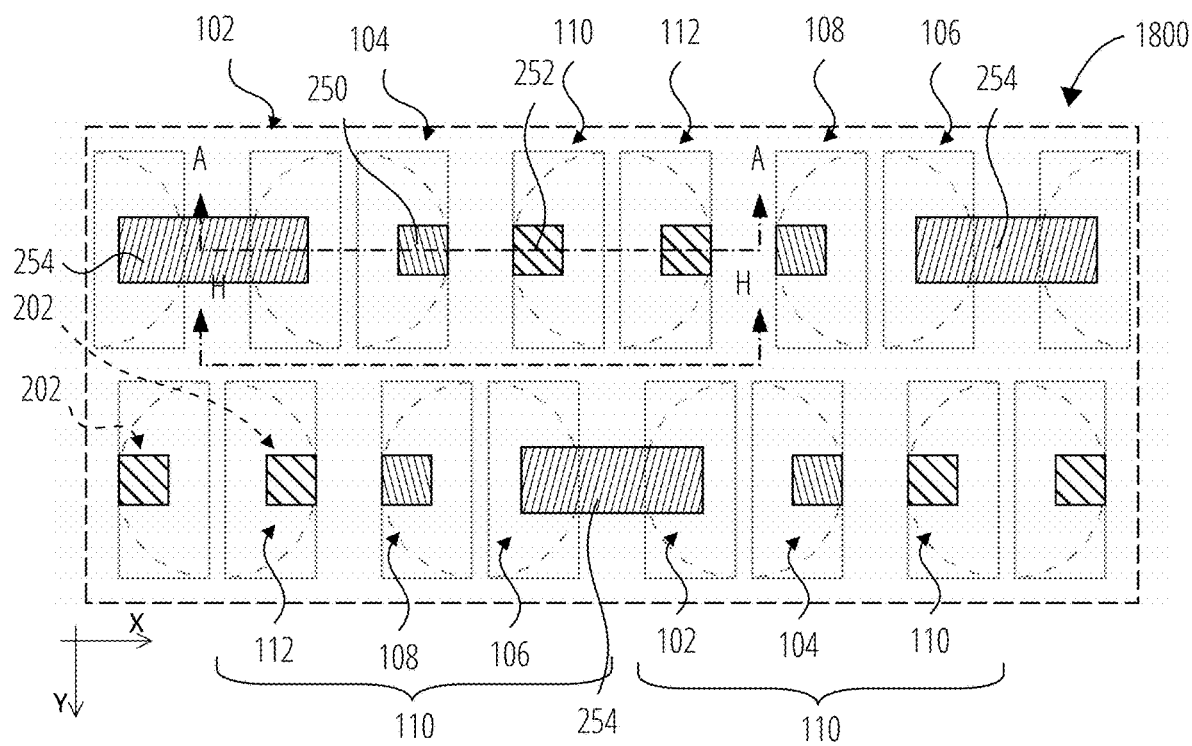
Figure 18F:
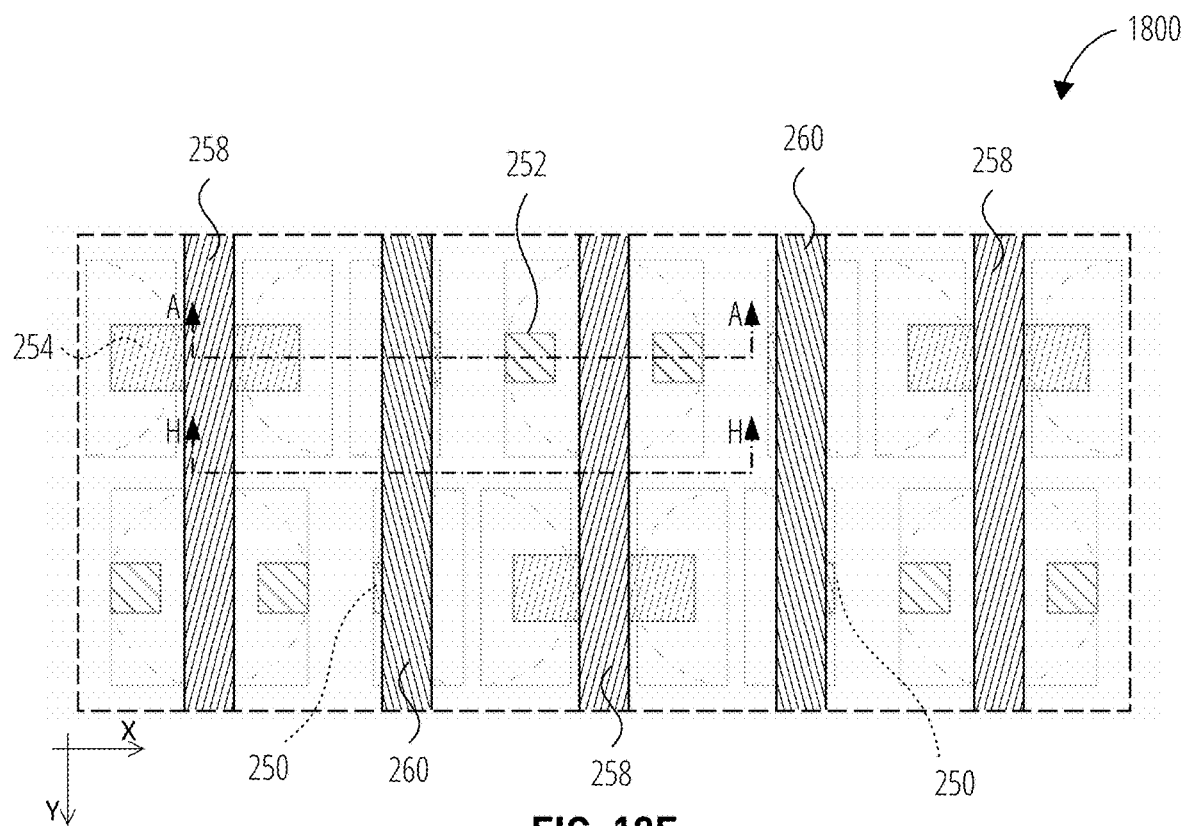

With reference to FIG. 18D, the elongate WL structures 1802 may be formed to be relatively longer (e.g., with a relatively greater longitudinal dimension) compared to the elongate WL structures 246 of FIG. 2D. The elongate WL structures 1802 may include longitudinally protruding portions 1806 that extend to overlap and physically contact the conductive WL contacts 242. Therefore, the pattern of the elongate WL structures 1802 may correspond to the staggered arrangement of the conductive WL contacts 242.

The staggered arrangement of the conductive WL contacts 242 may decrease the likelihood of electrical shorting between the conductive WL contacts 242 and other conductive features of the microelectronic device 1800, such as the conductive plugs 228 and the conductive rails 238. The staggered arrangement of the conductive WL contacts 242 may also facilitate forming the elongate WL structures 1802 to be relatively longer. The relatively greater amount of conductive material(s) in the elongate WL structures 1802 may result in the elongate WL structures 1802 exhibiting a relatively decreased electrical resistance, compared to a relatively narrower (e.g., in the longitudinal direction), substantially elongate WL structure 246 (FIG. 2D).

Figure 18G:
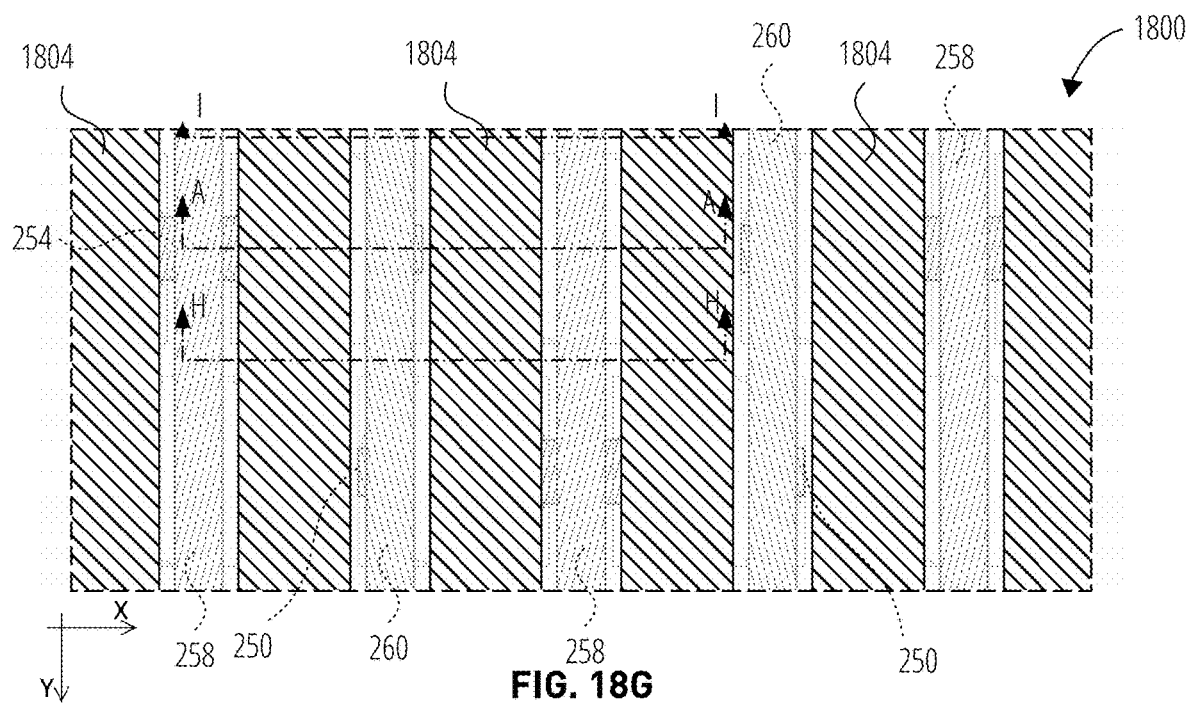
Figure 18H:
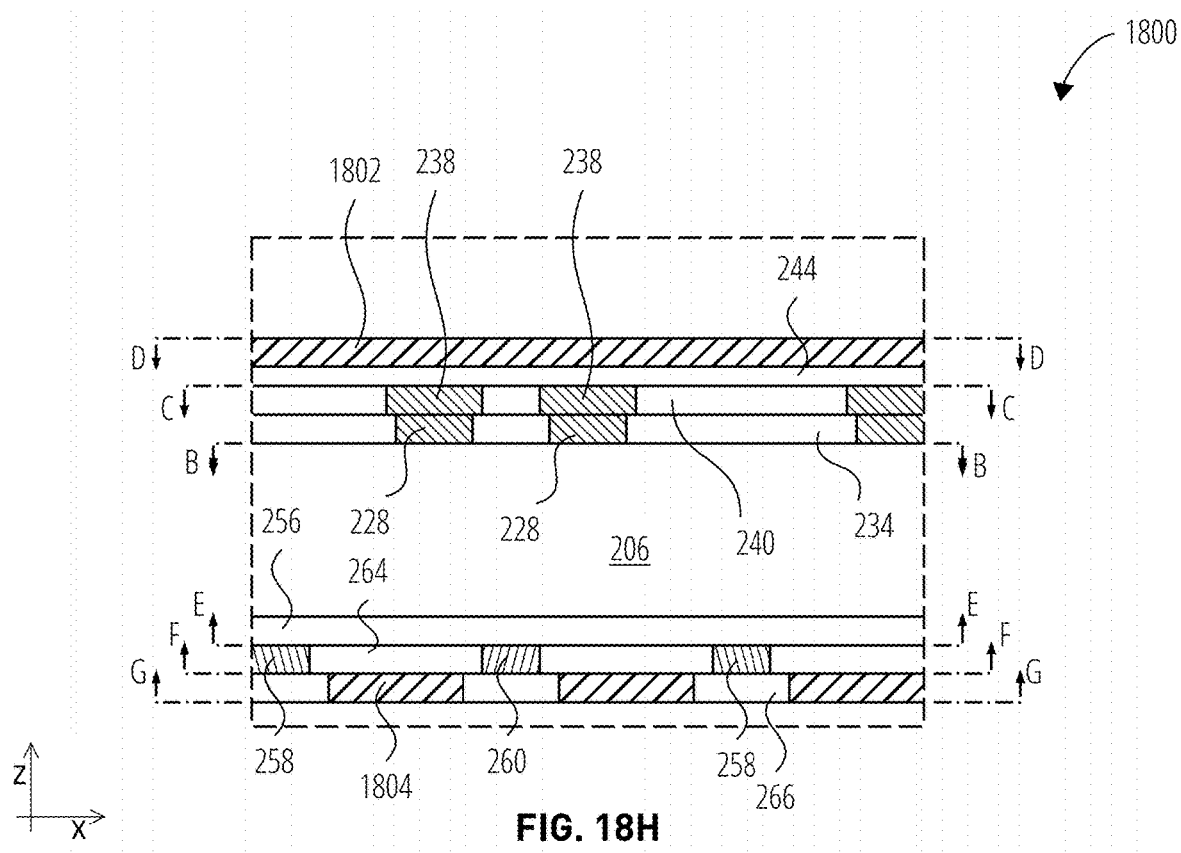
Figure 18I:
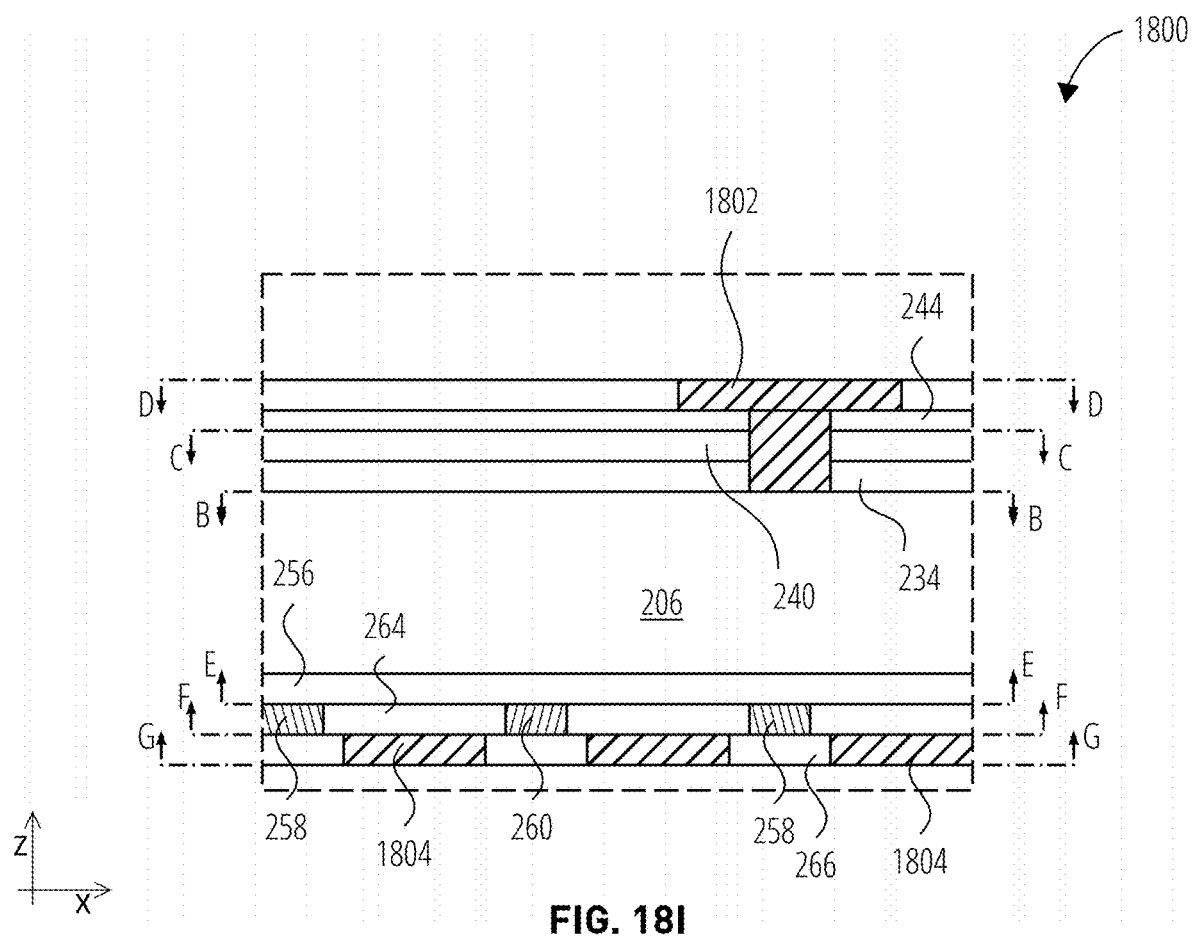

With reference to FIG. 18G, FIG. 18H, and FIG. 18I, each of the elongate BL structures 1804 may be formed to a relatively wider lateral dimension compared to the elongate BL structures 262 of the microelectronic device 200 of FIG. 2G. Like the elongate BL structures 262 (FIG. 2G), the elongate BL structures 1804 may not vertically overlap the elongate GND structures 258 and the elongate VDD structures 260, which may be disposed laterally between the elongate BL structures 1804. Forming the elongate BL structures 1804 to be relatively wider may facilitate a lower electrical resistance in the elongate BL structures 1804 and therefore improved performance of the microelectronic device 1800.

The microelectronic device 1800 of FIG. 18A through FIG. 18I may be formed in substantially the same manner as described above with regard to FIG. 3A through FIG. 17C, though with adjustment to the disposition and dimensions of the conductive WL contacts 242, the elongate WL structures 1802, and the elongate BL structures 1804.

Though with a staggered arrangement of conductive WL contacts 242 and relatively longer elongate WL structures 1802 and relatively wider elongate BL structures 1804, the microelectronic device 1800 of FIG. 18A through FIG. 18I may—like the microelectronic device 200 of FIG. 2A through FIG. 2H—comprise at least one memory cell, each comprising six transistors comprising six pillars grouped in pillar pairs and formed from a semiconductor material, with each of the pillar pairs comprising a first pillar and a second pillar. Also, like the microelectronic device 200 of FIG. 2A through FIG. 2H, the microelectronic device 1800 of FIG. 18A through FIG. 18I may comprise gate electrodes, each of the gate electrodes extending between and partially (e.g., but not wholly) horizontally surrounding the first pillar and the second pillar of a different one of the pillar pairs. Moreover, conductive structures may be electrically coupled to the six pillars, and at least one of the conductive structures may be in physical contact with more than one of the pillars of the microelectronic device.

Figure 19:
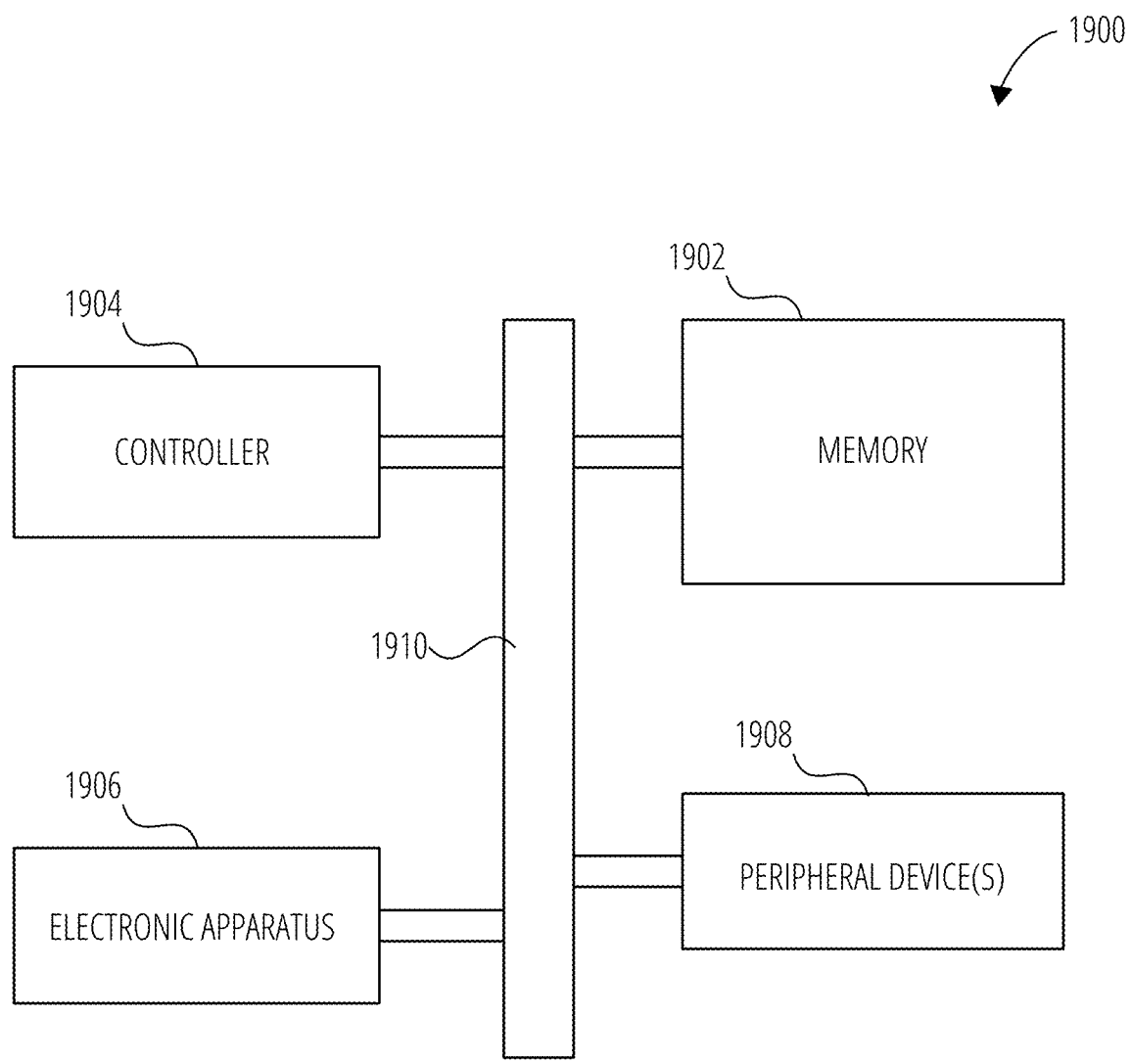
FIG. 19 is a block diagram of an electronic system including at least one microelectronic device according to embodiments of the disclosure.

FIG. 19 shows a block diagram of a system 1900, according to embodiments of the disclosure. Memory 1902 of the system 1900 may include arrays of 6T SRAM cells 100. The 6T SRAM cells 100 of the memory 1902 may be part of, e.g., the microelectronic device 200 (FIG. 2A through FIG. 2H) or the microelectronic device 1800 (FIG. 18A through FIG. 18I). Therefore, the architecture and structure of the memory 1902 may include one or more device structures according to embodiments of the disclosure and may be fabricated according to one or more of the methods described above (e.g., with reference to FIG. 3A through FIG. 17C).

The system 1900 may include a controller 1904 operatively coupled to the memory 1902. The system 1900 may also include another electronic apparatus 1906 and one or more peripheral device(s) 1908. The other electronic apparatus 1906 may, in some embodiments, include one or more of microelectronic devices (e.g., the microelectronic device 200 of FIG. 2A through FIG. 2H, the microelectronic device 1800 of FIG. 18A through FIG. 18I), according to embodiments of the disclosure and fabricated according to one or more of the methods described above. One or more of the controller 1904, the memory 1902, the other electronic apparatus 1906, and the peripheral device(s) 1908 may be in the form of one or more integrated circuits (ICs).

A bus 1910 provides electrical conductivity and operable communication between and/or among various components of the system 1900. The bus 1910 may include an address bus, a data bus, and a control bus, each independently configured. Alternatively, the bus 1910 may use conductive lines for providing one or more of address, data, or control, the use of which may be regulated by the controller 1904. The controller 1904 may be in the form of one or more processors.

The other electronic apparatus 1906 may include additional memory (e.g., with one or more microelectronic devices (e.g., the microelectronic device 200 of FIG. 2A through FIG. 2H, the microelectronic device 1800 of FIG. 18A through FIG. 18I)), according to embodiments of the disclosure and fabricated according to one or more of the methods described above. Other memory structures of the memory 1902 and/or the other electronic apparatus 1906 may be configured in an architecture other than 6T SRAM, such as other static random access memory (SRAM) architecture, 3D NAND, dynamic random access memory (DRAM), synchronous dynamic random access memory (SDRAM), synchronous graphics random access memory (SGRAM), double data rate dynamic ram (DDR), double data rate SDRAM, and/or magnetic-based memory (e.g., spin-transfer torque magnetic RAM (STT-MRAM)).

The peripheral device(s) 1908 may include displays, imaging devices, printing devices, wireless devices, additional storage memory, and/or control devices that may operate in conjunction with the controller 1904.

The system 1900 may include, e.g., fiber optics systems or devices, electro-optic systems or devices, optical systems or devices, imaging systems or devices, and information handling systems or devices (e.g., wireless systems or devices, telecommunication systems or devices, and computers).

Accordingly, disclosed is an electronic system comprising a microelectronic device, at least one processor in operable communication with the microelectronic device, and at least one peripheral device in operable communication with the at least one processor. The microelectronic device comprises an array of memory cells. Each of the memory cells of the array comprises six transistors provided by six pillars formed of a semiconductor material and arranged in pillar pairs. Gate electrodes individually extend between the pillars of a different one of the pillar pairs. Each of the gate electrodes has a greatest horizontal dimension not greater than a distance between outermost surfaces of the one of the pillar pairs. At least one conductive contact structure is in physical contact with at least one of the six pillars of one of the memory cells and with at least one of the six pillars of a neighboring one of the memory cells.

While the disclosed structures, apparatus (e.g., devices), systems, and methods are susceptible to various modifications and alternative forms in implementation thereof, specific embodiments have been shown by way of example in the drawings and have been described in detail herein. The disclosure is not intended to be limited to the particular forms disclosed. The disclosure encompasses all modifications, combinations, equivalents, variations, and alternatives falling within the scope of the disclosure as defined by the following appended claims and their legal equivalents.

What is claimed is:

1. A microelectronic device, comprising:
    at least one memory cell, each comprising:
        six transistors comprising six pillars grouped in pillar pairs and formed from a semiconductor material, each of the pillar pairs comprising a first pillar and a second pillar;
        gate electrodes, each of the gate electrodes extending between and partially horizontally surrounding the first pillar and the second pillar of a different one of the pillar pairs; and
        conductive structures electrically coupled to the six pillars, at least one of the conductive structures being in physical contact with more than one of the pillars of the microelectronic device.

2. The microelectronic device of claim 1, wherein each of the pillars of the six pillars has a substantially rectangular horizontal cross-sectional area.

3. The microelectronic device of claim 1, wherein each of the gate electrodes has at least one curved sidewall extending from the first pillar to the second pillar of one of the pillar pairs.

4. The microelectronic device of claim 1, further comprising conductive wordline contacts each overlapping a portion of a different one of the gate electrodes.

5. The microelectronic device of claim 4, wherein the conductive wordline contacts are arranged in a substantially linear alignment.

6. The microelectronic device of claim 5, further comprising elongate wordline structures above and in physical contact with the conductive wordline contacts in the substantially linear alignment.

7. The microelectronic device of claim 4, wherein the conductive wordline contacts are arranged in a staggered pattern.

8. The microelectronic device of claim 7, further comprising elongate wordline structures above and in physical contact with the conductive wordline contacts of the staggered pattern.

9. The microelectronic device of claim 1, further comprising at least one insulative structure horizontally surrounding and isolating each of the pillar pairs from one another.

10. The microelectronic device of claim 9, further comprising an elongate wordline structure in an elevation above the at least one insulative structure.

11. The microelectronic device of claim 10, wherein the elongate wordline structure has a substantially consistent longitudinal dimension across a width of the at least one memory cell.

12. The microelectronic device of claim 10, wherein the elongate wordline structure comprises longitudinally protruding portions.

13. The microelectronic device of claim 10, further comprising, in an elevation below the at least one insulative structure, at least one contact structure in physical contact with the first pillar of one of the pillar pairs and with the second pillar of another of the pillar pairs.

14. The microelectronic device of claim 13, further comprising, in an elevation below the at least one contact structure, elongate bitline structures.

15. The microelectronic device of claim 1, further comprising, for each of the gate electrodes, an insulative liner between the gate electrode and each of the first pillar and the second pillar.

16. The microelectronic device of claim 1, wherein:
the first pillar comprises a vertical channel region between a first upper doped region and a first lower doped region; and
the second pillar comprises another vertical channel region between a second upper doped region and a second lower doped region.

17. The microelectronic device of claim 16, further comprising, for each of the pillar pairs, a shallow trench isolation region spacing the first lower doped region from the second lower doped region.

18. A method for forming a microelectronic device comprising at least one memory cell comprising six transistors, the method comprising, for each of the at least one memory cells:
forming four openings extending into a semiconductor material to define, for each of the four openings, a pillar pair comprising:
a first pillar comprising a first vertical channel region between a first lower doped region and a first upper doped region, and
a second pillar comprising a second vertical channel region between a second lower doped region and a second upper doped region; and
forming conductive material in the four openings to form, for each of the pillar pairs, a gate electrode extending between and partially horizontally around the first pillar and the second pillar.

19. The method of claim 18, further comprising forming at least one conductive contact structure above and in physical contact with:
the first upper doped region of the first pillar of one the pillar pairs associated with one of the at least one memory cell, and
the second upper doped region of the second pillar of one other of the pillar pairs associated with one other of the at least one memory cell.

20. An electronic system, comprising:
a microelectronic device comprising:
an array of memory cells, each of the memory cells of the array comprising:
six transistors provided by six pillars formed of a semiconductor material and arranged in pillar pairs;
gate electrodes individually extending between the pillars of a different one of the pillar pairs, each of the gate electrodes having a greatest horizontal dimension not greater than a distance between outermost surfaces of the one of the pillar pairs; and
at least one conductive contact structure in physical contact with at least one of the six pillars of one of the memory cells and with at least one of the six pillars of a neighboring one of the memory cells;
at least one processor in operable communication with the microelectronic device; and
at least one peripheral device in operable communication with the at least one processor.

* * * * *